(12) United States Patent
Kim et al.

(10) Patent No.: US 9,673,303 B2
(45) Date of Patent: Jun. 6, 2017

(54) SEMICONDUCTOR DEVICE AND METHOD OF FABRICATING THE SAME

(71) Applicant: Samsung Electronics Co., Ltd., Suwon-si (KR)

(72) Inventors: Cheol Kim, Hwaseong-si (KR); Donghyun Kim, Siheung-si (KR); Myeongcheol Kim, Suwon-si (KR); Daeyong Kim, Yongin-si (KR); Chulsung Kim, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/820,564

(22) Filed: Aug. 7, 2015

(65) Prior Publication Data

US 2016/0043197 A1     Feb. 11, 2016

(30) Foreign Application Priority Data

Aug. 8, 2014  (KR) ...................... 10-2014-0102418

(51) Int. Cl.
*H01L 21/02*   (2006.01)
*H01L 29/66*   (2006.01)
*H01L 21/768*  (2006.01)
*H01L 21/311*  (2006.01)

(52) U.S. Cl.
CPC .... *H01L 29/6681* (2013.01); *H01L 21/31116* (2013.01); *H01L 21/76897* (2013.01); *H01L 29/6656* (2013.01)

(58) Field of Classification Search
CPC ..... H01L 21/30655; H01L 2224/11916; H01L 438/696; H01L 21/76831; H01L 21/76843; H01L 438/697; H01L 21/02065; H01L 21/02074; H01L 21/31051; H01L 21/32115; H01L 21/76819; H01L 438/698; H01L 21/76882; H01L 438/699; H01L 21/31055; H01L 21/03
See application file for complete search history.

(56) References Cited

U.S. PATENT DOCUMENTS

| 6,881,659 | B2 | 4/2005 | Park et al. |
| 8,436,404 | B2 | 5/2013 | Bohr et al. |
| 2007/0197034 | A1 | 8/2007 | Miyahara |
| 2009/0023285 | A1 | 1/2009 | Kim |

(Continued)

FOREIGN PATENT DOCUMENTS

| JP | 2001-102455 A | 4/2001 |
| JP | 2004-119529 A | 4/2004 |

(Continued)

*Primary Examiner* — Julio J Maldonado
*Assistant Examiner* — Stanetta Isaac
(74) *Attorney, Agent, or Firm* — Muir Patent Law PLLC

(57) ABSTRACT

Provided are a semiconductor device and a fabrication method thereof. The semiconductor device may include a fin-shaped active pattern and a gate electrode provided on a substrate, first and second spacers provided on a sidewall of the gate electrode, impurity regions provided at both sides of the gate electrode, a contact plug electrically connected to one of the impurity regions, and a third spacer enclosing the contact plug and having a top surface positioned at substantially the same level as a top surface of the contact plug.

18 Claims, 62 Drawing Sheets

(56) References Cited

U.S. PATENT DOCUMENTS

| | | |
|---|---|---|
| 2009/0068833 A1 | 3/2009 | Choi |
| 2011/0156107 A1* | 6/2011 | Bohr ................. H01L 21/76831 257/288 |
| 2013/0187228 A1* | 7/2013 | Xie ....................... H01L 29/785 257/347 |

FOREIGN PATENT DOCUMENTS

| | | |
|---|---|---|
| KR | 10-2001-0008839 A | 2/2001 |
| KR | 10-2005-0001844 A | 1/2005 |
| KR | 10-0721185 B1 | 5/2007 |
| KR | 10-2009-0096801 A | 9/2009 |

* cited by examiner

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2014-0102418, filed on Aug. 8, 2014, in the Korean Intellectual Property Office, the contents of which are herein incorporated by reference in their entirety.

BACKGROUND OF THE INVENTION

Example embodiments of the disclosure relate to a semiconductor device having a contact plug and a method of fabricating the same.

Due to their small-size, multi-functionality, and/or low-cost characteristics, semiconductor devices are considered important elements in the electronic industry. The semiconductor devices can be generally classified into a memory device for storing data, a logic device for processing data, and a hybrid device capable of performing various functions.

Higher integration and higher speed of semiconductor devices is required to satisfy consumer demands for electronic devices with a high density and a fast speed. However, an increase in density of semiconductor devices may lead to a process failure (e.g., bridge or short between conductive patterns). Example causes of such process failure are misalignment in manufacturing of contact holes and decreasing space margin between a gate structure and a contact plug. This failure can be overcome by increasing a thickness of an insulating layer interposed between the conductive patterns, but this may lead to an increase in electric resistance of the conductive pattern. Attempts at reducing the width of the contact plug also lead to an increase in its electric resistance.

SUMMARY

Example embodiments of the disclosure provide a semiconductor device with improved electric reliability and increased integration density.

Other example embodiments of the disclosure provide a method of fabricating the semiconductor device.

According to example embodiments of the disclosure, a semiconductor device may include fin-shaped active patterns on a substrate, gate electrodes crossing the fin-shaped active patterns, first spacers on both sidewalls of the gates electrodes, second spacers, each of which is disposed on a sidewall of a corresponding one of the first spacers and has a top surface positioned at substantially the same level as a top surface of the first spacer, polygonal impurity regions provided at both sides of the gate electrodes, a contact plug electrically connected to one of the impurity regions, and a third spacer surrounding the sidewalls of the contact plug and having a top surface positioned at substantially the same level as a top surface of the contact plug.

The third spacer may be in contact with a top surface of and disposed on a sidewall of one of the second spacers. The third spacer may be in contact with a top surface of one of the first spacers. In example embodiments the third spacer may be in contact with the outer side surface of the contact plug.

In example embodiments, the device may further include a first interlayer insulating layer filling a space on sides of the gate electrodes opposite the contact plug, and a second interlayer insulating layer on the first interlayer insulating layer. The contact plug may penetrate the first and second interlayer insulating layers.

In example embodiments, the contact plug may include a first portion positioned in the first interlayer insulating layer, and a second portion positioned in the second interlayer insulating layer. The second portion may have a width that decreases from top to bottom, and a minimum width of the second portion may be substantially equal to or larger than a mean width of the first portion.

In example embodiments, at least one of the first to third spacers may include one of silicon nitride, silicon oxide, and silicon oxynitride.

In example embodiments, the gate electrode may include a first gate pattern having a 'U'-shaped section and a second gate pattern filling a central upper gap of the first gate pattern.

In example embodiments, the device may further include capping patterns provided on the gate electrodes, respectively, and gate insulating patterns provided between the fin-shaped active patterns and the gate electrodes. Each of the first spacers and second spacers may have a top surface substantially coplanar with a top surface of a corresponding one of the capping patterns.

In example embodiments, the gate insulating pattern may include at least one of metal oxides and have a 'U'-shaped section.

According to example embodiments of the disclosure, a method of fabricating a semiconductor device may include forming fin-shaped active patterns on a substrate to extend parallel to a first direction, forming a gate structure to cross the fin-shaped active patterns and extending a second direction perpendicular to the first direction, sequentially forming first spacers and second spacers on a side surface of the gate structure, forming polygonal impurity regions in each of the fin-shaped active patterns and both sides of the gate structure, forming a first interlayer insulating layer (i.e., interlayer dielectric) to fill a space between the polygonal impurity regions and between the second spacers, forming a second interlayer insulating layer on the first interlayer insulating layer, etching the first and second interlayer insulating layers to form a contact hole exposing one of the impurity regions, isotropically etching the first and second interlayer insulating layers with the contact hole, forming a third spacer to cover an inner side surface of the contact hole, and filling a contact hole having the third spacer with a conductive material to form a contact plug.

In example embodiments, at least one of the first, second and third spacers (the third spacer to be described below) may include a material having an etch selectivity with respect to the first and second interlayer insulating layers.

In example embodiments, each of the first and second interlayer insulating layers may include a first silicon oxide layer, and the isotropic etching of the first and second interlayer insulating layers may be performed to selectively enlarge an upper portion of the contact hole positioned in the second interlayer insulating layer.

In example embodiments, at least one of the first to third spacers may be used to prevent a lower portion of the contact hole from expanding during the isotropic etching. The first and second spacers may have an etch selectivity with respect to the second interlayer insulating layer.

In example embodiments, at least one of the first to third spacers may include at least one of a second silicon oxide layer, a nitride layer, or an oxynitride layer, one or more of which may have an etch selectivity with respect to the first silicon oxide layer.

In example embodiments, the method may further include replacing a dummy gate structure with a gate insulating pattern, a gate electrode, and a capping pattern, which are sequentially stacked on the fin-shaped active patterns, after the forming of the first interlayer insulating layer. The method may further include forming a top surface of the first interlayer insulating layer to be substantially coplanar with a top surface of the capping pattern. In example embodiments, the method may further include the isotropic etching of the first and second interlayer insulating layers to be performed using chemical oxide removal (COR).

In example embodiments, the forming of the impurity regions may include growing epitaxial patterns from the fin-shaped active patterns using a selective epitaxial growth process.

In example embodiments, the forming of the third spacer may include forming a spacer layer to conformally cover the inner walls of the contact hole, anisotropically etching the spacer layer to remove a portion of the spacer layer from a bottom of the contact hole, and isotropically etching another portion of the spacer layer remaining on an inner side surface of the contact hole.

In example embodiments, the anisotropic and isotropic etchings of the spacer layer may be sequentially performed within a same chamber.

In example embodiments, the method may further include cleaning the inner side surface of the contact hole, before the forming of the contact plug. The cleaning may be performed to reduce a thickness of the third spacer.

In example embodiments, the method may further include doping of the impurity regions by implanting the impurities into the fin-shaped active pattern using the dummy gate structure as a mask.

In example embodiments, the method may further include forming the gate electrode to be comprised of a first gate pattern that has a 'U'-shape, and a second gate pattern that has a shape that fills a gap formed by the first gate pattern.

According to example embodiments of the disclosure, a method of fabricating a semiconductor device may include forming a fin-shaped active pattern on a substrate that extends parallel to a first direction, forming a gate structure that crosses the fin-shaped active pattern and extends in a second direction, sequentially forming first spacers and second spacers on side surfaces of the gate structure, forming impurity regions in the fin-shaped active pattern at both sides of the gate structure, forming a first interlayer insulating layer to cover the impurity regions, forming a second interlayer insulating layer on the first interlayer insulating layer, forming a contact hole exposing a portion of the fin-shaped active pattern, isotropically etching the first and second interlayer insulating layers to enlarge the contact hole, forming a third spacer to cover an inner side surface of the contact hole, and filling the contact hole with a conductive material to form a contact plug.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 2A through 20A are perspective views illustrating a method of fabricating a semiconductor device according to example embodiments of the disclosure.

FIGS. 2B through 20B are sectional views taken along line I-I' of FIGS. 2A through 20A, respectively.

FIGS. 2C through 6C and 10C through 13C are sectional views taken along line II-II' of FIGS. 2A through 6A and 10A through 13A, respectively.

FIGS. 7C through 9C and 14C through 20C are sectional views taken along line II-II' of FIGS. 7A through 9A and 14A through 20A, respectively.

Figure 1A:
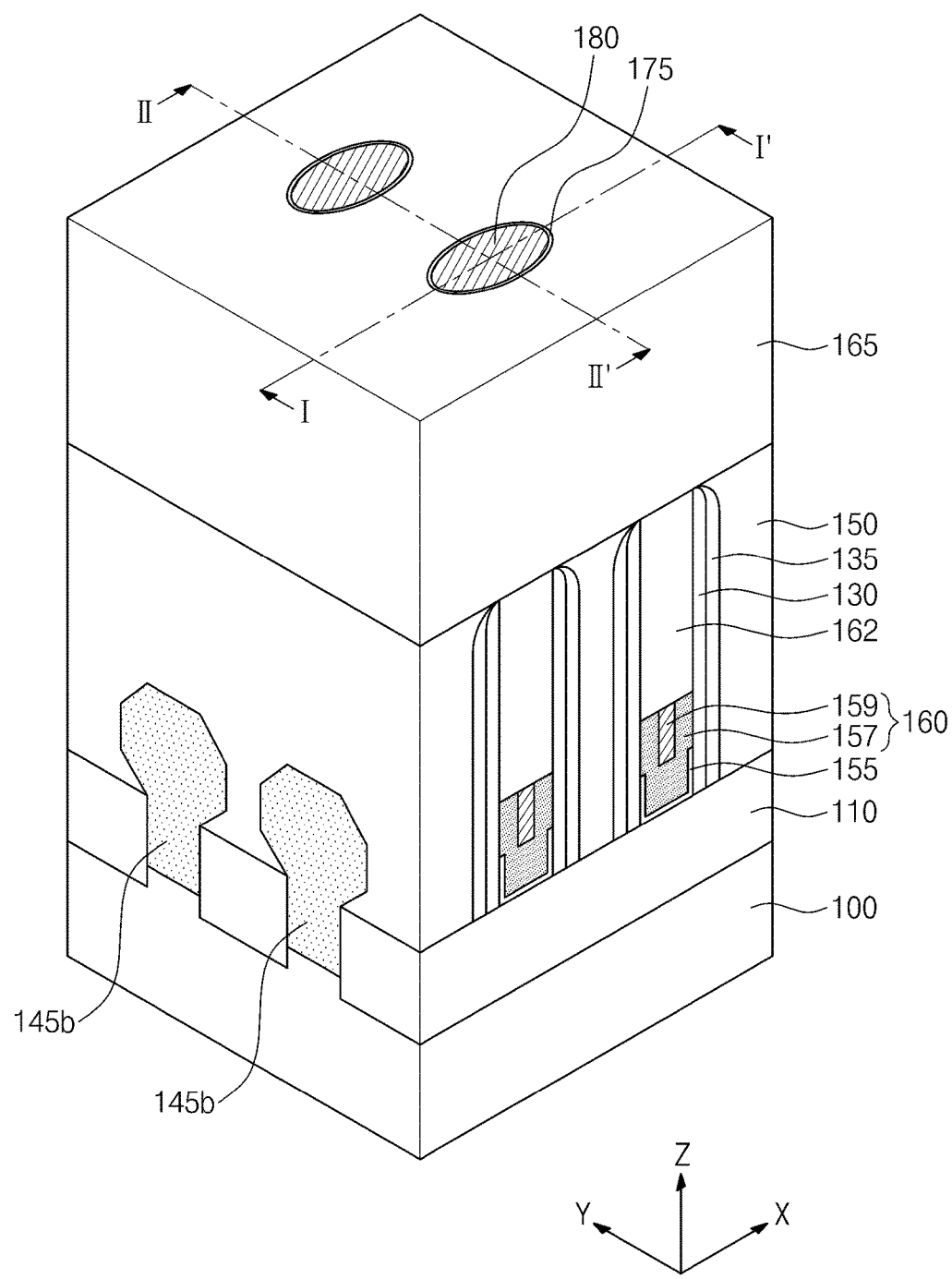
FIG. 1A is a perspective view illustrating a semiconductor device according to example embodiments of the disclosure.

It should be noted that these figures are intended to illustrate the general characteristics of methods, structure and/or materials utilized in certain example embodiments and to supplement the written description provided below. These drawings may not be to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the disclosure will now be described more fully with reference to the accompanying drawings, in which example embodiments are shown. Example embodiments of the disclosure may be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the disclosure are described herein with reference to cross-sectional illustrations that may be idealized embodiments (and intermediate structures) of example embodiments. As such, variations from the shapes of the illustrations as a result, for example, of manufacturing techniques and/or tolerances, are to be expected. Thus, example embodiments of the disclosure should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the disclosure belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
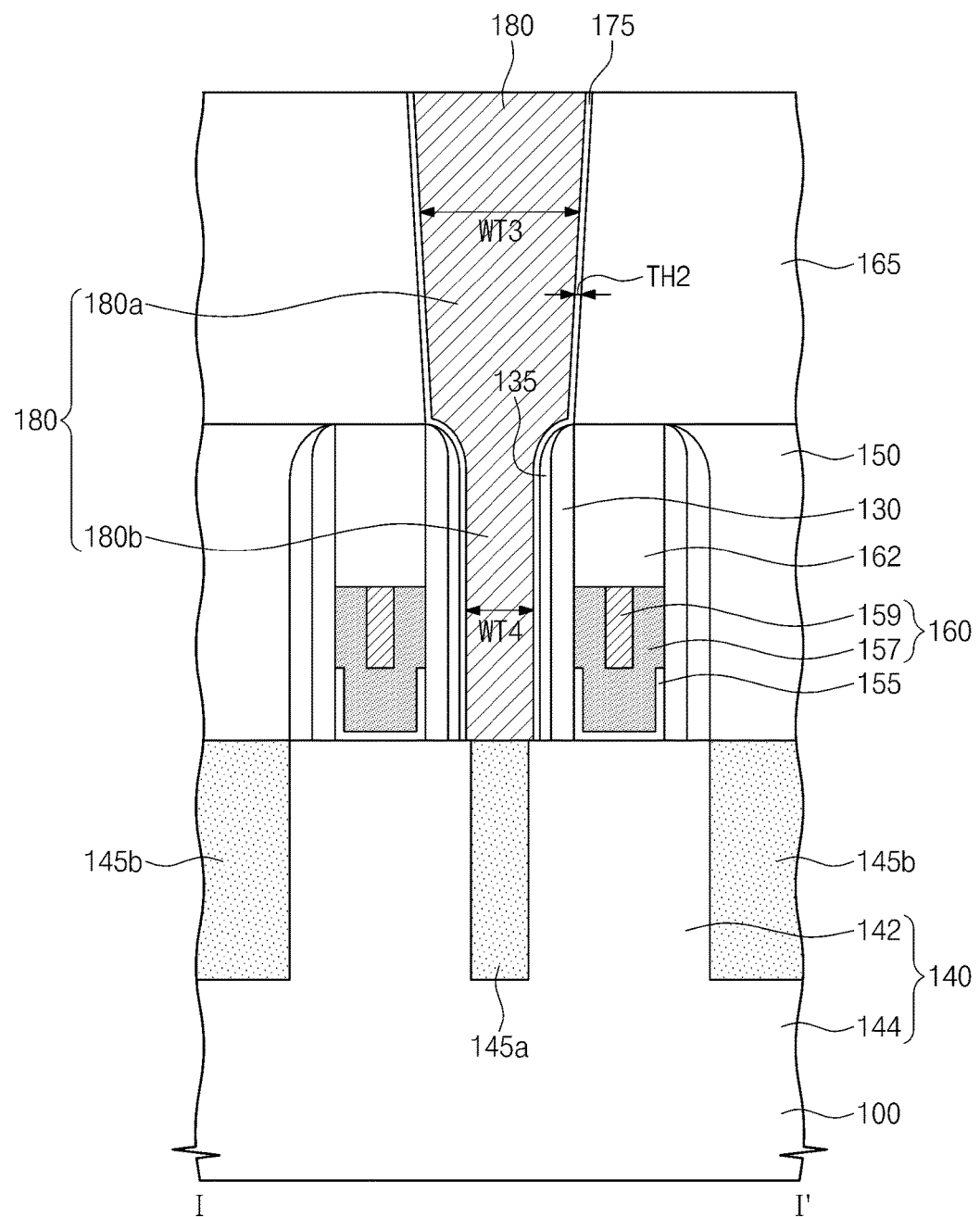
FIG. 1B is a sectional view of the semiconductor device taken along line I-I' of FIG. 1A.
Figure 1C:
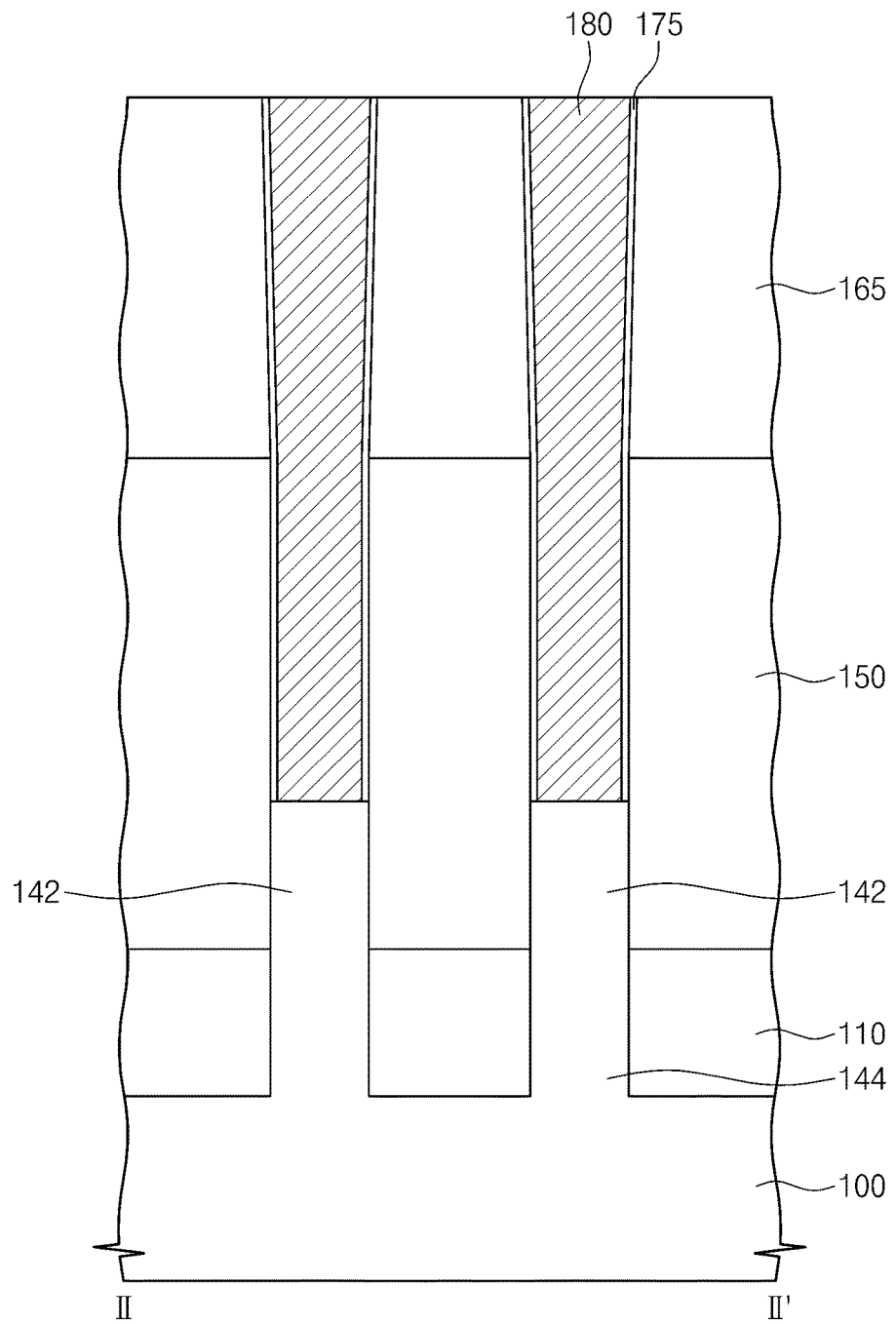
FIG. 1C is a sectional view of the semiconductor device taken along line II-II' of FIG. 1A.

FIG. 1A is a perspective view illustrating a semiconductor device according to example embodiments of the inventive concept, and FIGS. 1B and 1C are sectional views taken along lines I-I' and II-II', respectively, of FIG. 1A.

Referring to FIGS. 1A through 1C, a semiconductor device may include a substrate 100 with fin-shaped active patterns 140, a device isolation layer 110, transistors with a channel region (not shown), and contact plugs 180.

The substrate 100 may be formed of or include a semiconductor material (e.g., silicon or germanium). For example, the substrate 100 may be provided in the form of a silicon wafer, a germanium wafer, a silicon-on-isolator (SOI) wafer, or a germanium-on-isolator (GOI) wafer. The device isolation layer 110 may be provided on the substrate 100 to define the fin-shaped active patterns 140.

Each of the fin-shaped active patterns 140 may protrude from the substrate 100 in a Z-axis direction and extend parallel to an X-axis direction. The fin-shaped active patterns 140 may be formed parallel to each other. In example embodiments, each of the fin-shaped active patterns 140 may include a first portion 142, whose top surface is higher than a top surface of the device isolation layer 110, and a second portion 144, whose top surface is lower than the top surface of the device isolation layer 110. According to some aspects of the disclosure, the fin-shaped active patterns 140 and the substrate 100 may be continuously connected to each other, thereby forming a single body.

Each of the transistors may include a gate electrode 160, a gate insulating pattern 155, first and second impurity regions 145a and 145b, a capping pattern 162, and a spacer structure. The gate electrode 160 may be provided to cross the fin-shaped active patterns 140 and the device isolation layer 110 in a Y-axis direction, and the gate insulating pattern 155 may be provided between the gate electrode 160 and the fin-shaped active patterns 140. The first and second impurity regions 145a and 145b may be provided at both sides of the gate electrode 160, and the capping pattern 162 may be provided on the gate electrode 160 to protect the gate electrode 160. The spacer structure may be provided to cover side surfaces of the gate electrode 160 and the capping pattern 162.

The gate insulating pattern 155 may cross the first portions 142 of the fin-shaped active patterns 140 and extend parallel to the Y-axis direction. In example embodiments, as shown in the sectional view of FIG. 1B, the gate insulating pattern 155 may be formed to have a 'U'-shaped section. Further, the gate insulating pattern 155 may include at least one of metal oxides. For example, the gate insulating pattern 155 may be formed of or include at least one of hafnium oxide ($HfO_2$), hafnium silicon oxide (HfSiO), hafnium silicon oxynitride (HfSiON), hafniumoxynitride (HfON), hafnium aluminum oxide (HfAlO, hafnium lanthanum oxide (HfLaO), zirconium oxide ($ZrO_2$), tantalum oxide ($TaO_2$), zirconium silicon oxide (ZrSiO), or lanthanum oxide ($La_2O_3$).

The gate electrode 160 may be provided on the gate insulating pattern 155 to extend along the Y-axis direction. In example embodiments, the gate electrode 160 may include a first gate pattern 157 and a second gate pattern 159. The first gate pattern may be formed of or include at least one of metals (e.g., titanium (Ti), tantalum (Ta), aluminum (Al), hafnium (Hf), tungsten (W), and molybdenum (Mo)), nitrides thereof, carbides thereof or silicide thereof. The second gate pattern may be formed of or include at least one of metals (e.g., titanium (Ti), tantalum (Ta), aluminum (Al), hafnium (Hf), tungsten (W), and molybdenum (Mo)).

As shown in the sectional view of FIG. 1B, the first gate pattern 157 may have a 'U'-shaped section. The second gate pattern 159 may be provided to fill a central upper portion of the first gate pattern 157. The first and second gate patterns 157 and 159 may have top surfaces that are substantially coplanar with each other.

The capping pattern 162 may be provided on the gate electrode 160 and may extend parallel to the Y-axis direction. The capping pattern 162 may include at least one of a silicon nitride layer, a silicon oxide layer, or a silicon oxynitride layer.

The spacer structure may include a first spacer 130, a second spacer 135, and a third spacer 175. The first spacer 130 may be provided to cover both side surfaces of each of the gate insulating pattern 155, the gate electrode 160, and the capping pattern 162. The second spacer 135 may be provided to cover a side surface of the first spacer 130, and a third spacer 175 may be provided to cover a side surface of the second spacer 135.

In example embodiments, the first spacer 130 may extend parallel to the Y-axis direction and parallel to the Z-axis direction. The first spacer 130 may have a top surface that is substantially coplanar with a top surface of the capping pattern 162. As an example, the first spacer 130 may be formed of or include a silicon nitride layer.

The second spacer 135 may extend parallel to the Y-axis direction, parallel to the Z-axis direction and have a top surface that is substantially coplanar with a top surface of the first spacer 130. The second spacer 135 may be formed of or include at least one of a silicon nitride layer, a silicon oxide layer, or a silicon oxynitride layer.

The third spacer 175 may extend from the side surface of the second spacer 135 along a Z-axis direction and thereby cover a side surface of the contact plug 180. According to some aspects of the disclosure, the third spacer 175 may be in contact with a portion of a top surface of the second spacer 135. Further, the third spacer 175 may be in contact with a portion of a top surface of the first spacer 130. The third spacer 175 may be formed of or include at least one of a silicon nitride layer, a silicon oxide layer, or a silicon oxynitride layer.

The first and second impurity regions 145a and 145b may be provided on the second portions 144 of the fin-shaped active pattern 140 positioned at both sides of the gate electrode 160. Each of the first and second impurity regions 145a and 145b may be grown from the second portions 144 of the fin-shaped active pattern 140 using a selective epitaxial growth process, and thus, it may have a polygonal shape. The first and second impurity regions 145a and 145b may serve as source/drain regions of the transistor. According to some aspects of the disclosure, each of the first and second impurity regions 145a and 145b may have a top surface that is substantially coplanar with a top surface of the first portion 142 of the fin-shaped active pattern 140.

The semiconductor device may further include a first interlayer insulating layer 150 on sides of the gate electrodes 160, and a second interlayer insulating layer 165 covering top surfaces of the capping patterns 162 and the first interlayer insulating layer 150. Each of the first and second interlayer insulating layers 150 and 165 may include silicon oxide. In example embodiments, the first to third spacers 130, 135, and 175 may include at least one of materials having an etch selectivity with respect to the first and second interlayer insulating layers 150 and 165. For example, in the case where the first and second interlayer insulating layers 150 and 165 include a first silicon oxide layer, the first to third spacers 130, 135, and 175 may include at least one of a second silicon oxide layer, a silicon nitride layer, or a silicon oxynitride layer. The second silicon oxide layer may have an etch selectivity with respect to the first silicon oxide layer.

The contact plug 180 may be formed to penetrate the first and second interlayer insulating layers 150 and 165 and may be electrically connected to the first impurity region 145a. As described above, the side surface of the contact plug 180 may be enclosed by the third spacer 175.

In example embodiments, the contact plug 180 may include a lower portion 180b penetrating the first interlayer insulating layer 150 and an upper portion 180a penetrating the second interlayer insulating layer 165. As shown in FIG. 1B, the upper portion 180a of the contact plug 180 may have a width WT3 that decreases from top to bottom (with respect to the Z-axis). For example, the minimum value of the third width WT3 of the upper portion 180a may be substantially equal to or larger than a mean value of the fourth width WT4 of the lower portion 180b.

Since the contact plug 180 and the gate electrode 160 are electrically separated from each other by the first to third spacers 130, 135, and 175, electric reliability between the contact plug 180 and the gate electrode 160 can be improved. Further, since the third spacer 175 is provided on side surfaces of the contact plug 180, it is possible to improve uniformity in shape and dimension of the contact plugs 180 provided in the semiconductor device.

Hereinafter, a method of fabricating a semiconductor device according to example embodiments of the disclosure will be described.

FIGS. 2A through 20A are perspective views illustrating a method of fabricating a semiconductor device according to example embodiments of the disclosure. FIGS. 7C through 9C and 14C through 20C are sectional views taken along line II-II' of FIGS. 7A through 9A and 14A through 20A, respectively. FIGS. 2C through 6C and 10C through 13C are sectional views taken along line II-II' of FIGS. 2A through 6A and 10A through 13A, respectively.

Figure 2A:
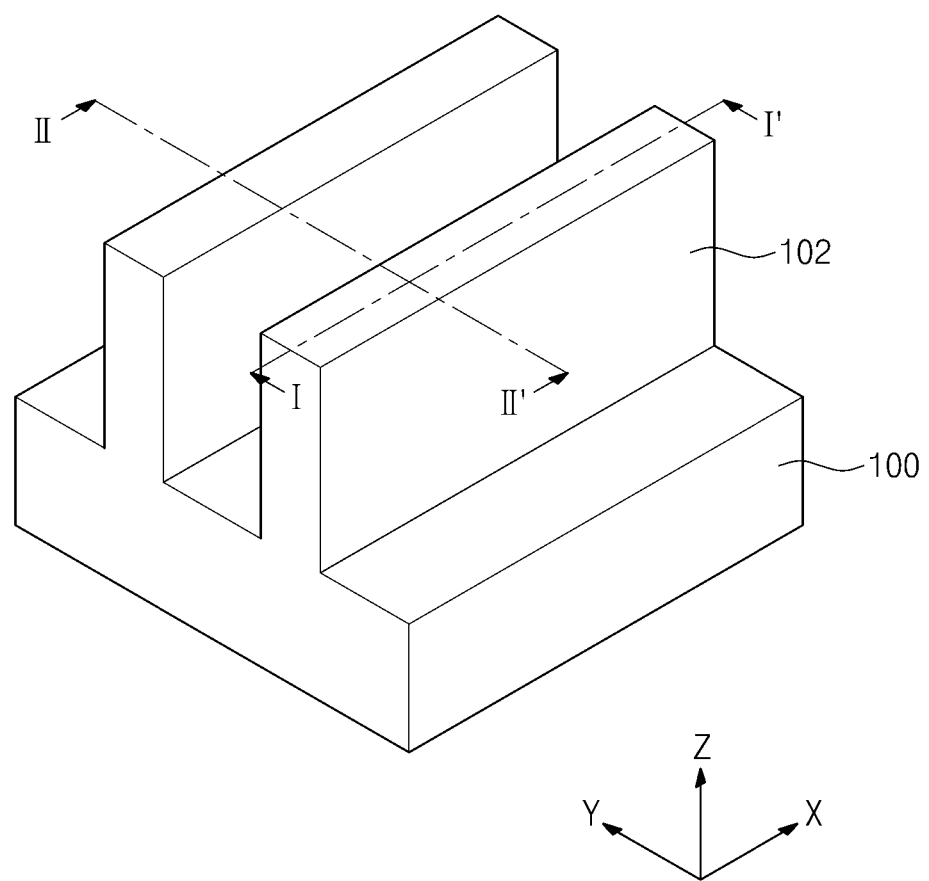
Figure 2B:
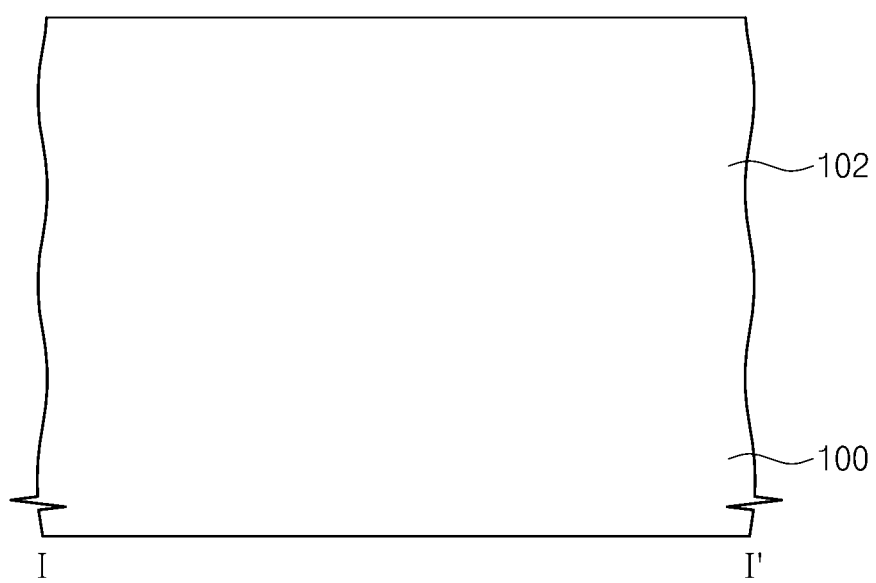
Figure 2C:
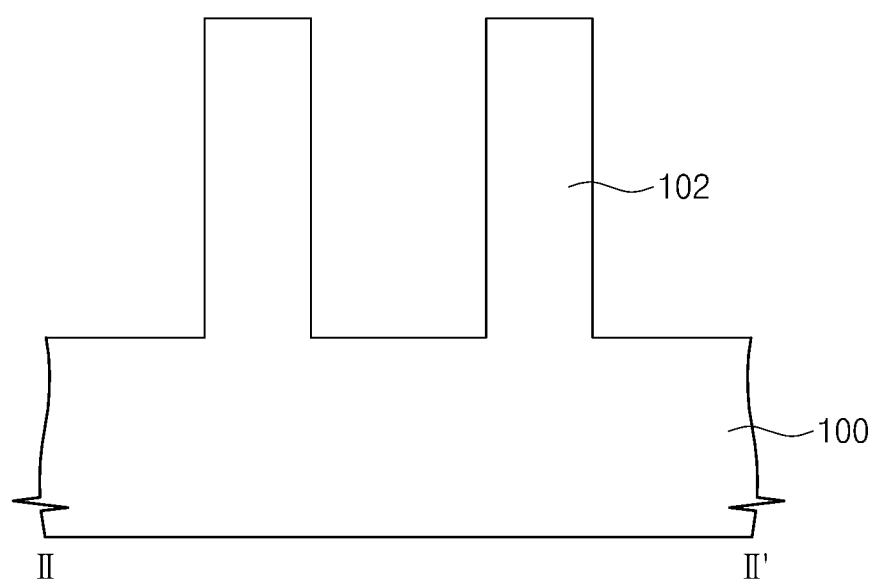

Referring to FIGS. 2A through 2C, initial fin-shaped active patterns 102 may be formed on a substrate 100. Each of the initial active patterns 102 may protrude from a top surface of the substrate 100 upward in a Z-axis direction. The initial fin-shaped active patterns 102 may extend parallel to an X-axis direction and cross the substrate 100. The initial fin-shaped active patterns 102 may be formed parallel to each other.

In example embodiments, the formation of the initial fin-shaped active patterns 102 may include forming a first mask (not shown) on an initial substrate, etching the initial substrate using the first mask as an etch mask. The etching process of the initial substrate may be performed in such a way that the substrate 100 has a top surface lower than those of the initial fin-shaped active patterns 102. The first mask may be removed after the formation of the initial fin-shaped active patterns 102 and the substrate 100.

In other embodiments, although not shown in detail, the fin-shaped active pattern 140 may be formed by performing an epitaxial growth process on the substrate 100.

Figure 3A:
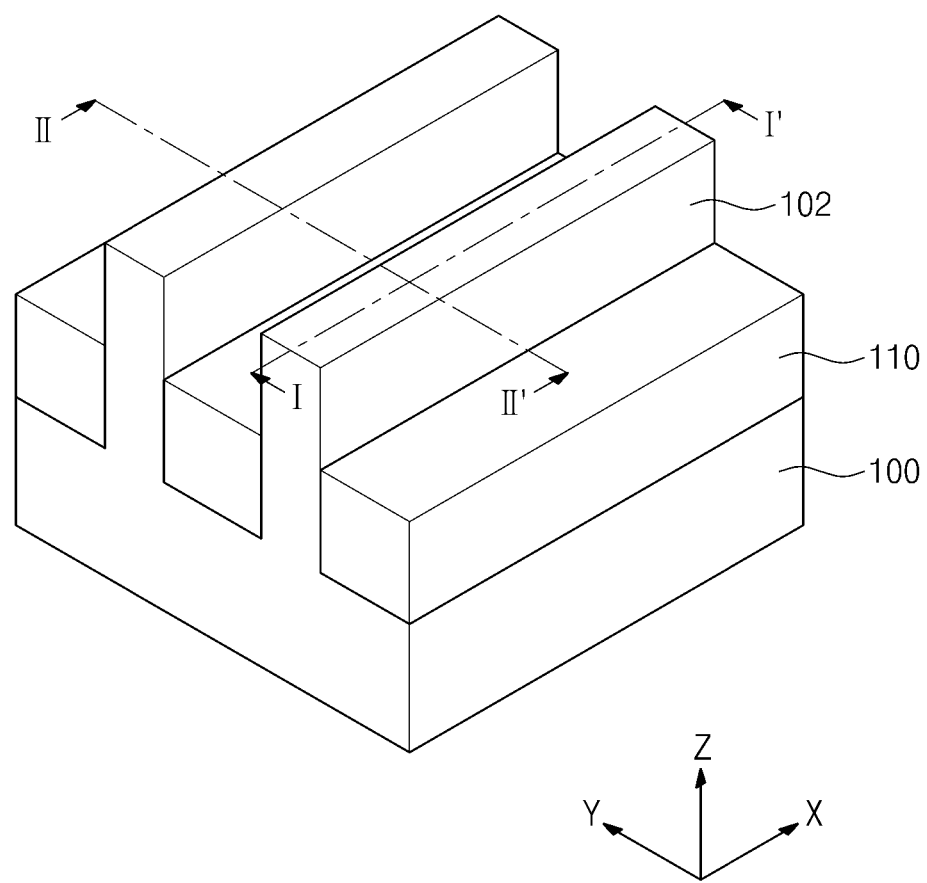
Figure 3B:
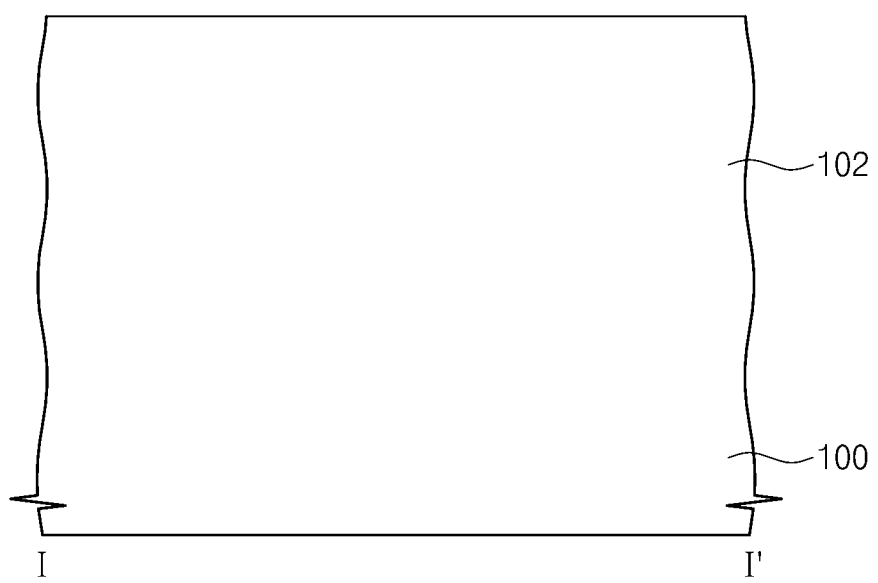
Figure 3C:
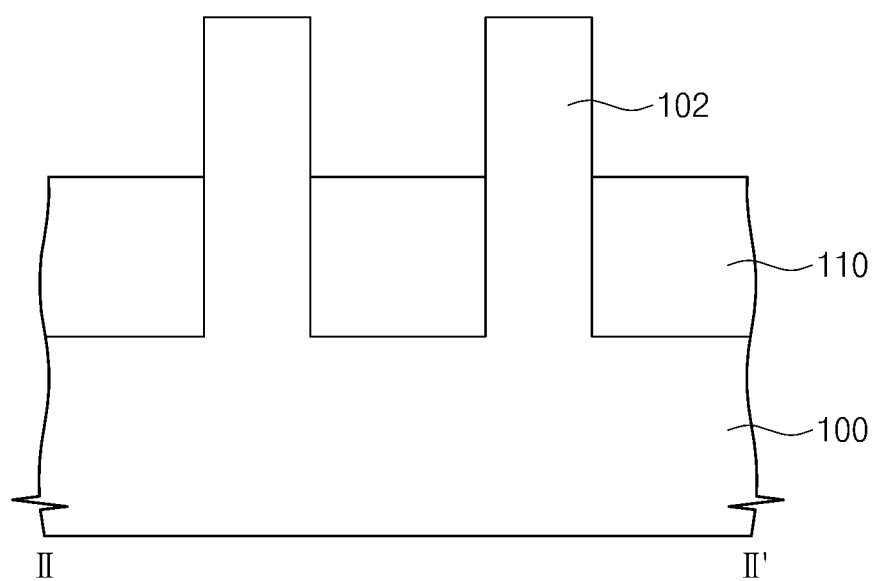

Referring to FIGS. 3A through 3C, a device isolation layer 110 may be formed between the initial fin-shaped active patterns 102 to cover lower portions of the initial fin-shaped active patterns 102. The device isolation layer 110 may be formed of or include an insulating material (e.g., silicon oxide).

Figure 4A:
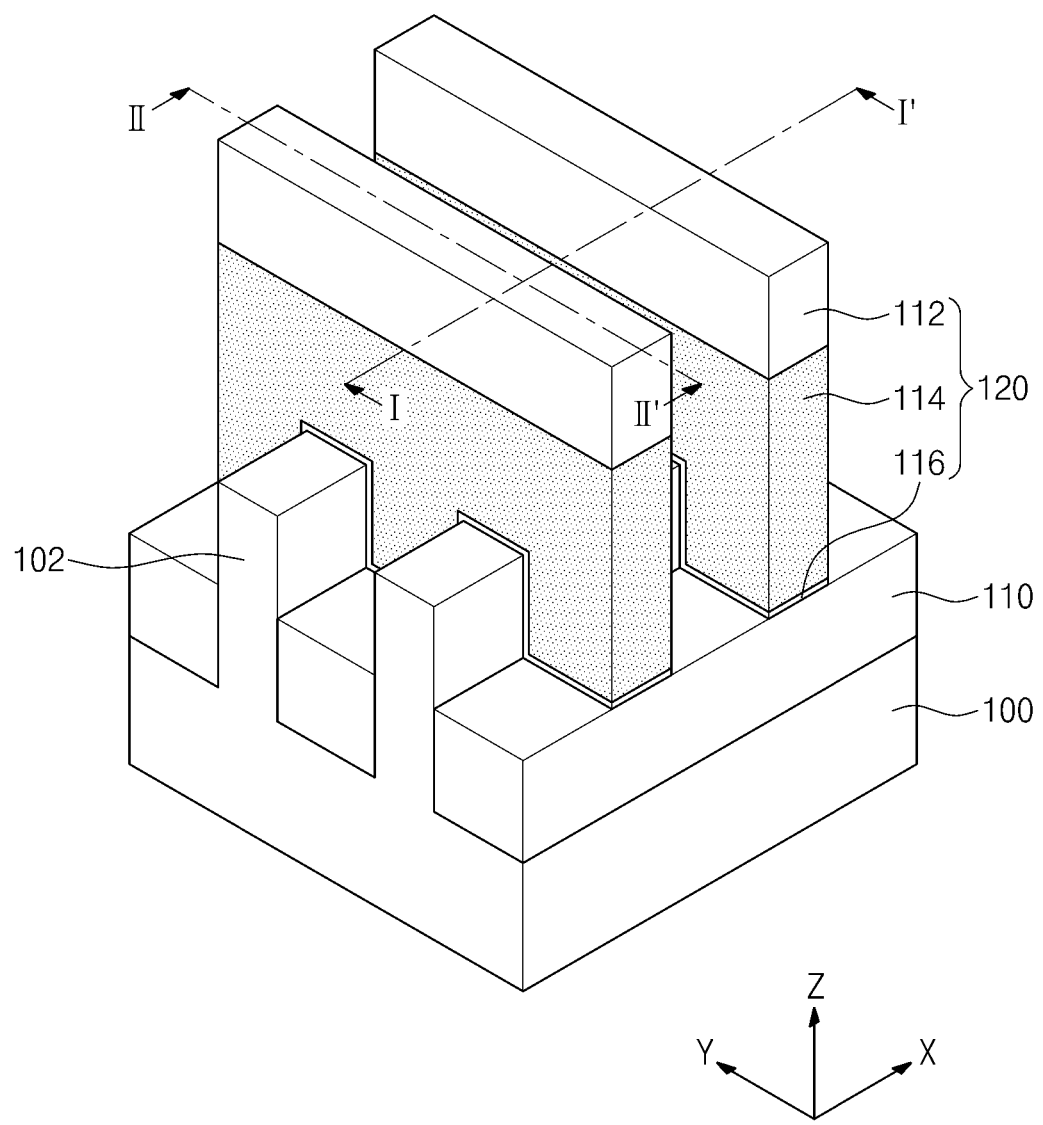
Figure 4B:
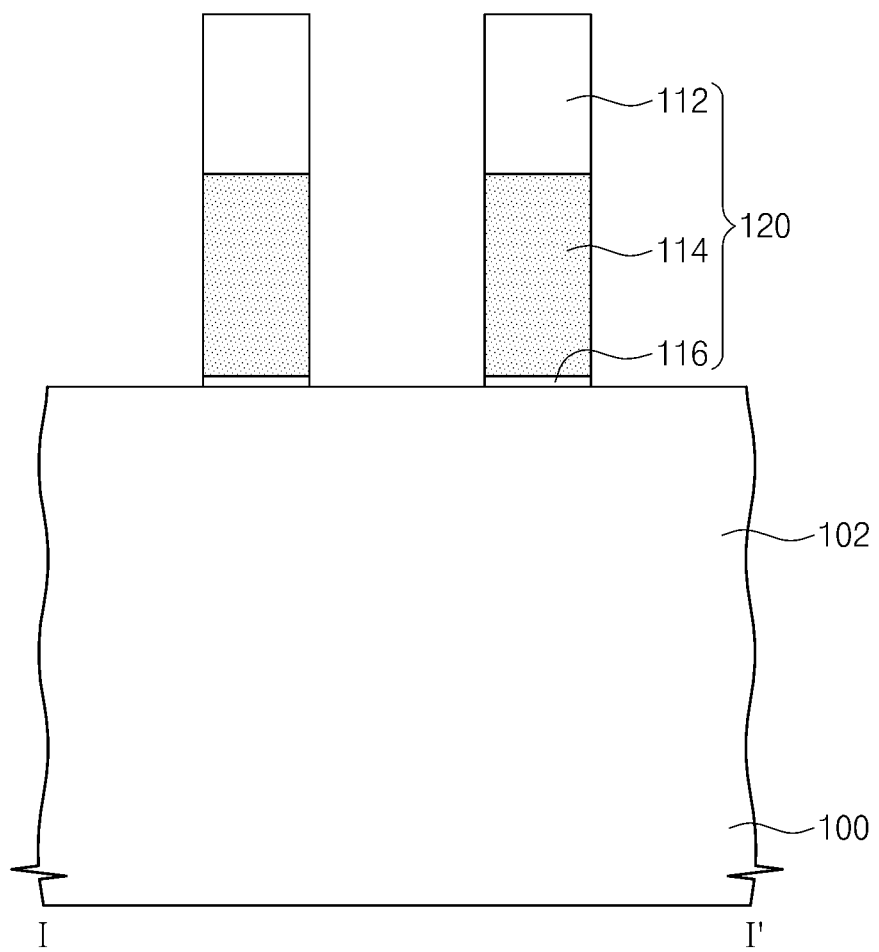
Figure 4C:
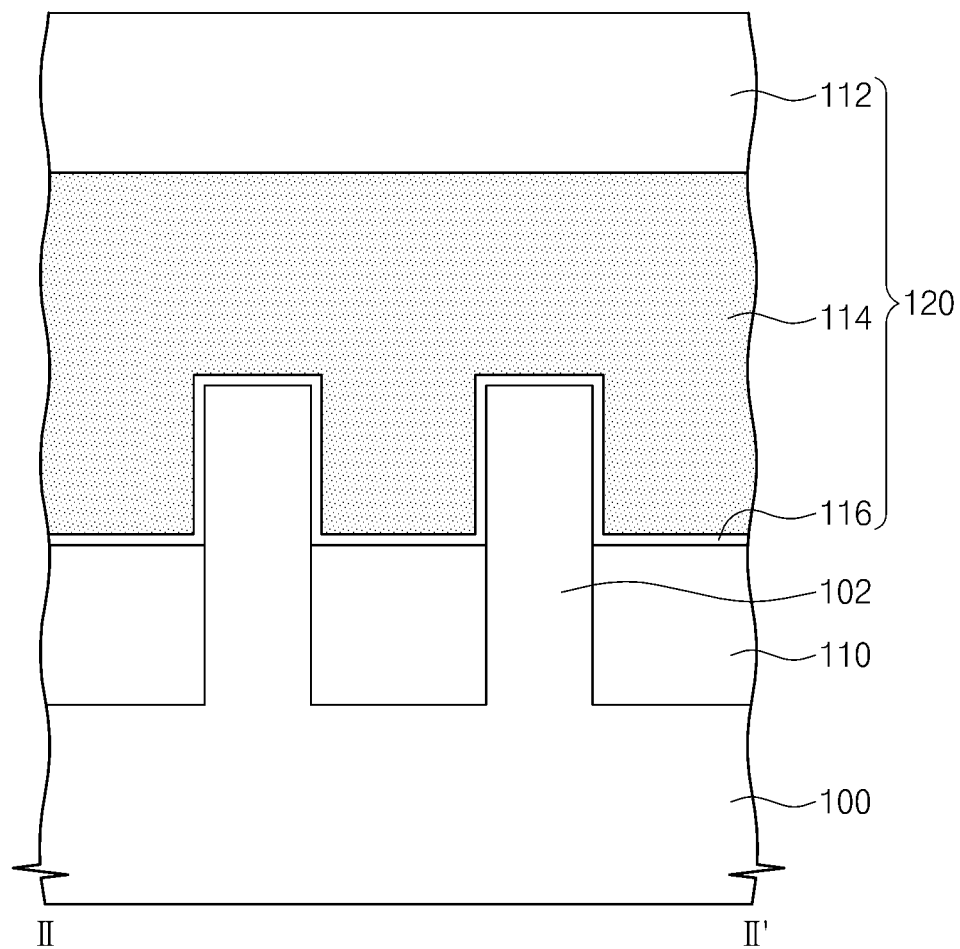

Referring to FIGS. 4A through 4C, a dummy structure 120 may be formed to cross the initial fin-shaped active patterns 102 and the device isolation layer 110. As will be appreciated, in alternative embodiments dummy structure 120 may instead be a final gate structure of the semiconductor device (and thus subsequent process steps described below of removing and replacing the dummy structure 120 may be avoided).

For example, an insulating layer (not shown) may be formed on the initial fin-shaped active patterns 102 and device isolation layer 110, and a poly-silicon layer (not shown) may be formed on the insulating layer. A second mask 112 may be formed on the poly-silicon layer. The second mask 112 may be formed to extend along the Y-axis direction.

The poly-silicon layer and the insulating layer may be etched using the second mask 112 as an etch mask to form polysilicon patterns 114 and insulating patterns 116, which extend parallel to the Y-axis direction and cross the initial active patterns 102. The dummy structure 120 may include the insulating pattern 116, the polysilicon pattern 114, and the second mask 112. In certain embodiments, the insulating layer may not be etched.

Figure 5A:
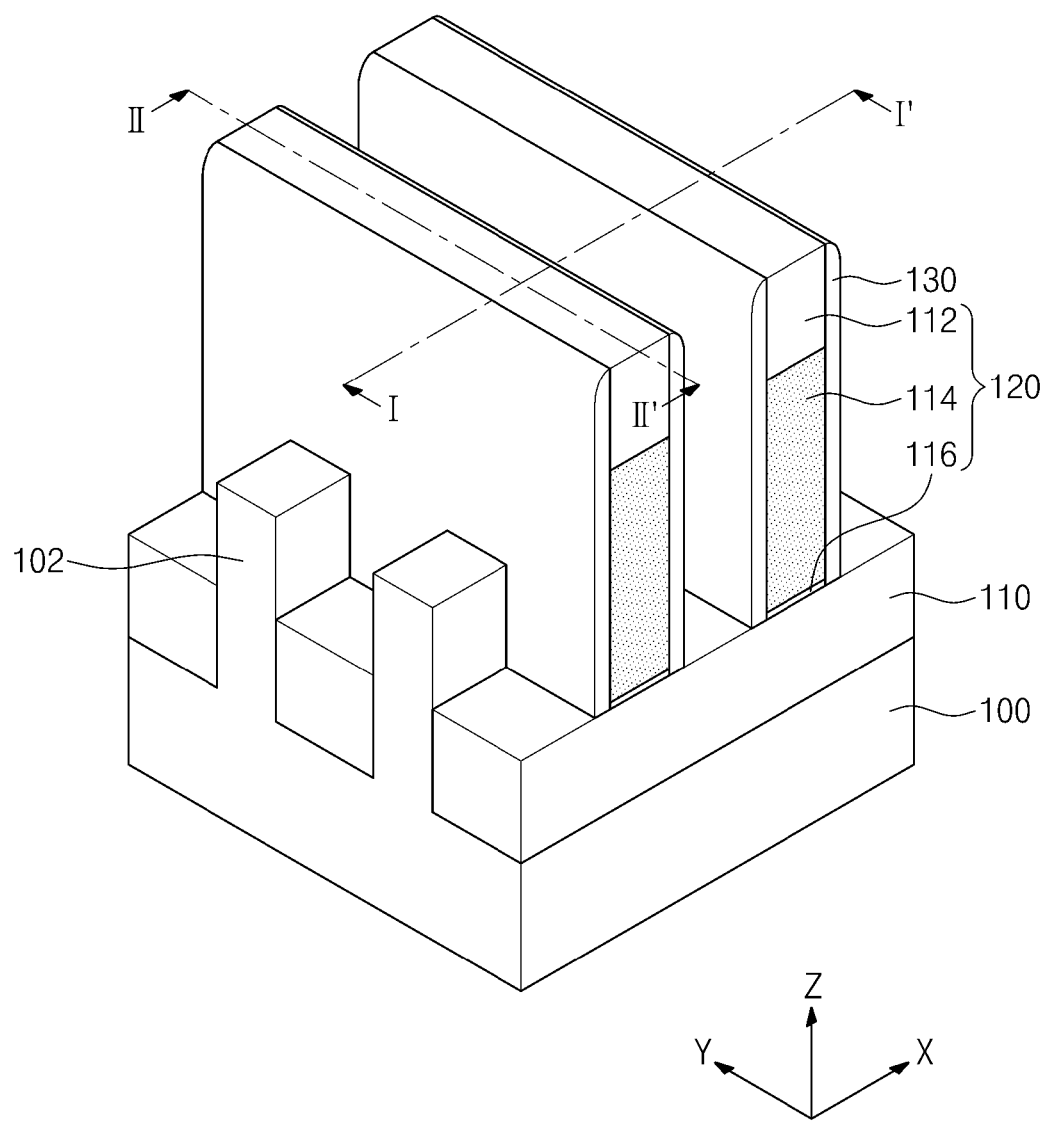
Figure 5B:
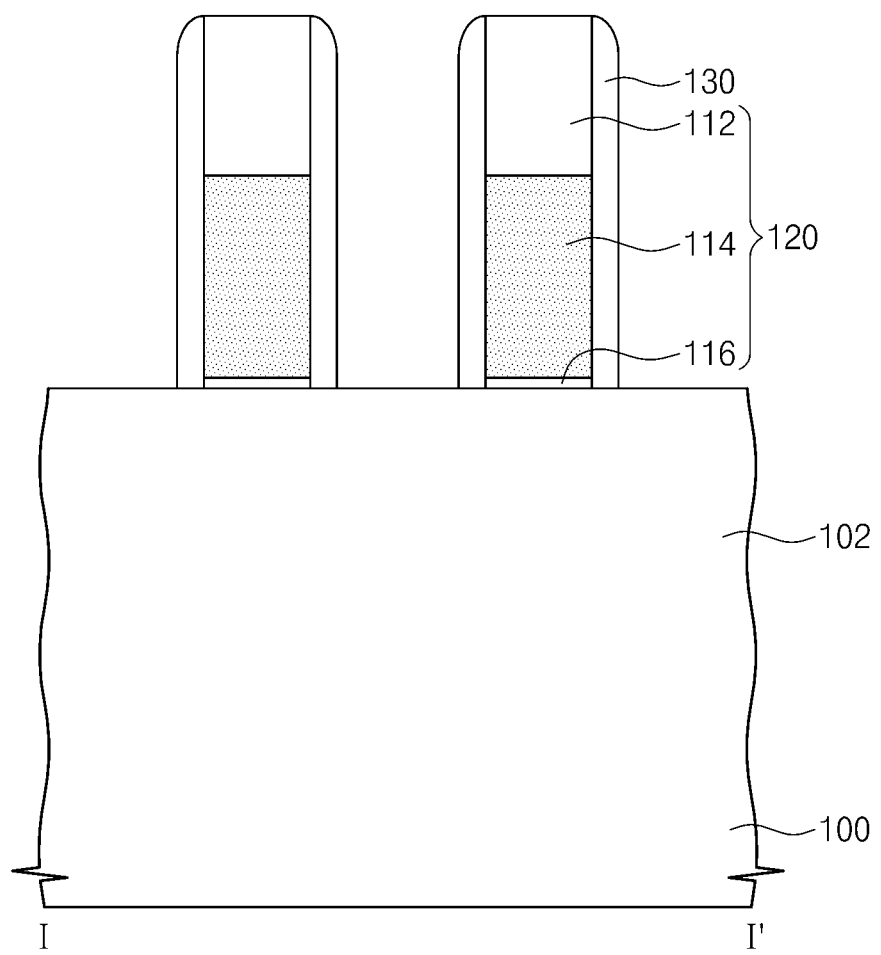
Figure 5C:
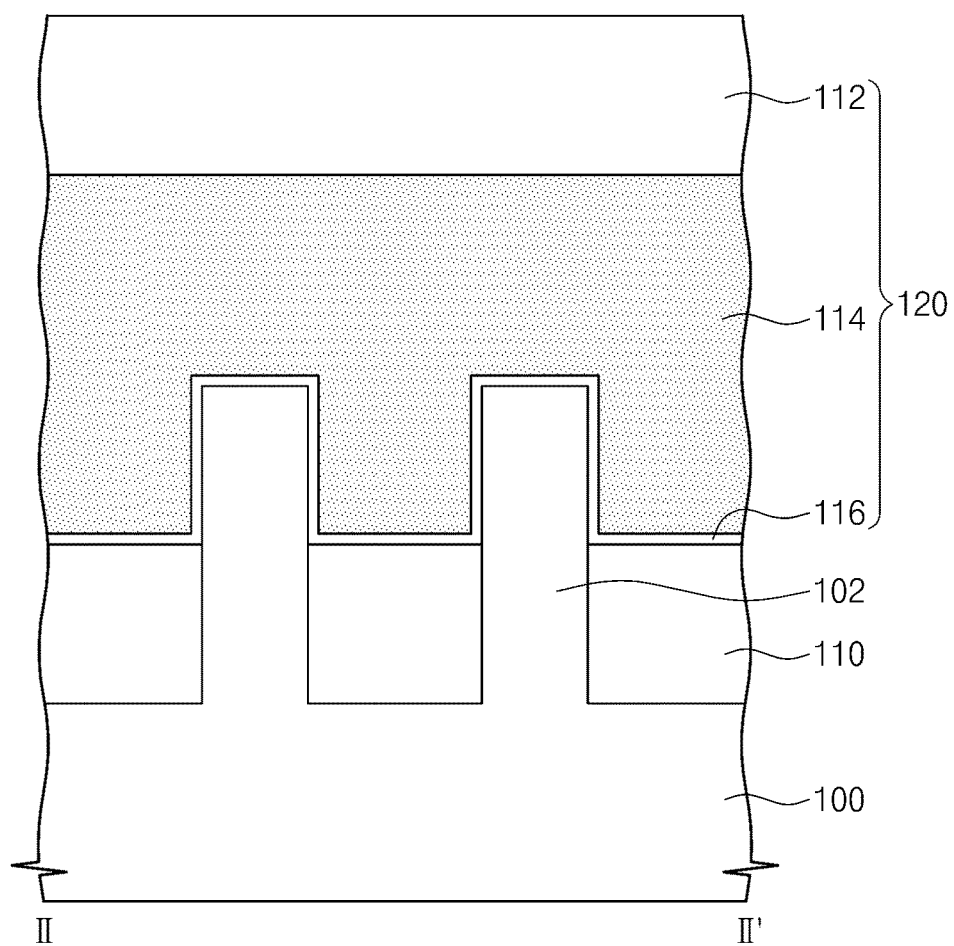

Referring to FIGS. 5A through 5C, a first spacer 130 may be formed to cover a side surface of the dummy structure 120. The first spacer 130 may extend parallel to the Y-axis direction.

The first spacer 130 may be formed of or include a material having an etch selectivity with respect to the dummy structure 120. For example, the first spacer 130 may include at least one of a silicon nitride layer, a silicon oxide layer, or a silicon oxynitride layer. The first spacer 130 may be formed by blanket depositing a layer of material of the first spacer (e.g., a layer of a silicon nitride layer, a silicon oxide layer, or a silicon oxynitride layer) to cover the structure illustrated in FIGS. 4A-4C and performing an etch of the same to remove portions on horizontal surfaces and obtain the first spacer 130.

Figure 6A:
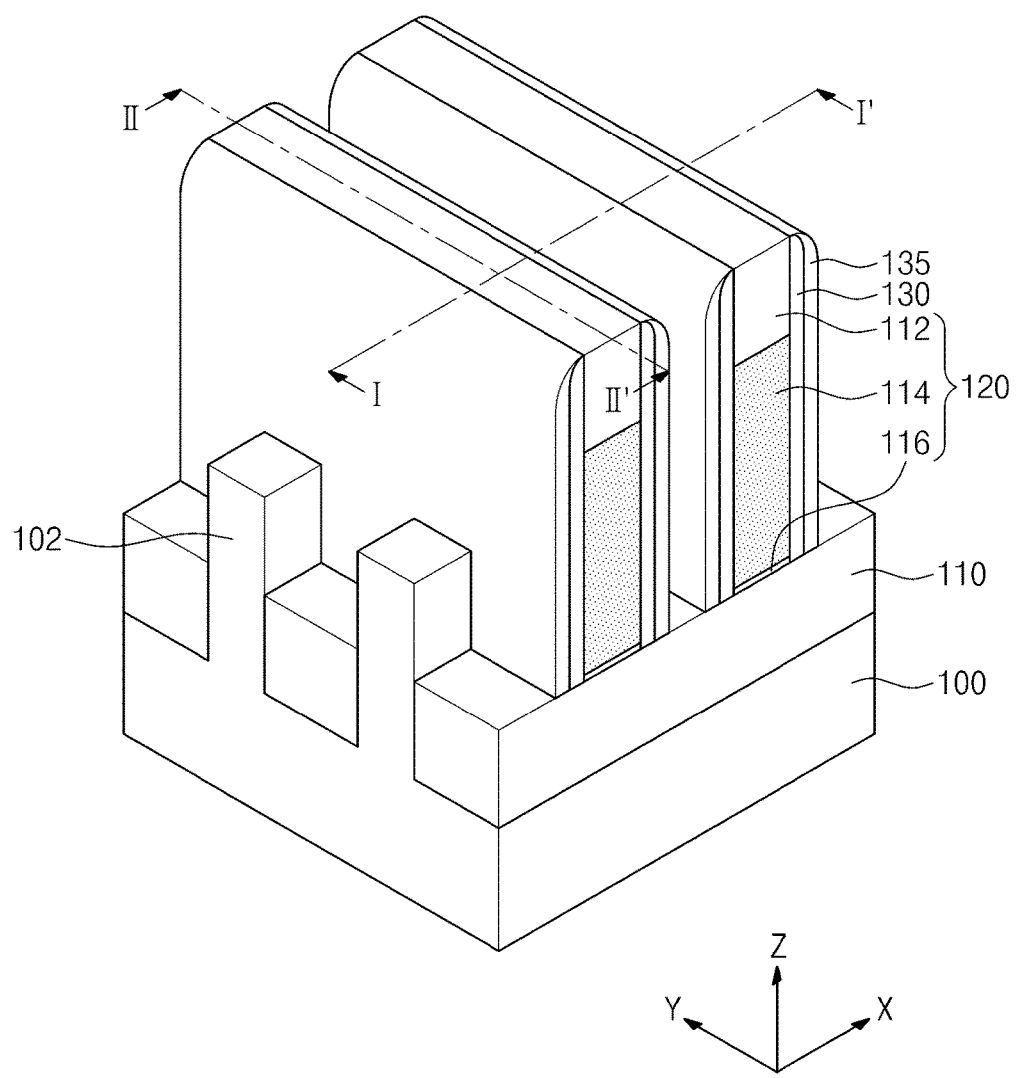
Figure 6B:
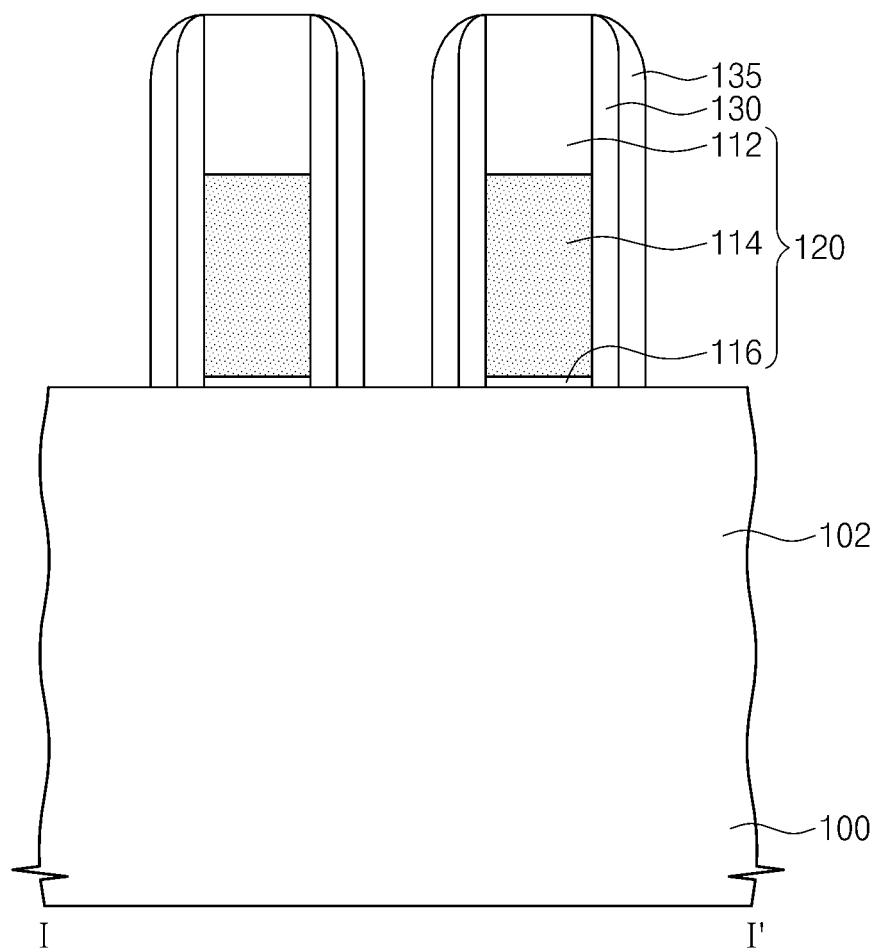
Figure 6C:
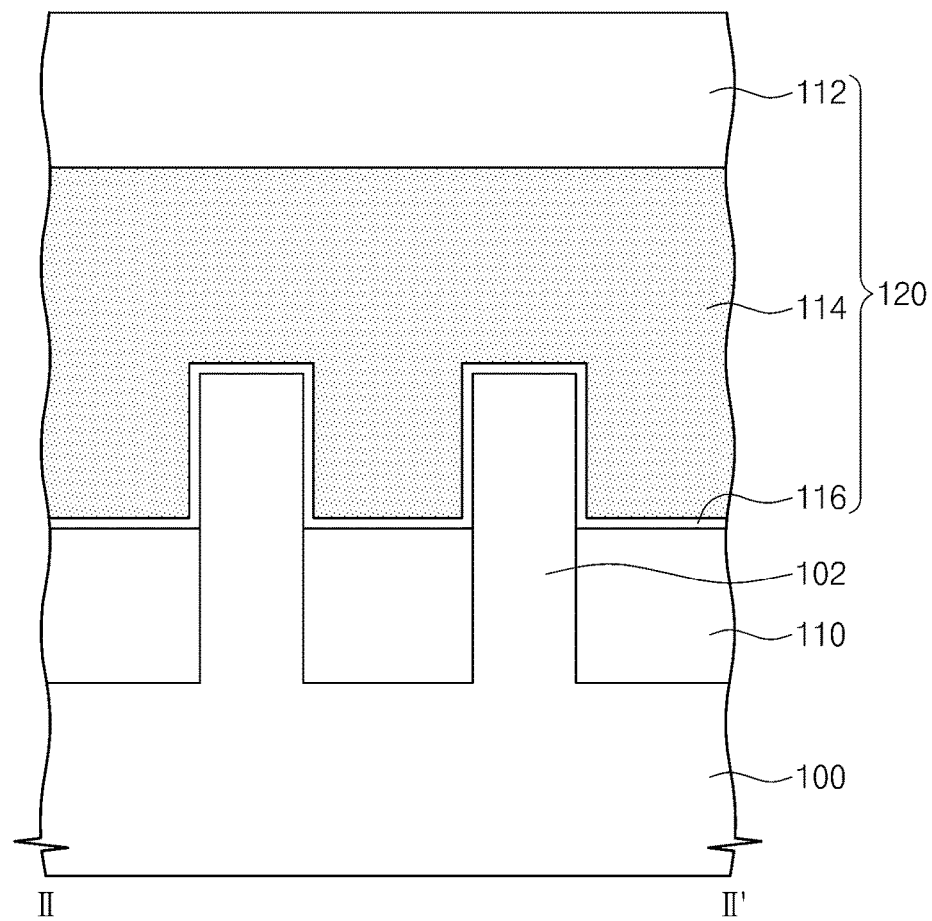

Referring to FIGS. 6A through 6C, a second spacer 135 may be formed on a side surface of the first spacer 130. The second spacer 135 may extend parallel to the Y-axis direction. The second spacer 135 may be formed of or include at least one of a silicon nitride layer, a silicon oxide layer, or a silicon oxynitride layer. The second spacer 135 may be formed by blanket depositing a layer of material of the second spacer (e.g., a layer of a silicon nitride layer, a silicon oxide layer, or a silicon oxynitride layer) to cover the structure illustrated in FIGS. 5A-5C and performing an etch of the same to remove portions on horizontal surfaces and obtain the second spacer 135.

Figure 7A:
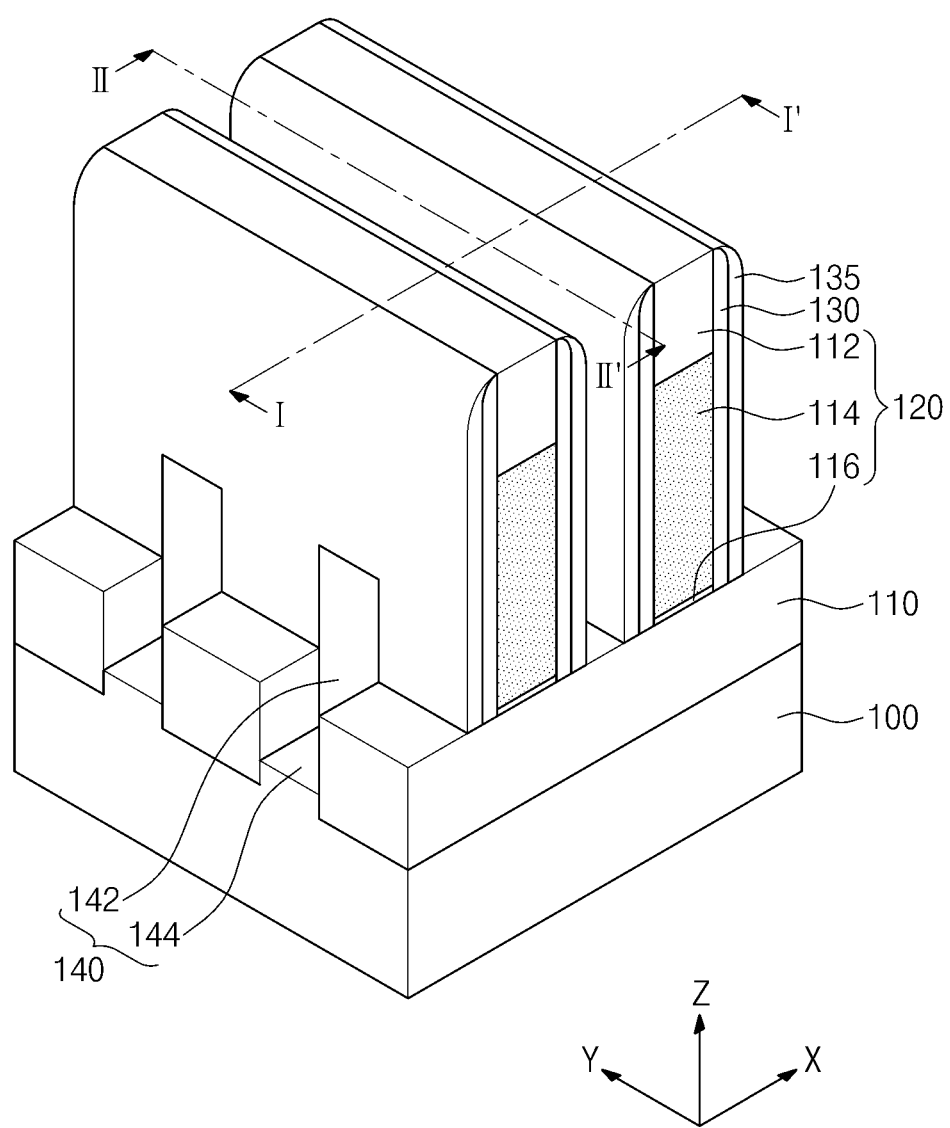
Figure 7B:
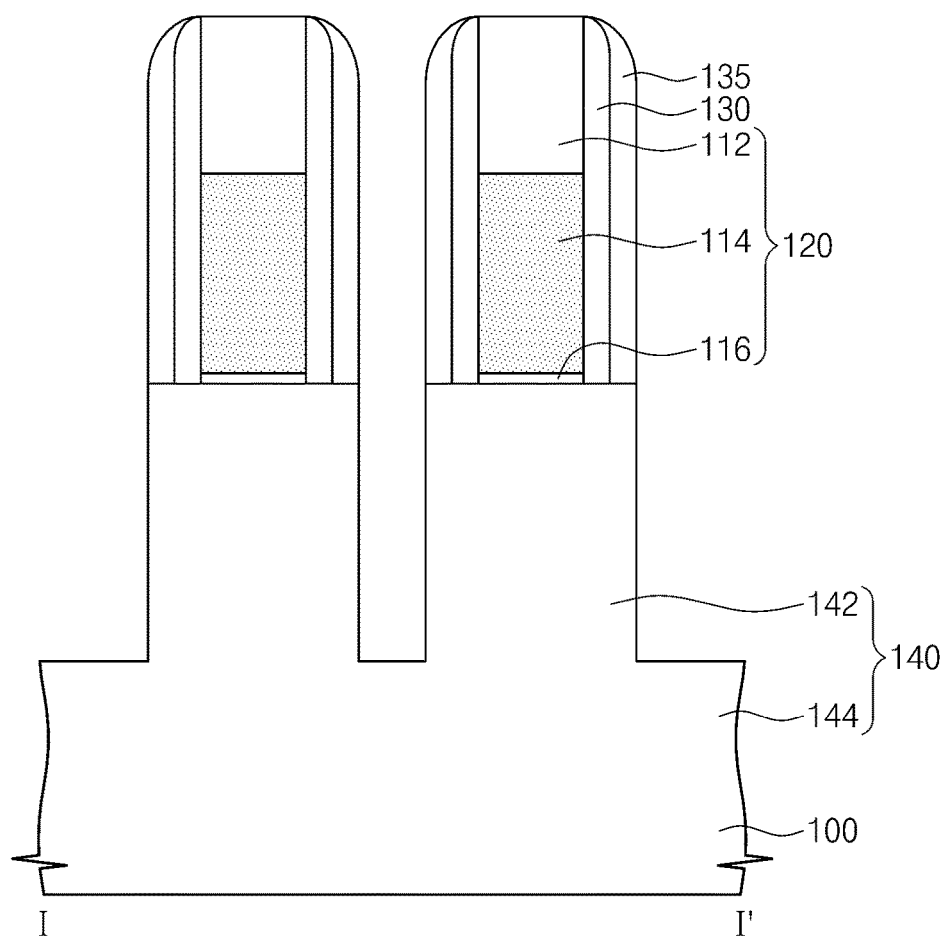
Figure 7C:
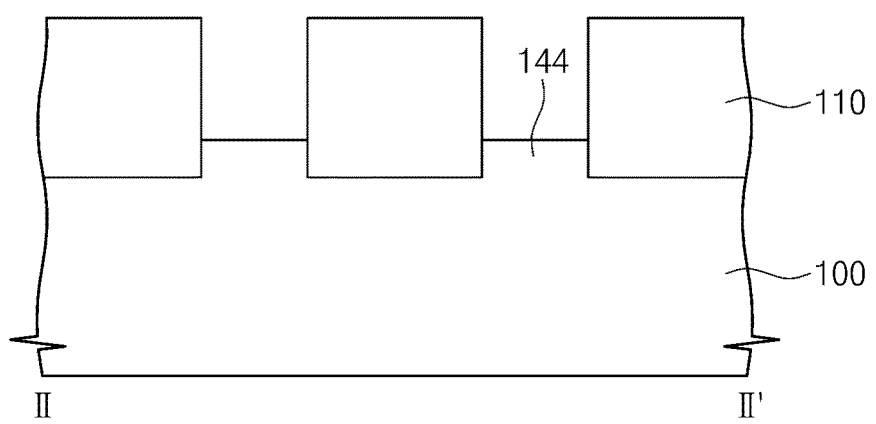

Referring to FIGS. 7A through 7C, the initial fin-shaped active patterns 102 exposed by the second spacers 135 may be etched to form fin-shaped active patterns 140. Etched or recessed portions of the fin-shaped active patterns 140 may have top surfaces lower than the top surface of the device isolation layer 110.

In example embodiments, each of the fin-shaped active patterns 140 may include a first portion 142 covered with the dummy structure 120 and the first and second spacers 130 and 135 and a second portion 144 (e.g., an etched or recessed portion) exposed by the dummy structure 120 and the first and second spacers 130 and 135.

A top surface of the first portion 142 of the fin-shaped active pattern 140 may be positioned at a level that is higher than a top surface of the device isolation layer 110 and is substantially the same as a top surface of the initial substrate. A top surface of the second portion 144 may be lower than the top surface of the device isolation layer 110.

In certain embodiments, impurities may be injected into the fin-shaped active patterns 140 through a side surface of the first portion 142 of the fin-shaped active patterns 140 and the top surface of the second portion 144, and thus, doped regions may be formed in the fin-shaped active patterns 140. The impurity injecting process may be performed on the substrate or, before the formation of the dummy structure 120, on the initial fin-shaped active patterns 102.

Figure 8A:
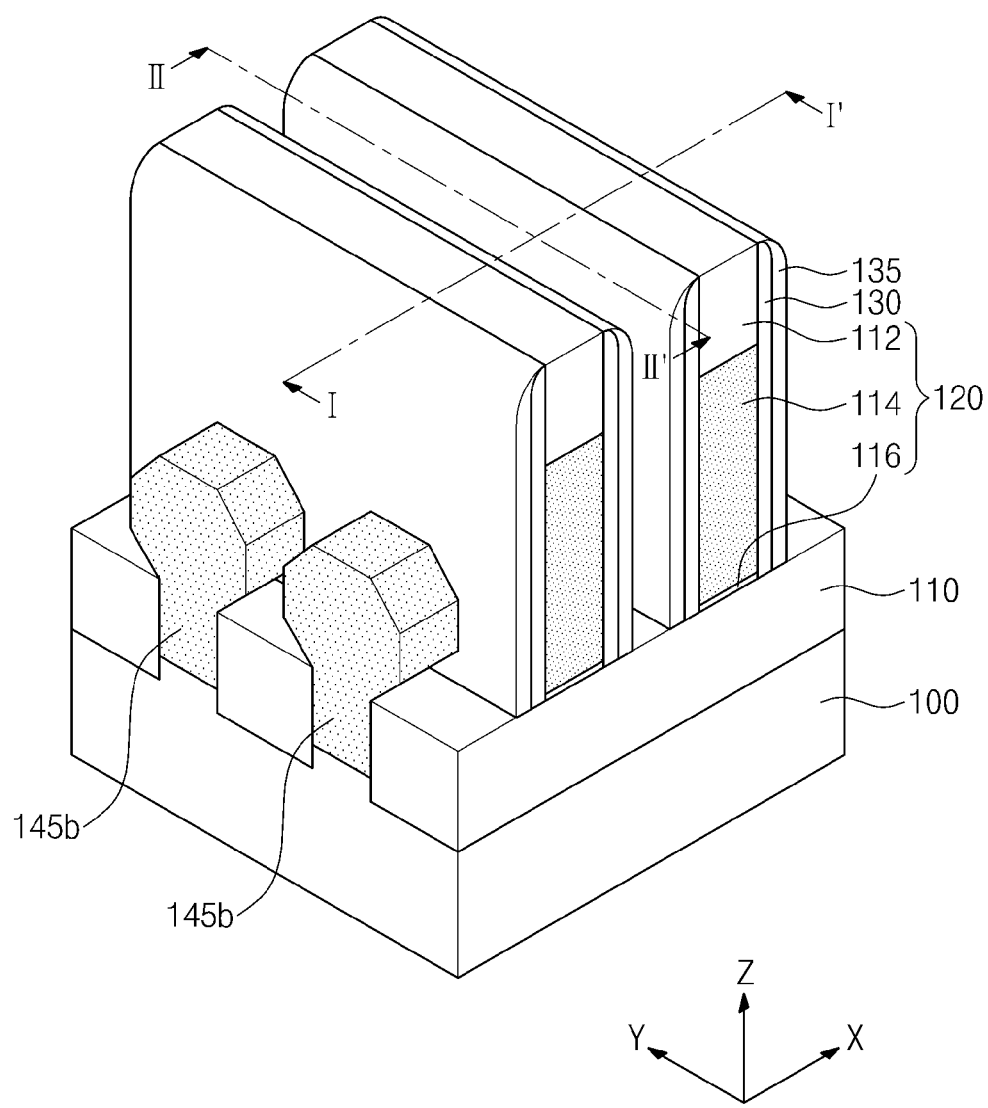
Figure 8B:
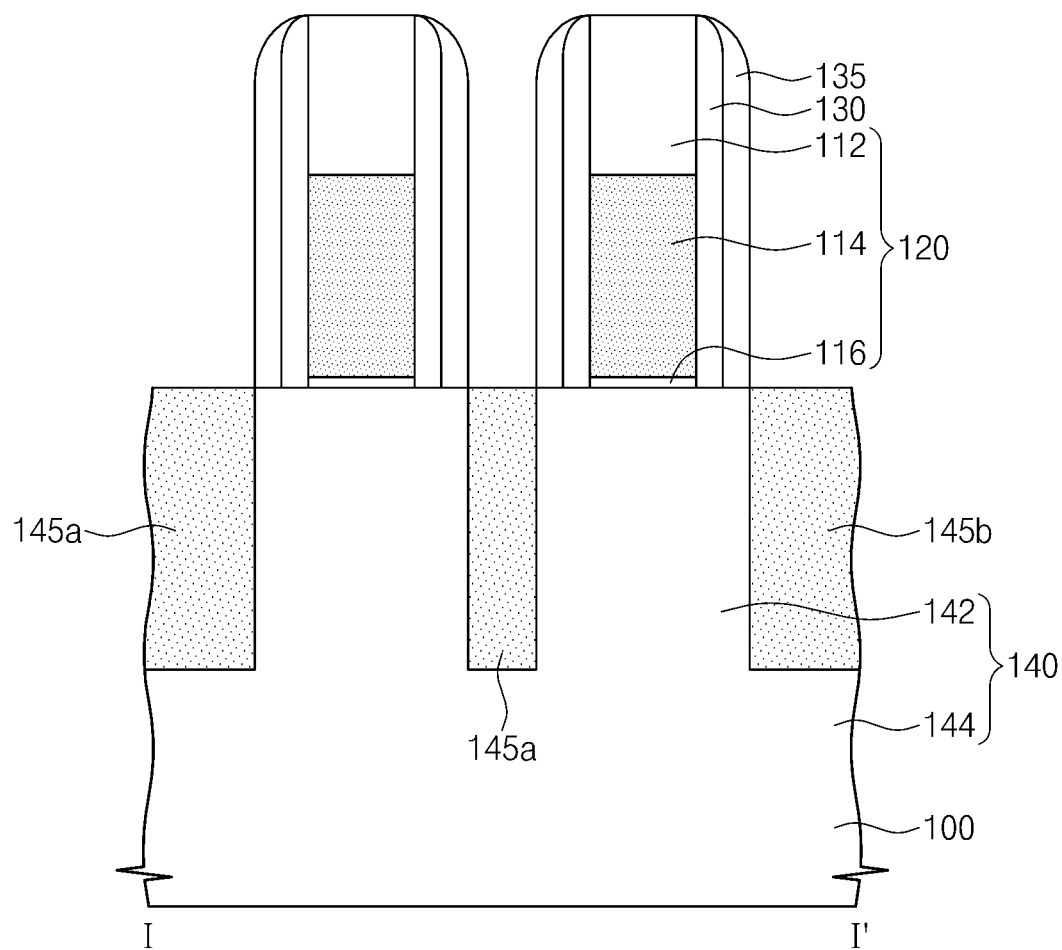
Figure 8C:
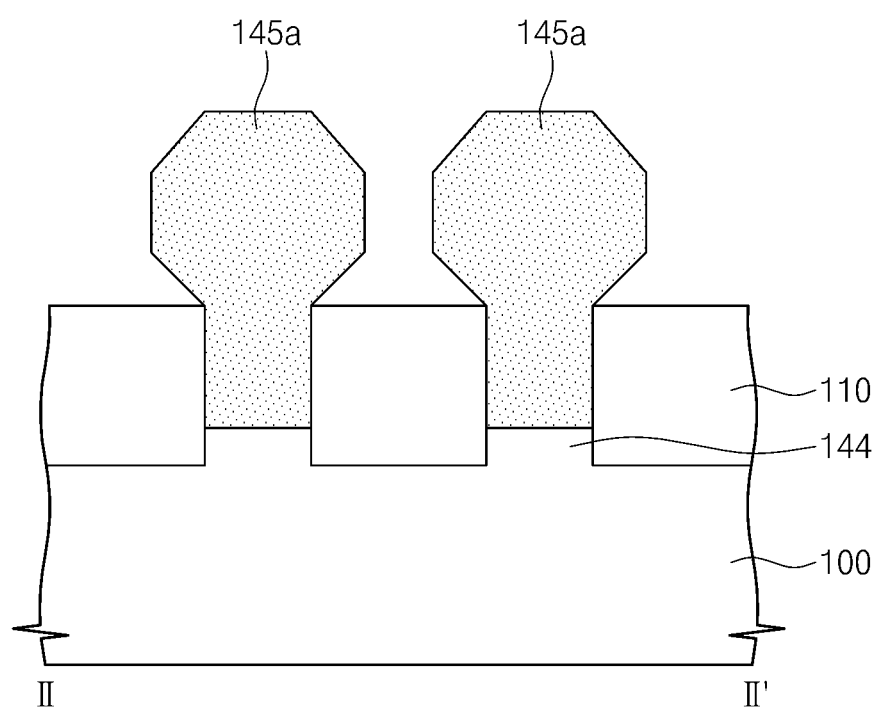

Referring to FIGS. 8A through 8C, first and second impurity regions 145a and 145b may be formed on the second portion 144 of the fin-shaped active patterns 140.

For example, a selective epitaxial growth process may be performed on the second portion 144 of the fin-shaped active pattern 140 to form the first and second impurity regions 145a and 145b. In example embodiments, the first and second impurity regions 145a and 145b may be formed to contain substantially the same impurities as those doped into the fin-shaped active pattern 140. Doping may be performed in-situ while epitaxially growing the first and second impurity regions 145a and 145b or may be performed by ion implantation, e.g.

Figure 9A:
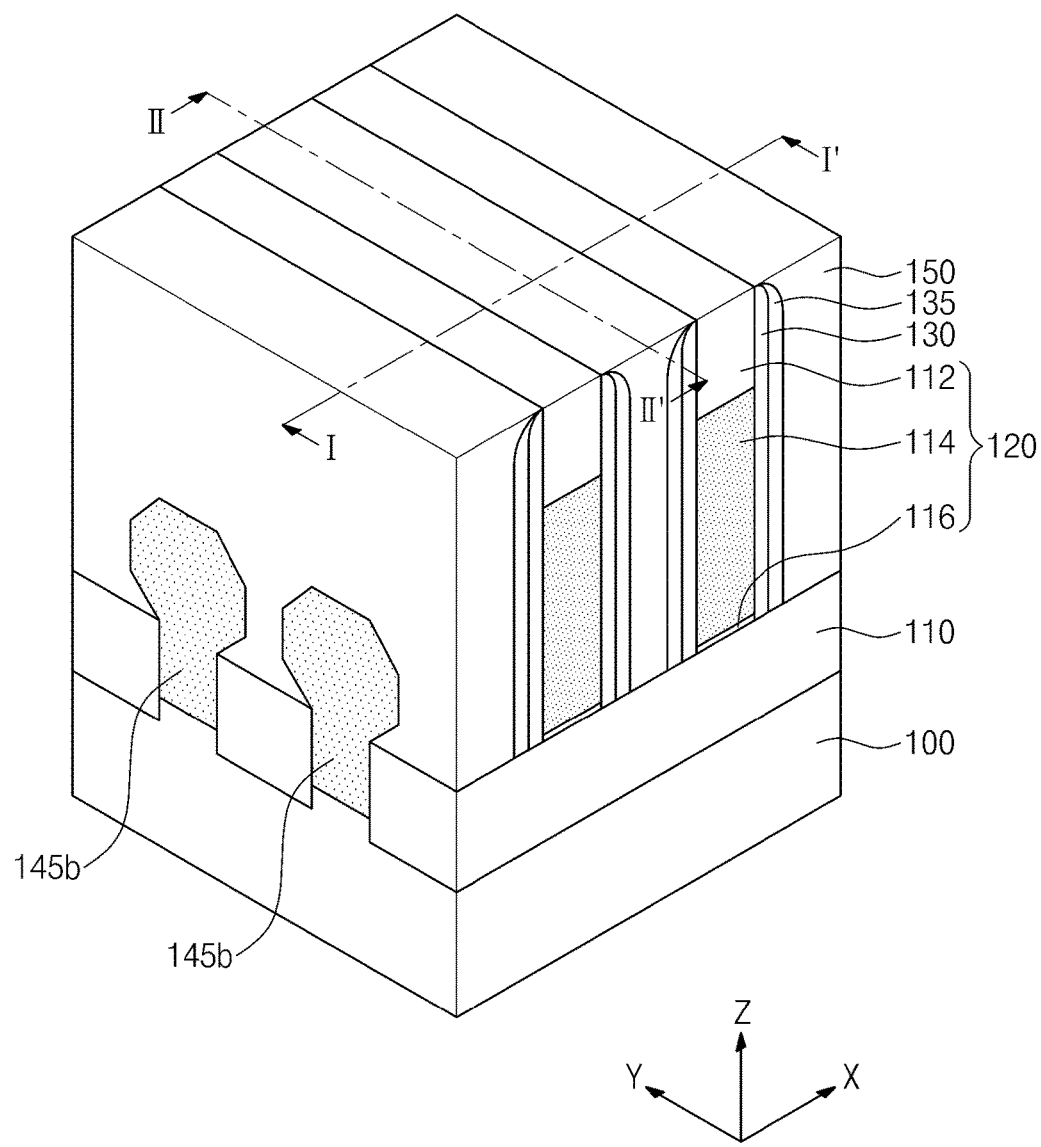
Figure 9B:
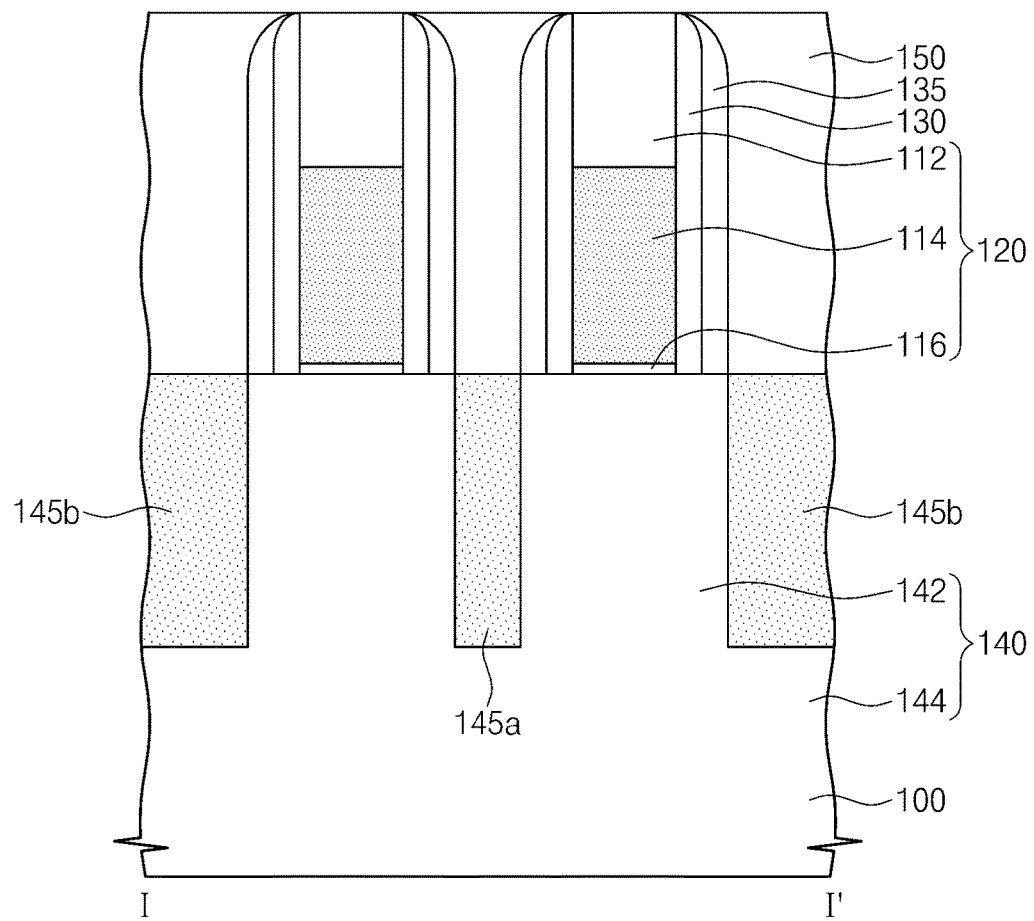
Figure 9C:
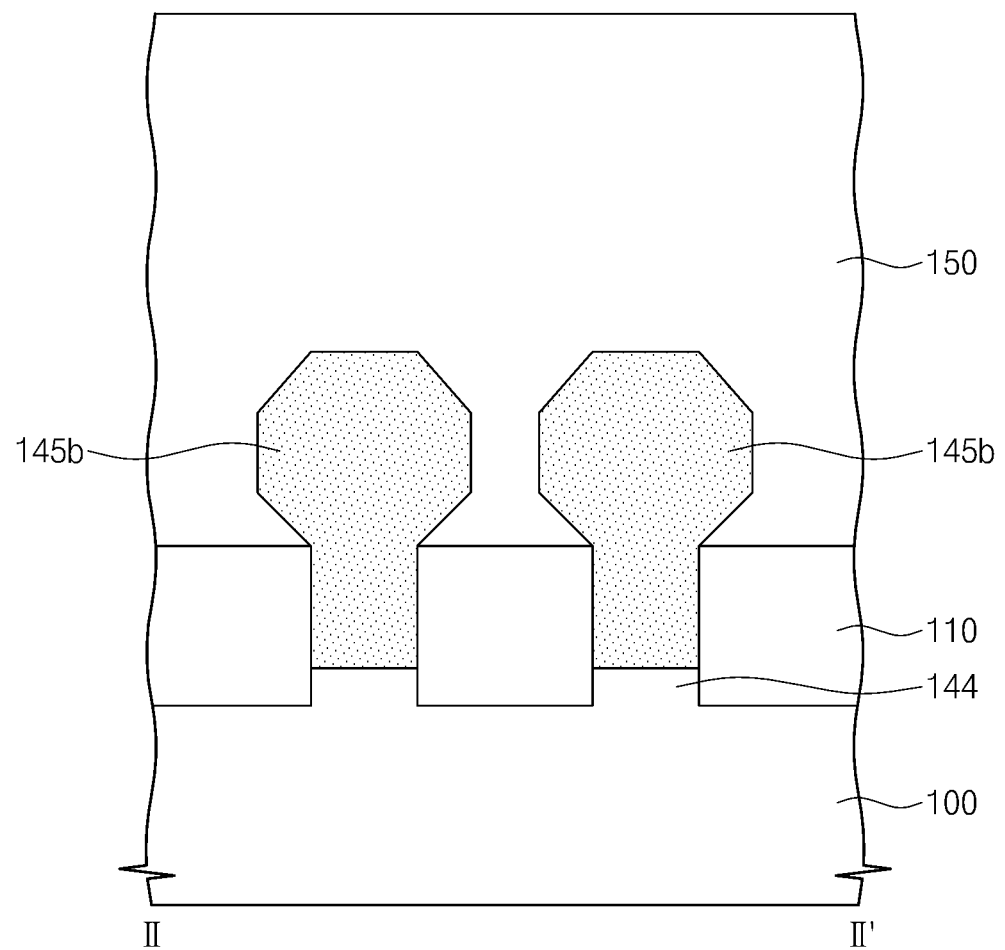

Referring to FIGS. 9A through 9C, a first interlayer insulating layer 150 may be formed to cover the structure shown in FIGS. 8A-8C, including covering the first and second impurity regions 145a and 145b.

For example, the formation of the first interlayer insulating layer 150 may include forming an insulating layer to cover the dummy structure 120, the first and second spacers 130 and 135, the first and second impurity regions 145a and 145b, and then polishing (e.g., CMP) the first interlayer insulating layer 150 to expose the top surface of the second mask 112. The polishing process may be performed using a chemical-mechanical polishing process. An etch back process may alternatively be used rather than a chemical-mechanical polishing process.

The first interlayer insulating layer 150 may include a material having an etch selectivity with respect to the materials constituting the dummy structure 120. For example, the first interlayer insulating layer 150 may include silicon oxide.

Figure 10A:
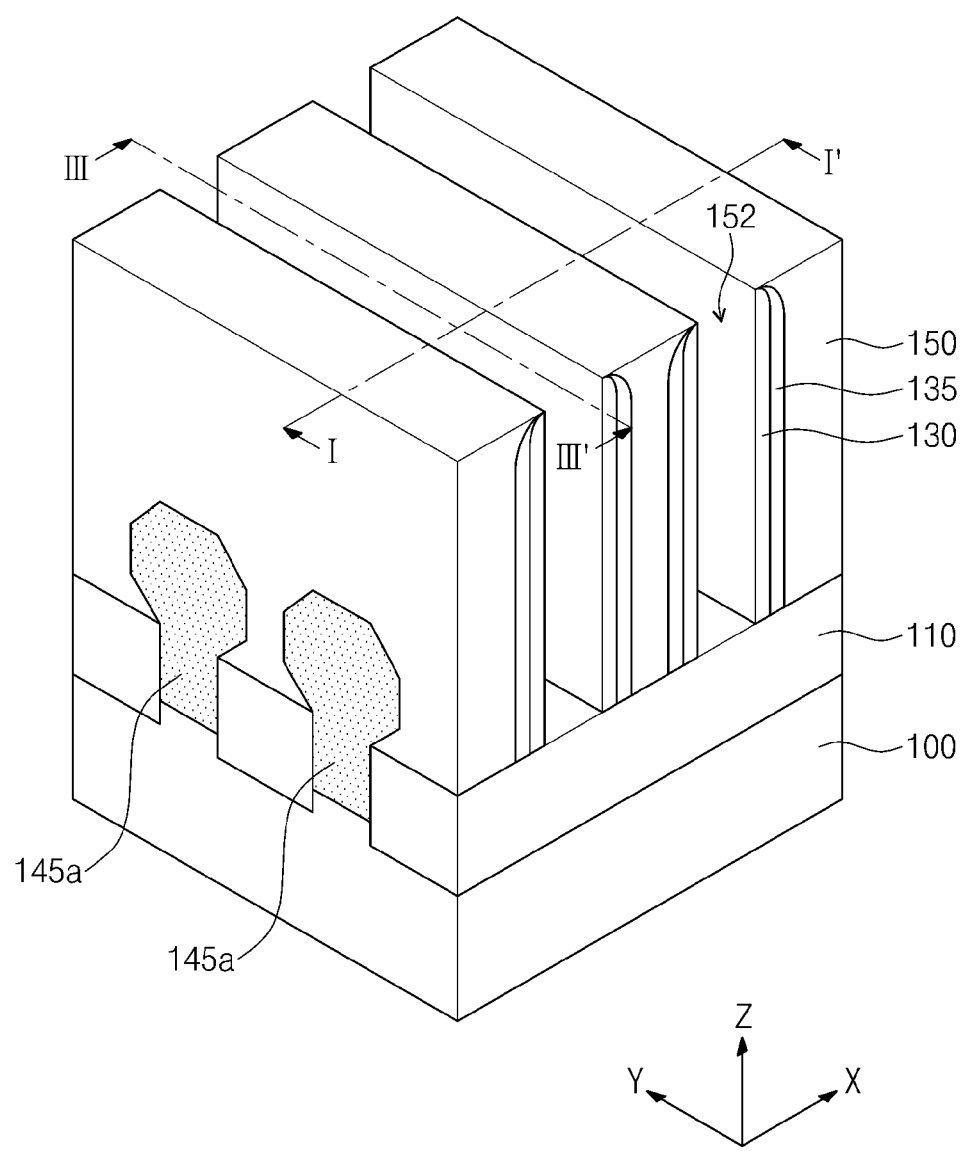
Figure 10B:
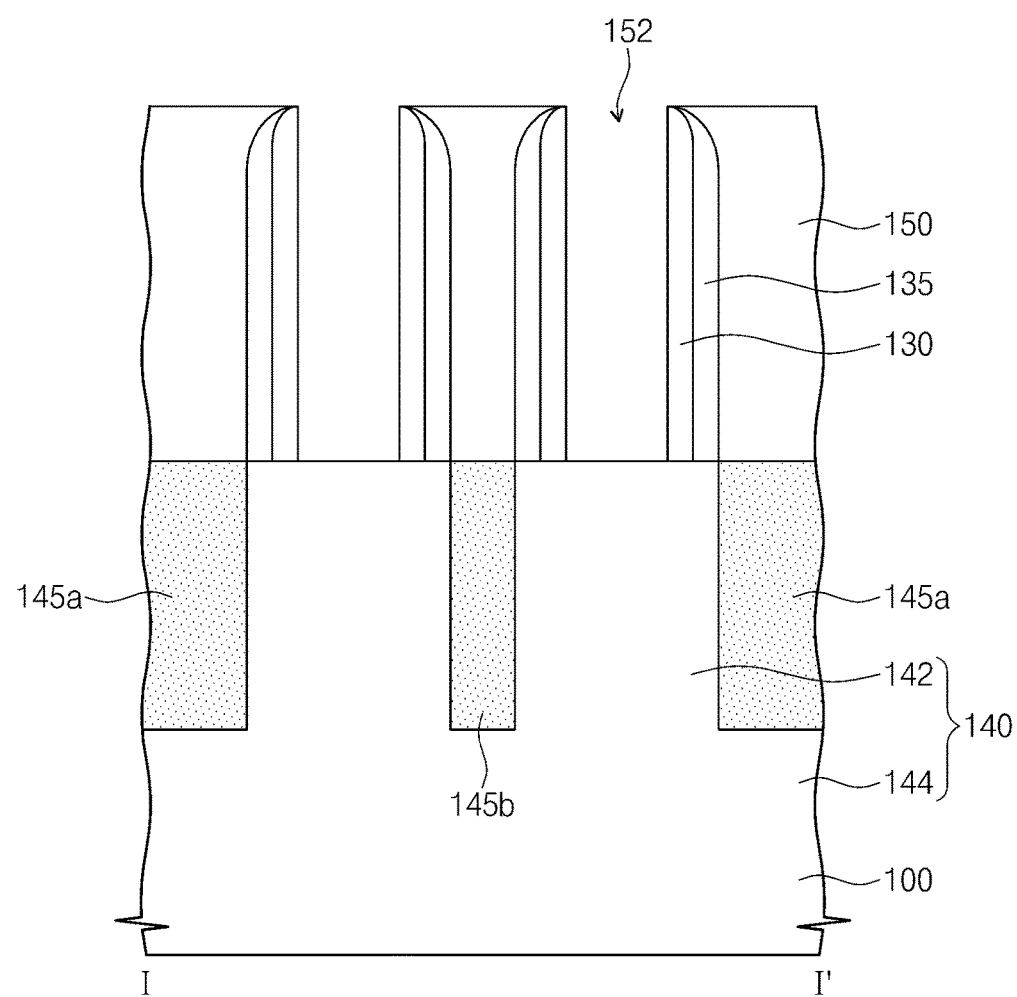
Figure 10C:
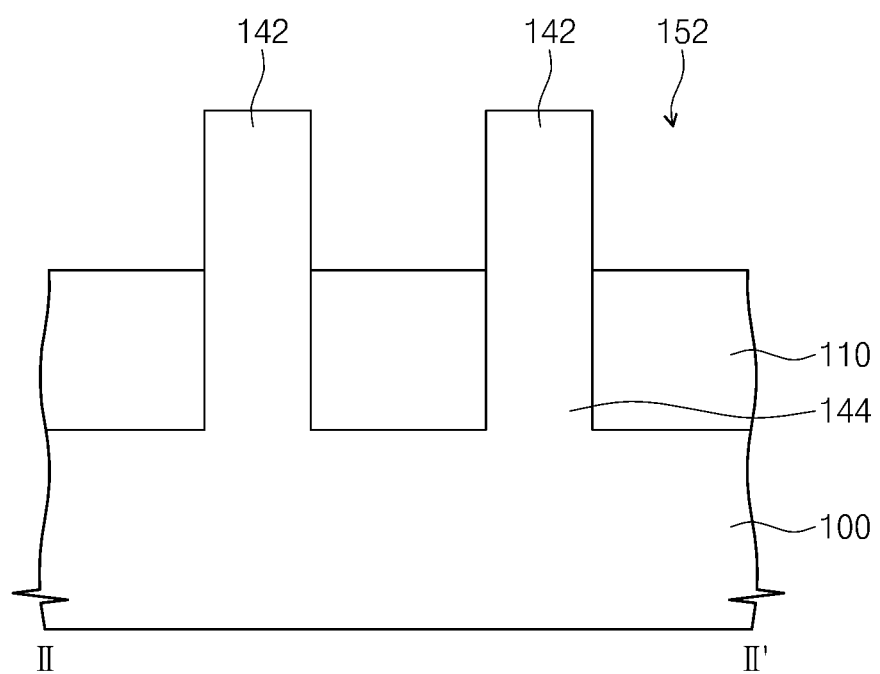

Referring to FIGS. 10A through 10C, the dummy structure 120 may be removed from the substrate 100 to form openings 152 exposing the first portions 142 of the fin-shaped active patterns 140. The openings 152 may be delimited by the first spacers 130. The openings 152 may be formed as a trench extending in the Y-axis direction.

Figure 11A:
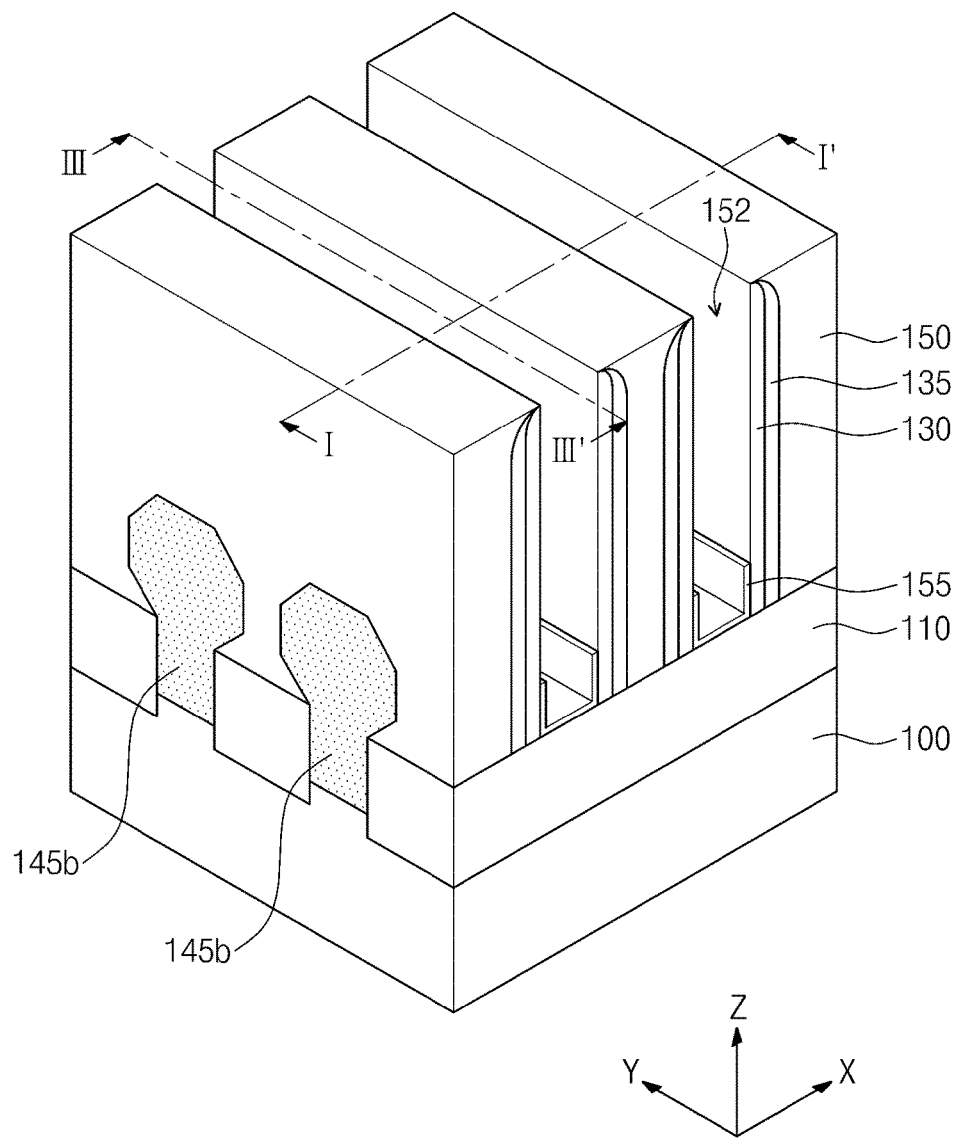
Figure 11B:
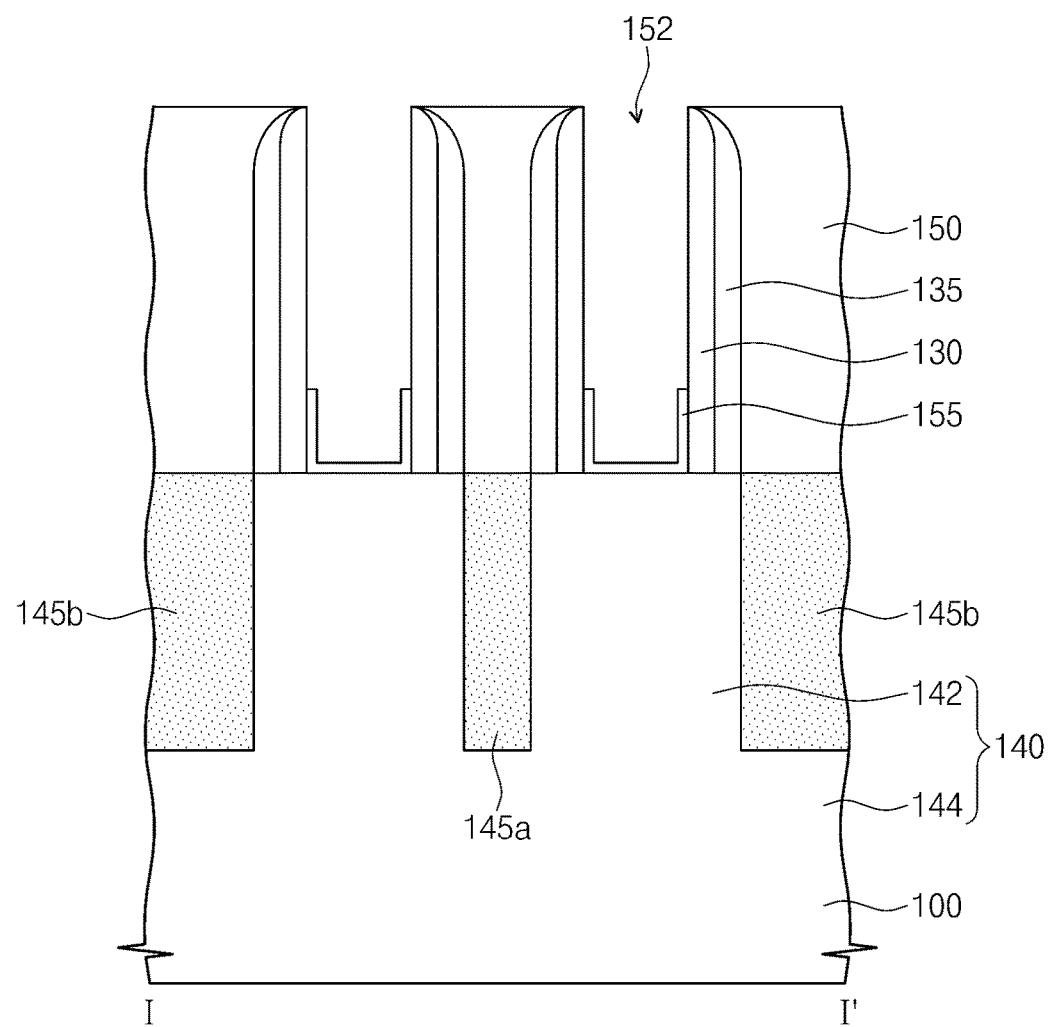
Figure 11C:
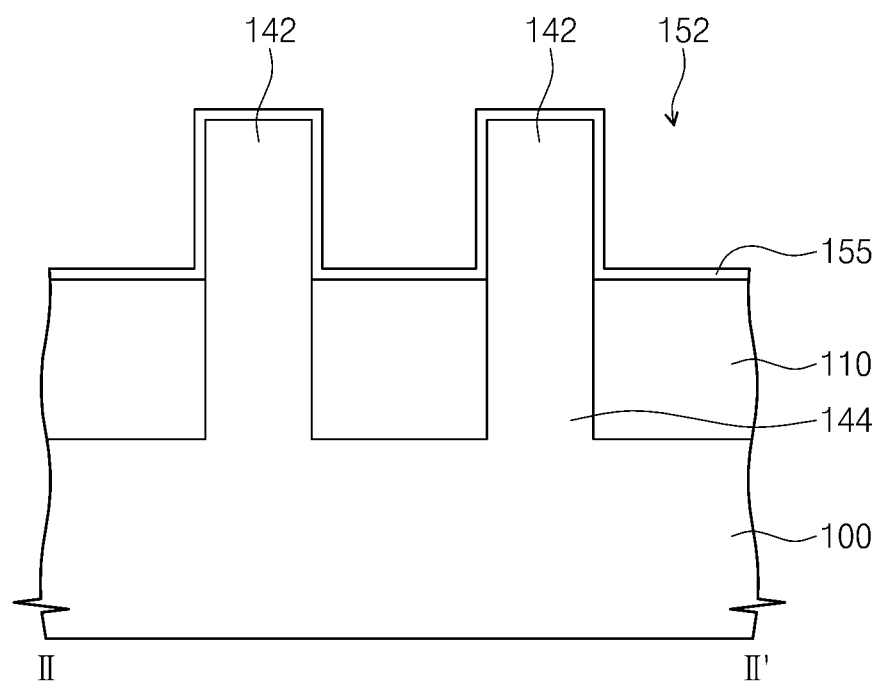

Referring to FIGS. 11A through 11C, a gate insulating pattern 155 may be formed in the opening 152.

In example embodiments, the gate insulating pattern 155 may include at least one of metal oxides. For example, the gate insulating pattern 155 may be formed of or include at least one of hafnium oxide ($HfO_2$), hafnium silicon oxide (HfSiO), hafnium silicon oxynitride (HfSiON), hafniumoxynitride (HfON), hafnium aluminum oxide (HfAlO, hafnium lanthanum oxide (HfLaO), zirconium oxide ($ZrO_2$), tantalum oxide ($TaO_2$), zirconium silicon oxide (ZrSiO), or lanthanum oxide ($La_2O_3$).

The gate insulating pattern 155 may be formed to cover a bottom surface of the opening 152 and a portion of a lower portion of inner sidewalls of the first spacer 130. For example, the gate insulating pattern 155 may be formed to have a 'U'-shaped cross section. The gate insulating pattern 155 may extend in the Y-axis direction.

Although not shown in detail, the formation of the gate insulating pattern 155 may include conformally forming a gate insulating layer (not shown) on the fin-shaped active patterns 140, the first spacer 130, and the first interlayer insulating layer 150, and forming a sacrificial layer (not shown) in the opening 152. The gate insulating layer may be formed not to fill the opening 152, and the sacrificial layer may be formed to fill the opening 152 provided with the gate insulating layer. Thereafter, the sacrificial layer and the gate insulating layer may be polished to expose the top surface of the first interlayer insulating layer 150, and then, may be further etched to form the gate insulating pattern 155. After the formation of the gate insulating pattern 155, the sacrificial layer may be removed.

Figure 12A:
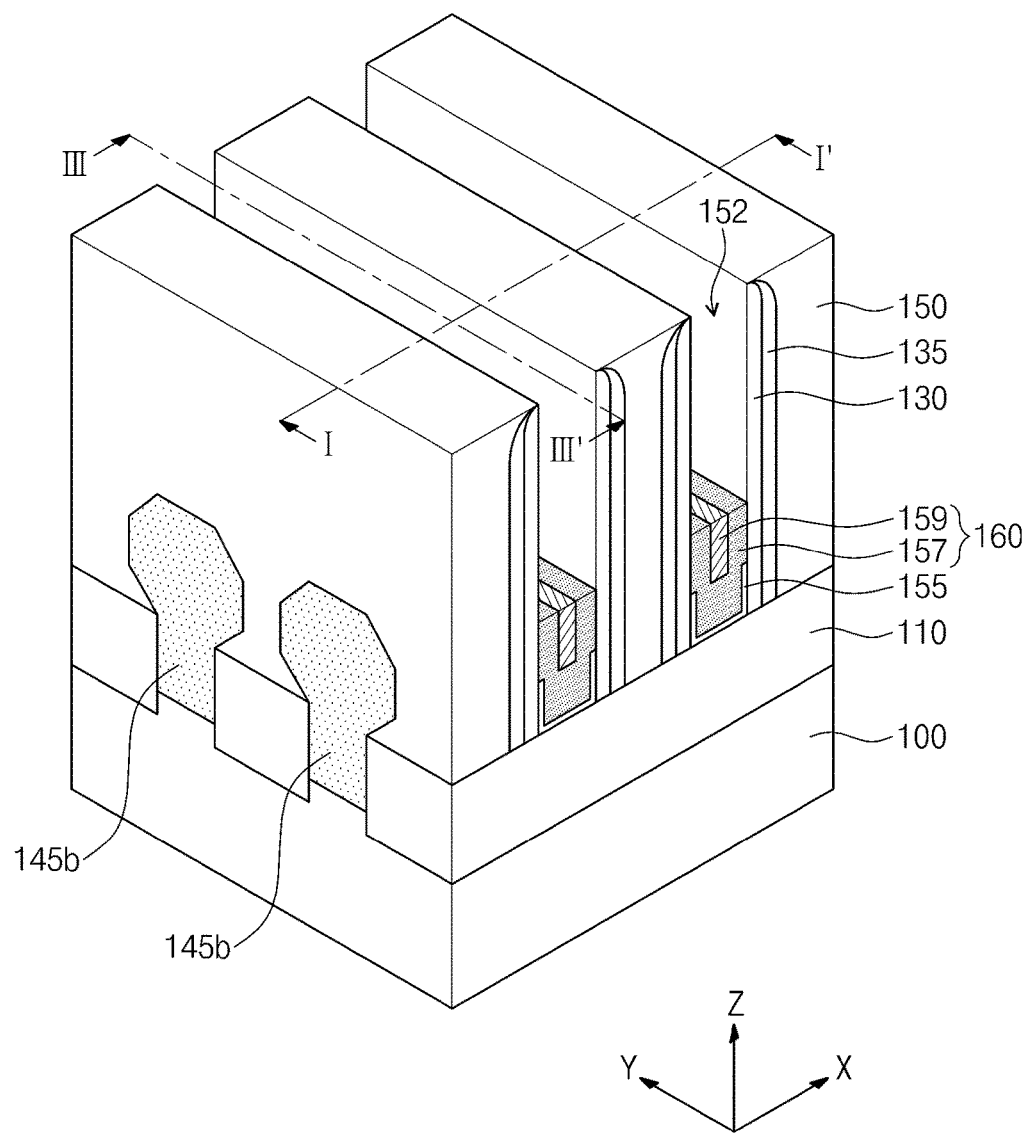
Figure 12B:
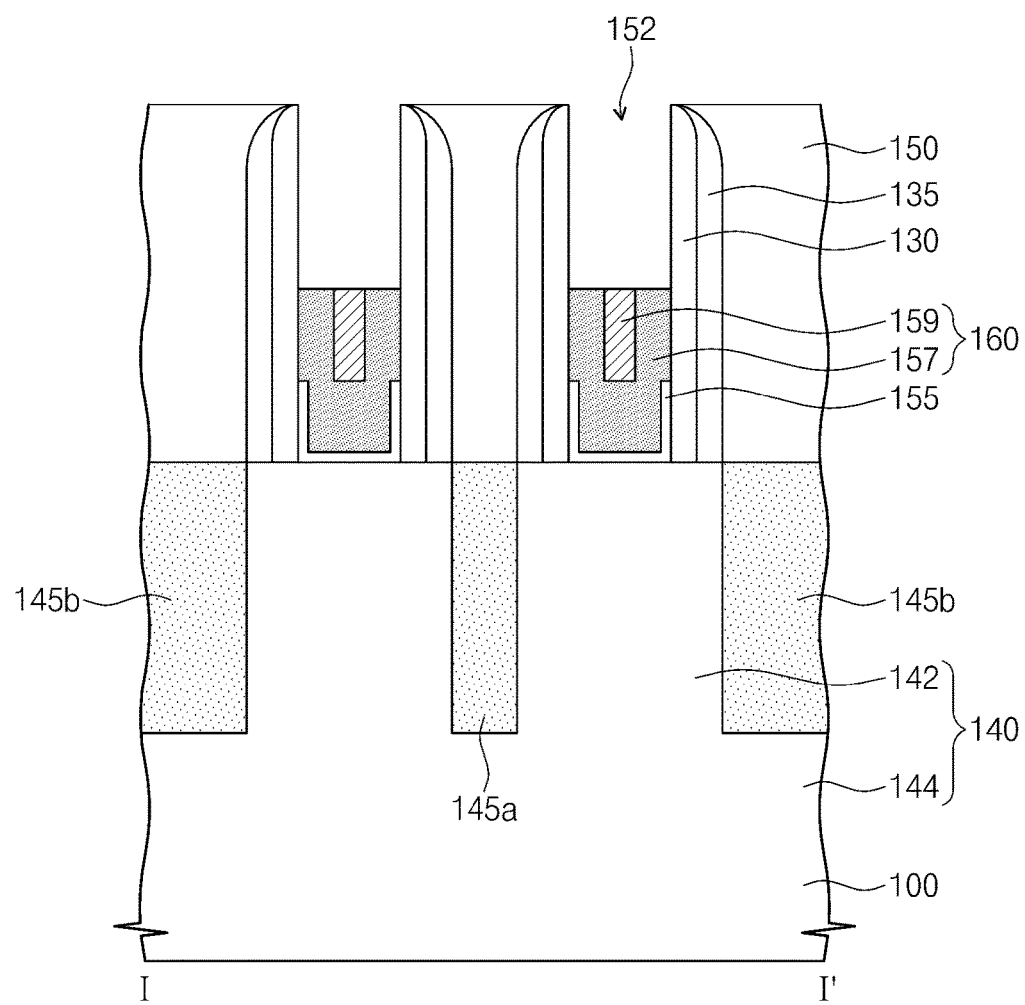
Figure 12C:
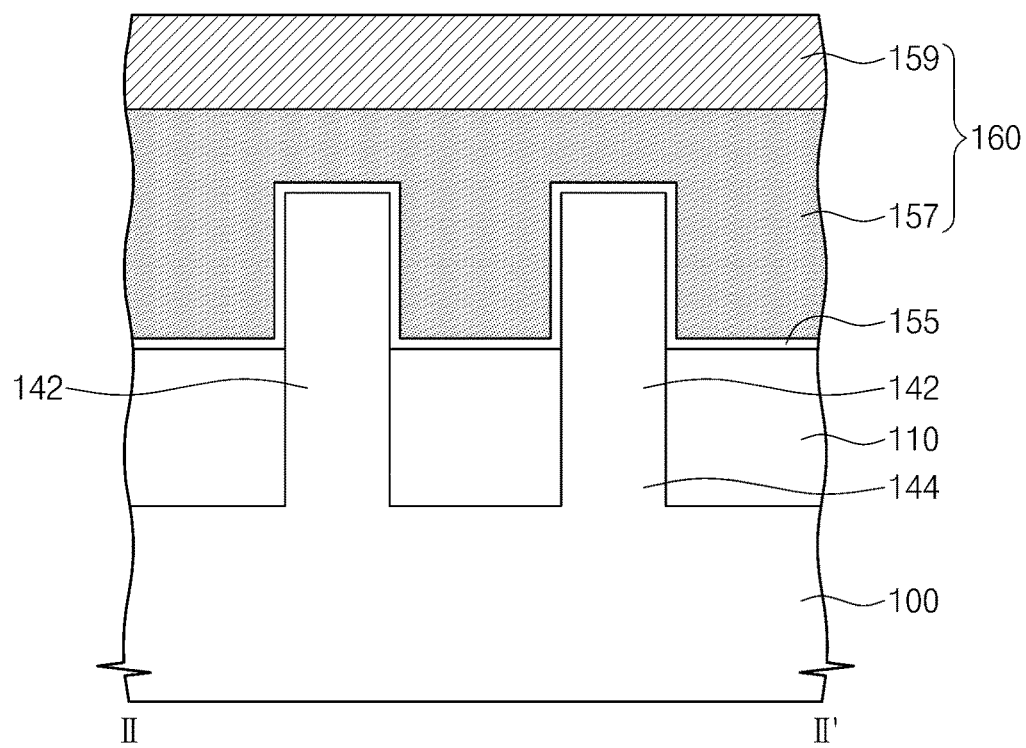

Referring to FIGS. 12A through 12C, the gate electrode 160 may be formed on the gate insulating pattern 155.

Although not shown in detail, the formation of the gate electrode 160 may include sequentially forming first and second conductive layers (not shown) and then planarizing (e.g, polishing with a CMP process) the first and second conductive layers to expose the top surface of interlayer insulating layer 150. The first and second conductive layers in opening 152 may be further etched so that they are etched back to a reduced height within opening 152. The first conductive layer may be formed to conformally cover the gate insulating pattern 155, a lower portion of the first spacer 130, and the first interlayer insulating layer 150. For example, the first conductive layer may be formed not to fill the whole space of the opening. The second conductive layer may be formed to completely fill the opening 152 provided with the first conductive layer. The polishing of the first and second conductive layers may be performed to expose the first interlayer insulating layer 150, and the etching of the first and second conductive layers may be performed to form the gate electrode 160 having a top surface lower than a top surface of the first interlayer insulating layer 150. The first conductive layer may be formed of or include at least one of metals (e.g., titanium (Ti), tantalum (Ta), aluminum (Al), hafnium (Hf), tungsten (W), and molybdenum (Mo)), nitrides thereof, carbides thereof or silicide thereof. The second conductive layer may be formed of or include at least one of metals (e.g., titanium (Ti), tantalum (Ta), aluminum (Al), hafnium (Hf), tungsten (W), and molybdenum (Mo)).

The gate electrode 160 may extend parallel to the Y-axis direction. The gate insulating pattern 155 and the gate electrode 160 may be formed to fill at least the lower portion of the opening 152.

The gate electrode 160 may include a first gate pattern 157 and a second gate pattern 159. The first gate pattern 157 may be formed to have a 'U'-shaped section, and the second gate pattern 159 may be formed to fill an upper central portion of the first gate pattern 157. The first and second gate patterns 157 and 159 may be formed to have top surfaces that are substantially coplanar with each other.

Figure 13A:
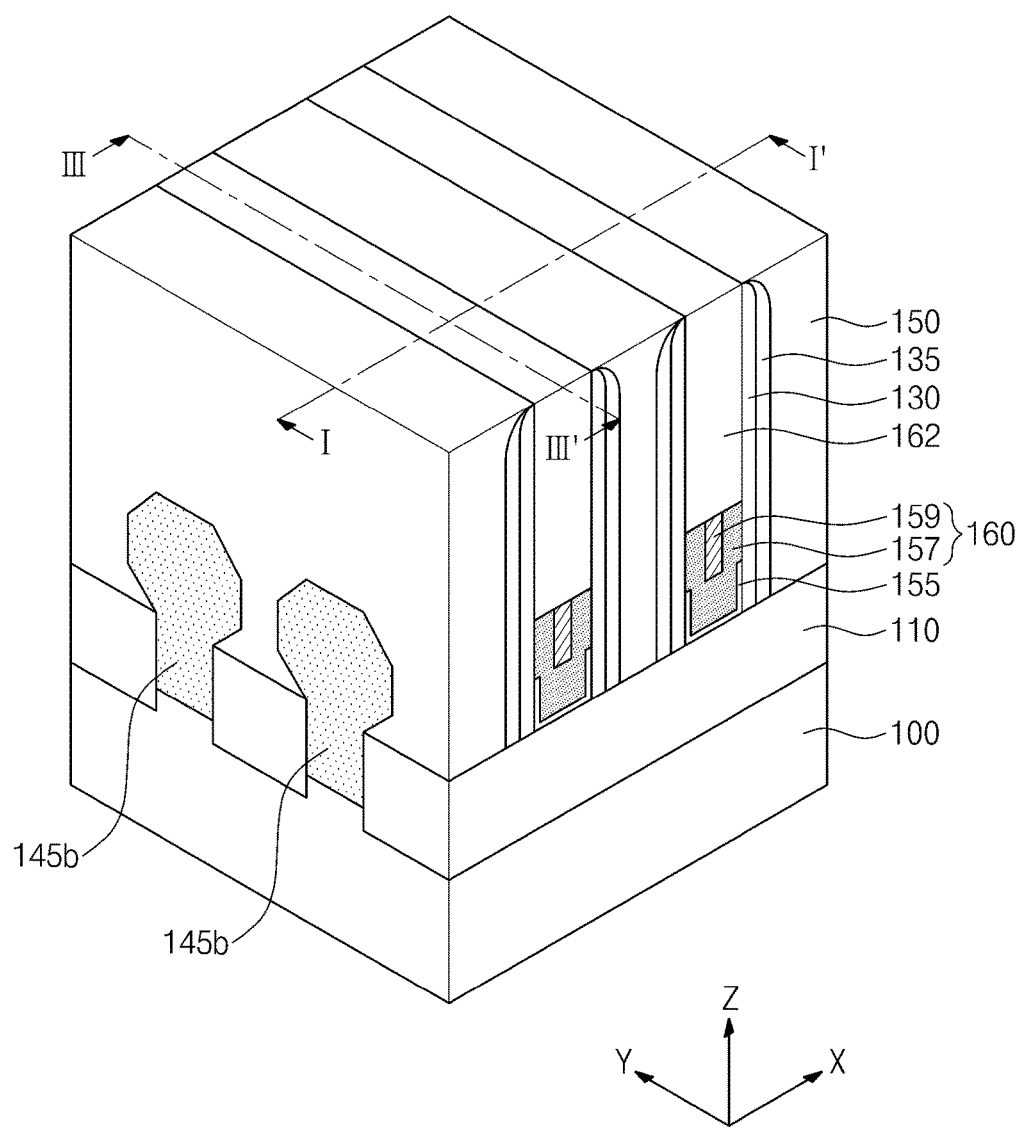
Figure 13B:
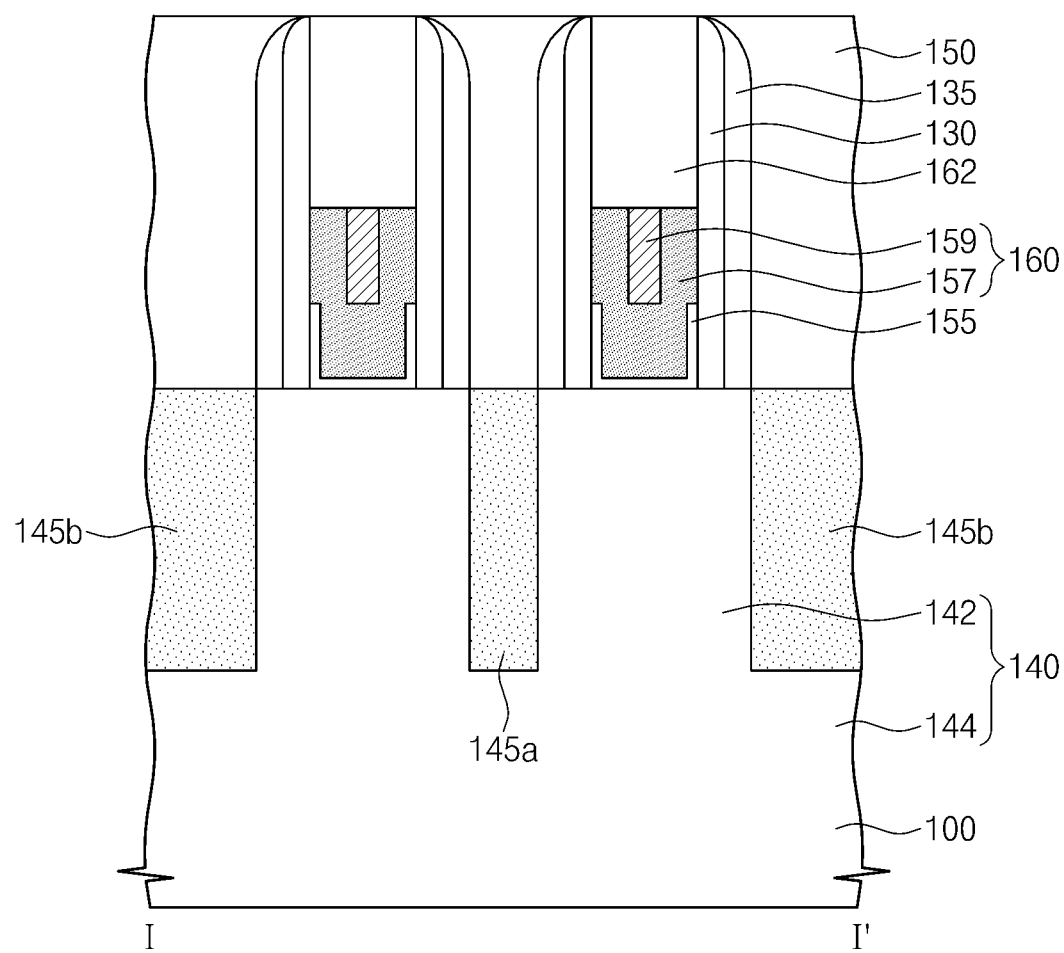
Figure 13C:
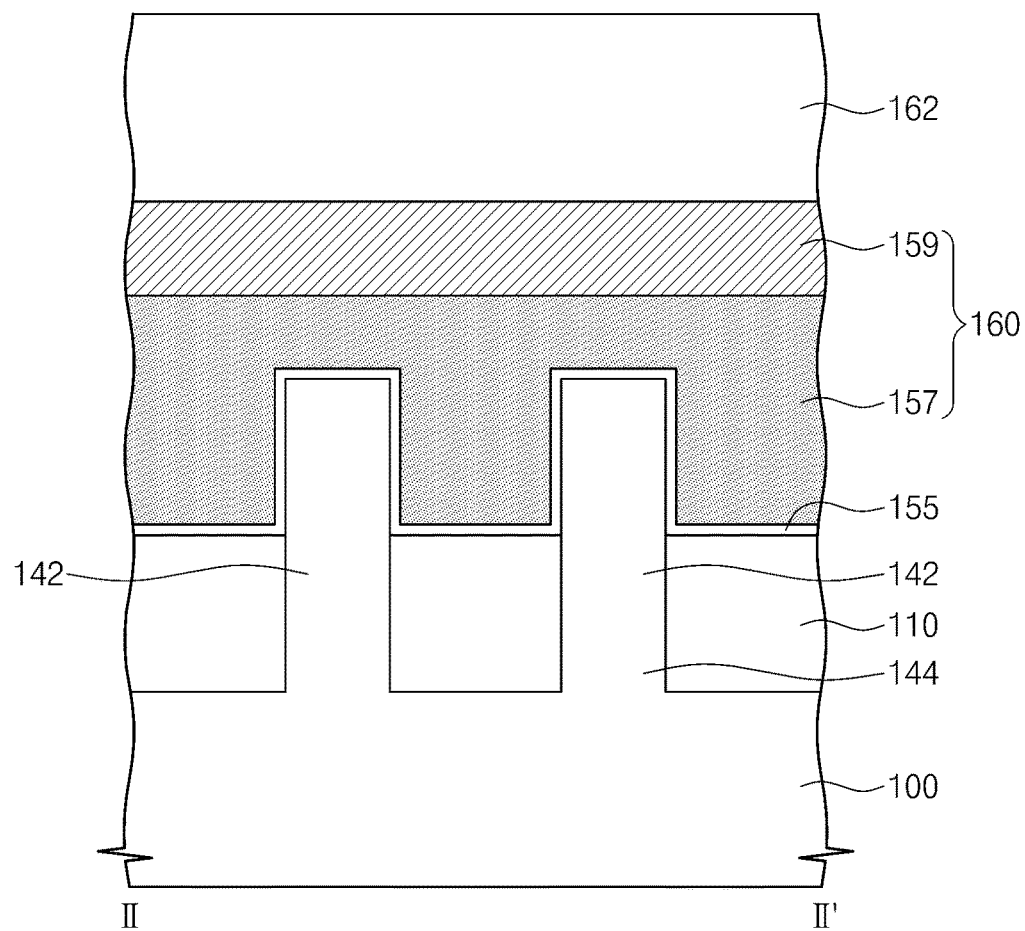

Referring to FIGS. 13A through 13C, a capping pattern 162 may be formed on the gate electrode 160 to cover an upper portion of the opening 152. The capping pattern 162 may extend parallel to the Y-axis direction. Capping pattern material may be blanket deposited over the structure illustrated in FIGS. 12A-12C and a planarization etch (e.g, CMP) may be performed to remove the capping pattern material outside opening 152 until first interlayer insulating layer 150 is exposed. The planarization etch may also be performed on upper surfaces of the first interlayer insulating layer 150 and first and second spacers 130 and 135. The top surface of the capping pattern 162 may be formed to be substantially coplanar with the top surface the first interlayer insulating layer 150. Further, the first and second spacers 130 and 135 may terminate at a height of the top surfaces of the capping pattern 162 and the first insulating layer 150. The first and second spacers 130 and 135 may have top surfaces that are substantially coplanar with each other.

Figure 14A:
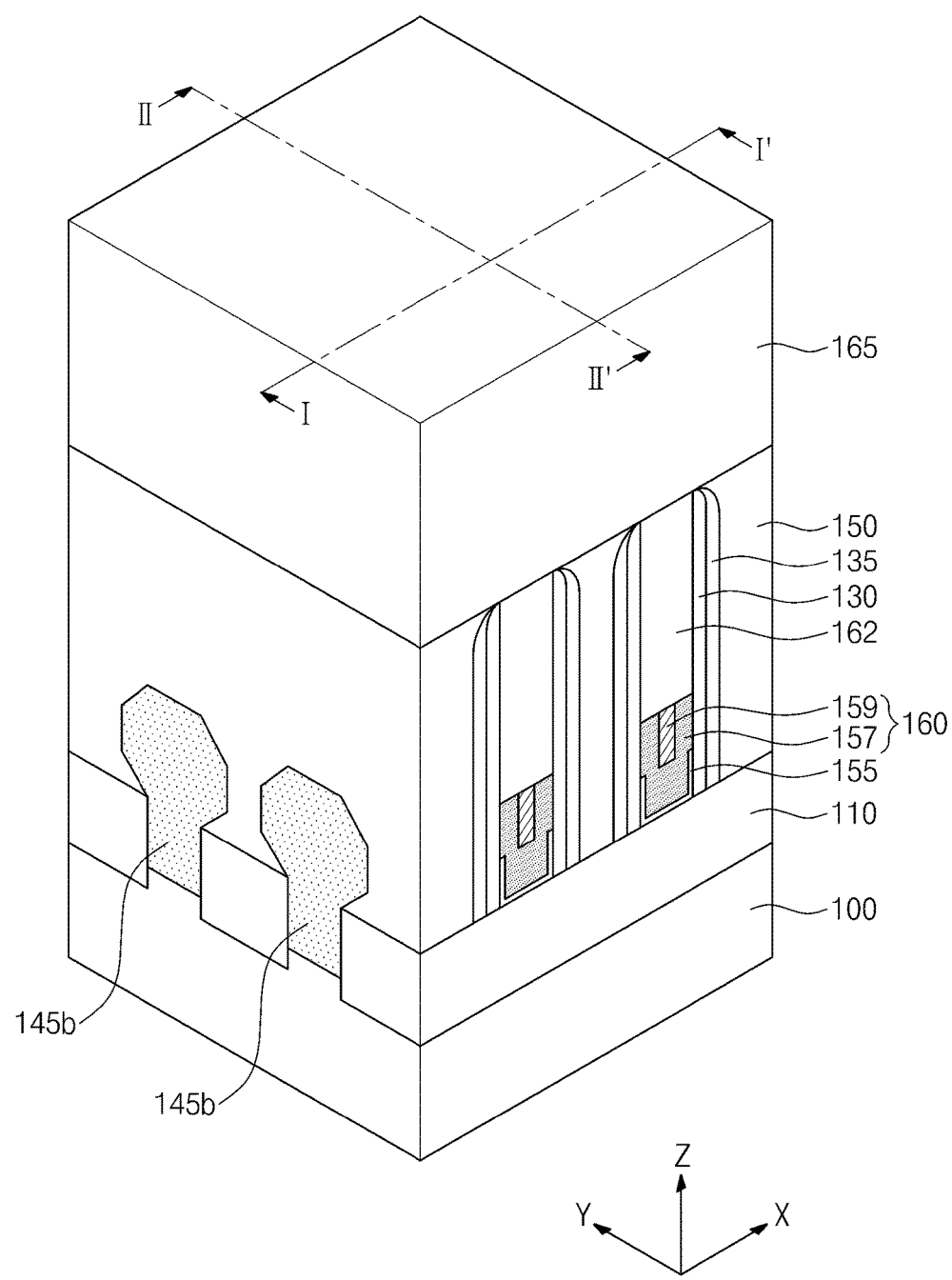
Figure 14B:
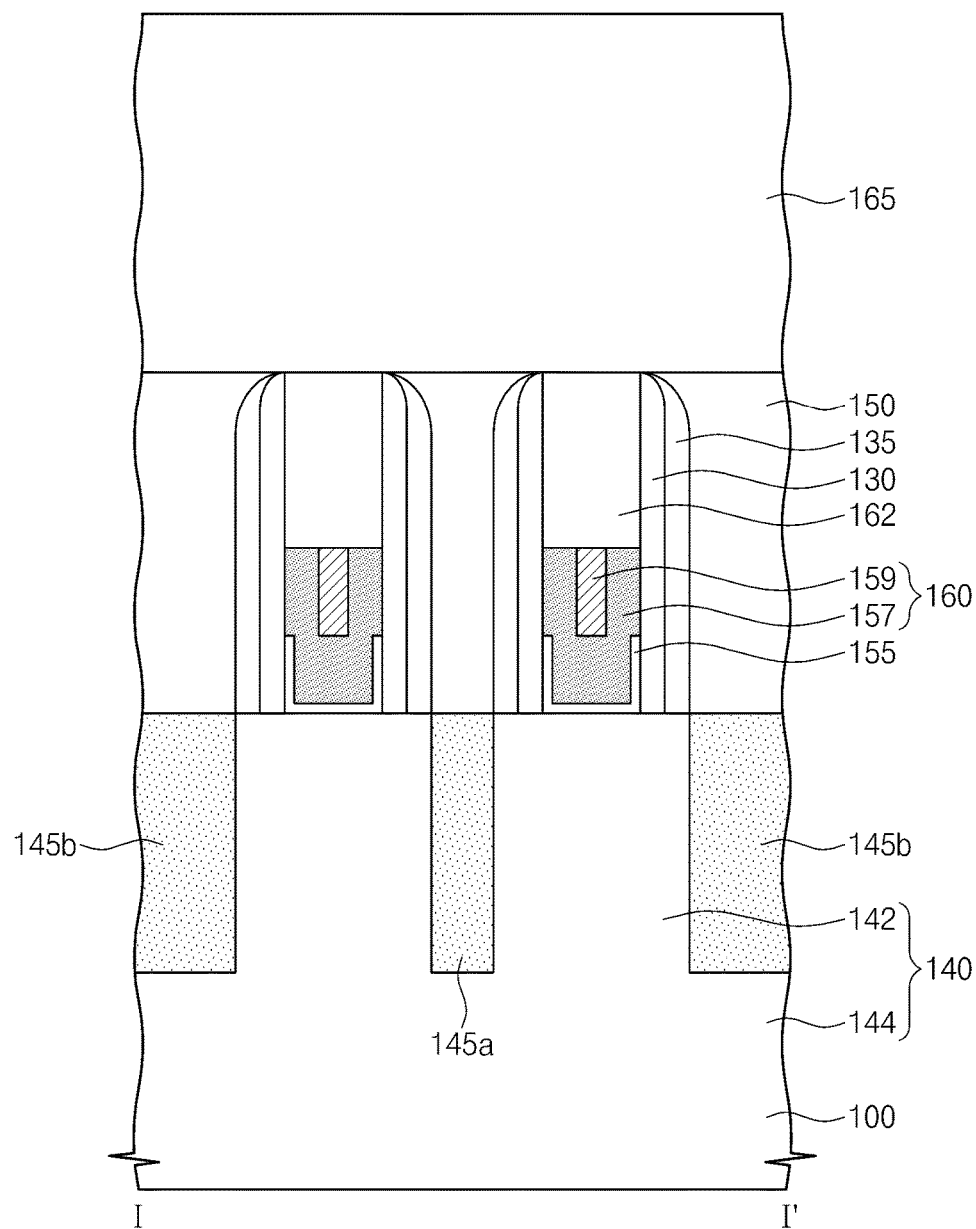
Figure 14C:
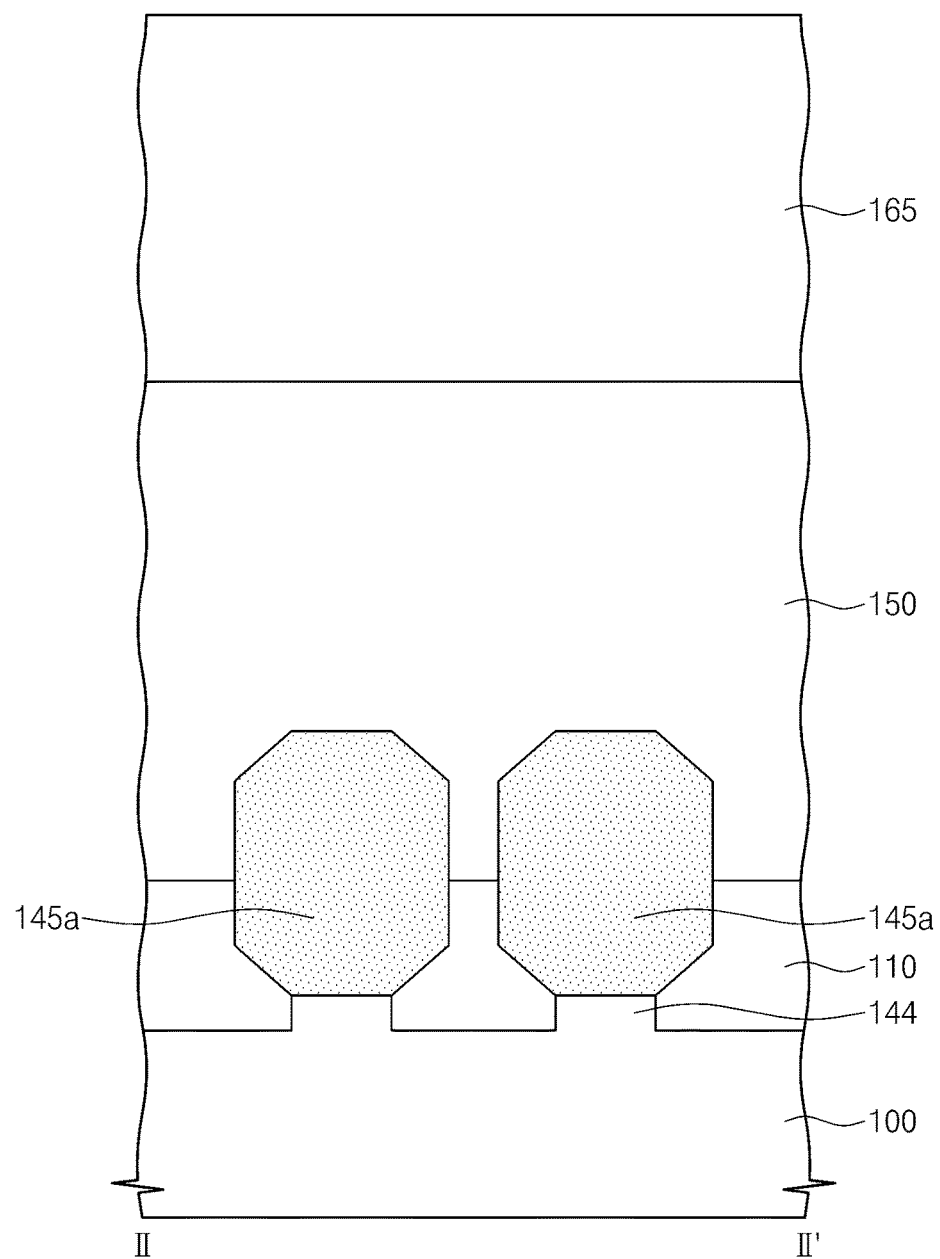

Referring to FIGS. 14A through 14C, a second interlayer insulating layer 165 may be formed on the capping pattern 162 and the first interlayer insulating layer 150. The second interlayer insulating layer 165 may include a material having an etch selectivity with respect to the second spacer 135. The second interlayer insulating layer 165 may be formed to contain substantially the same material as the first interlayer insulating layer 150. For example, the second interlayer insulating layer 165 may comprise silicon oxide.

Figure 15A:
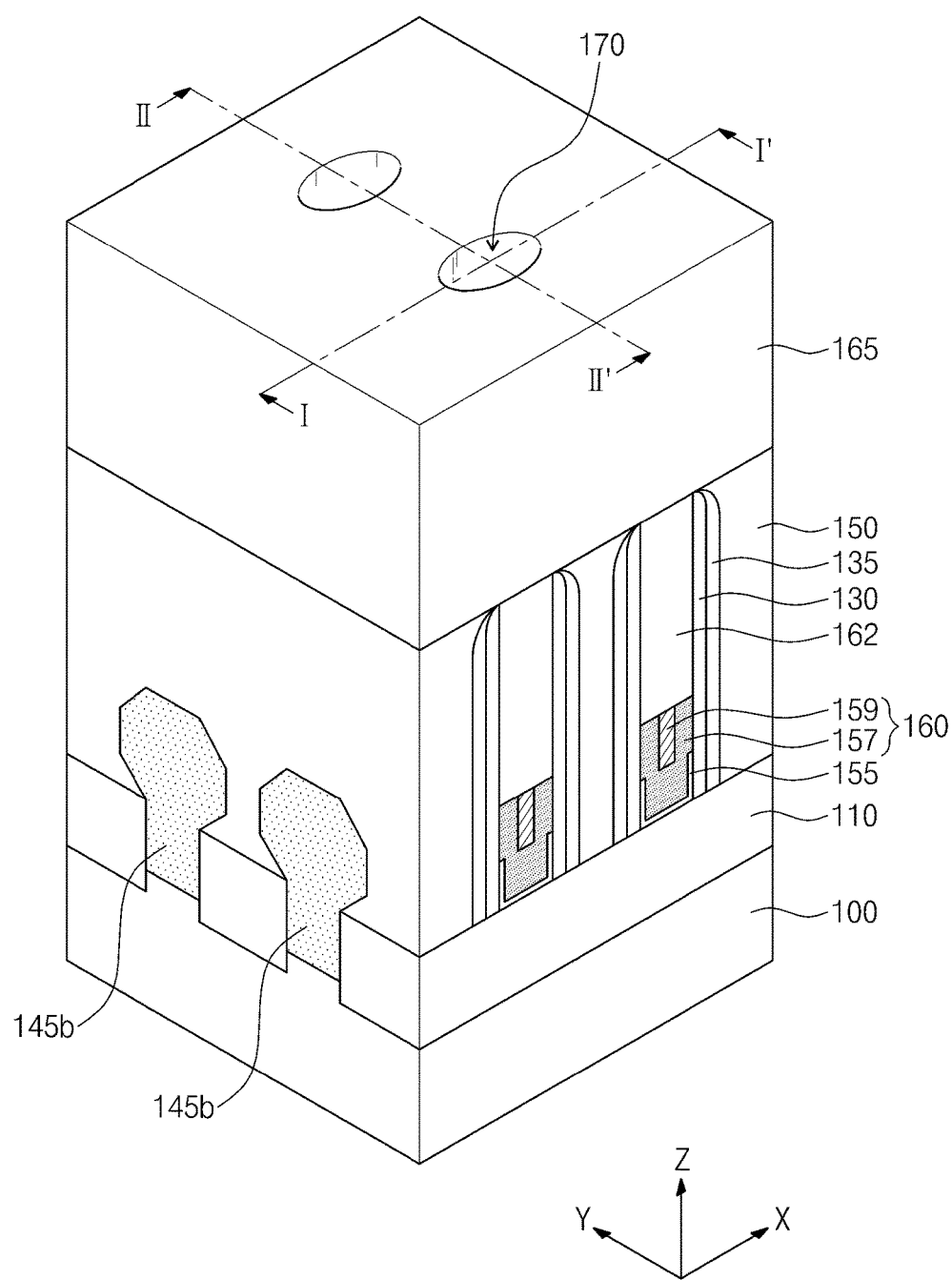
Figure 15B:
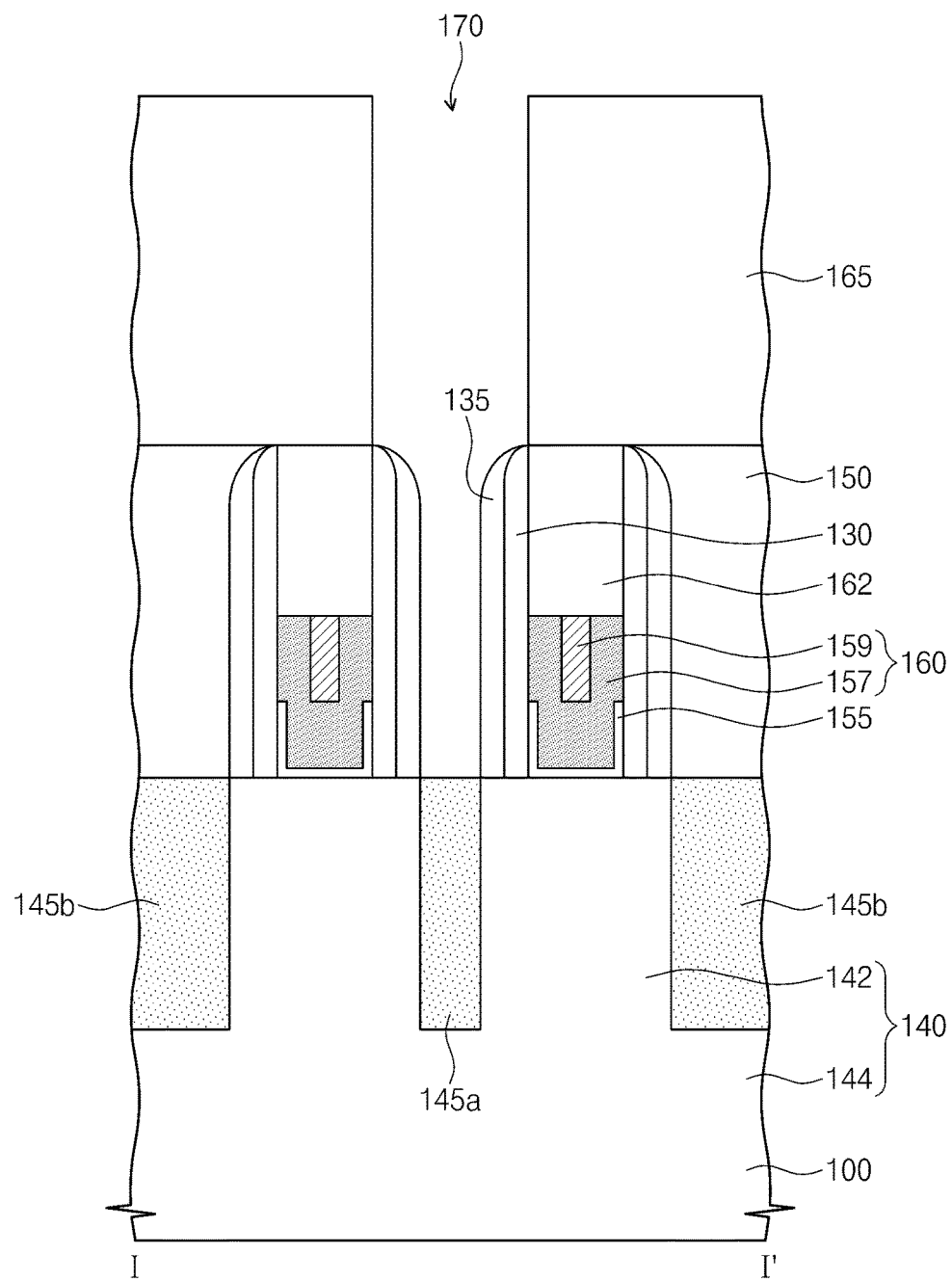
Figure 15C:
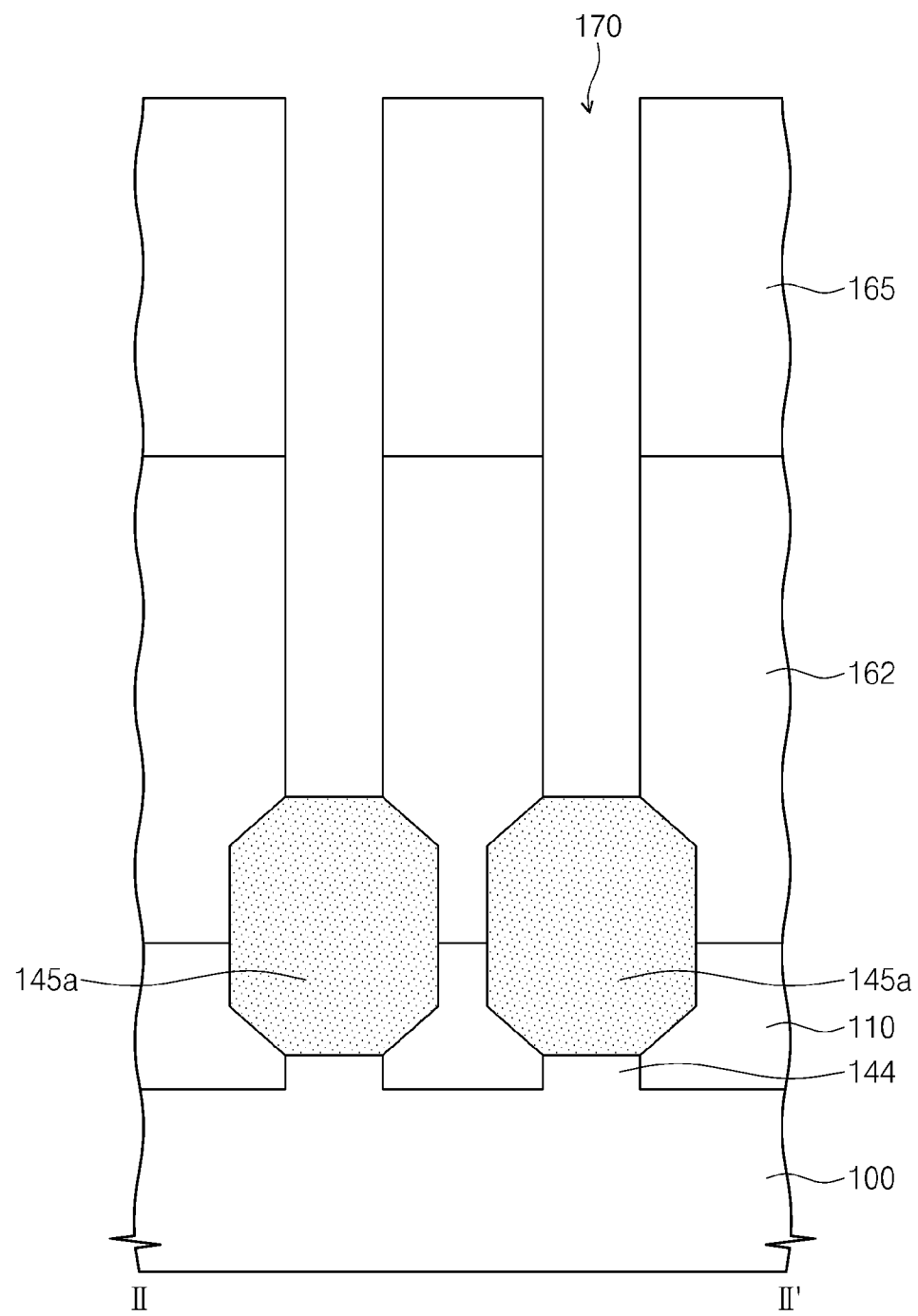

Referring to FIGS. 15A through 15C, the first and second interlayer insulating layers 150 and 165 may be etched to form a contact hole 170 exposing the first impurity region 145a.

The formation of the contact hole 170 may include forming a third mask (not shown) on the second interlayer insulating layer 165, and sequentially etching the second and first interlayer insulating layers 165 and 150 using the third mask as an etch mask. In example embodiments, the first and second spacers 130 and 135 and the capping pattern 162 may be formed to have an etch selectivity with respect to the second and first interlayer insulating layers 165 and 150, and this makes it possible to form the contact hole 170 with respect to the first and second spacers 130 and 135 and the capping pattern 162 in a self-aligned manner.

The contact hole 170 may have a lower portion penetrating the first interlayer insulating layer 150 and exposing a side surface of the second spacer 135.

Figure 16A:
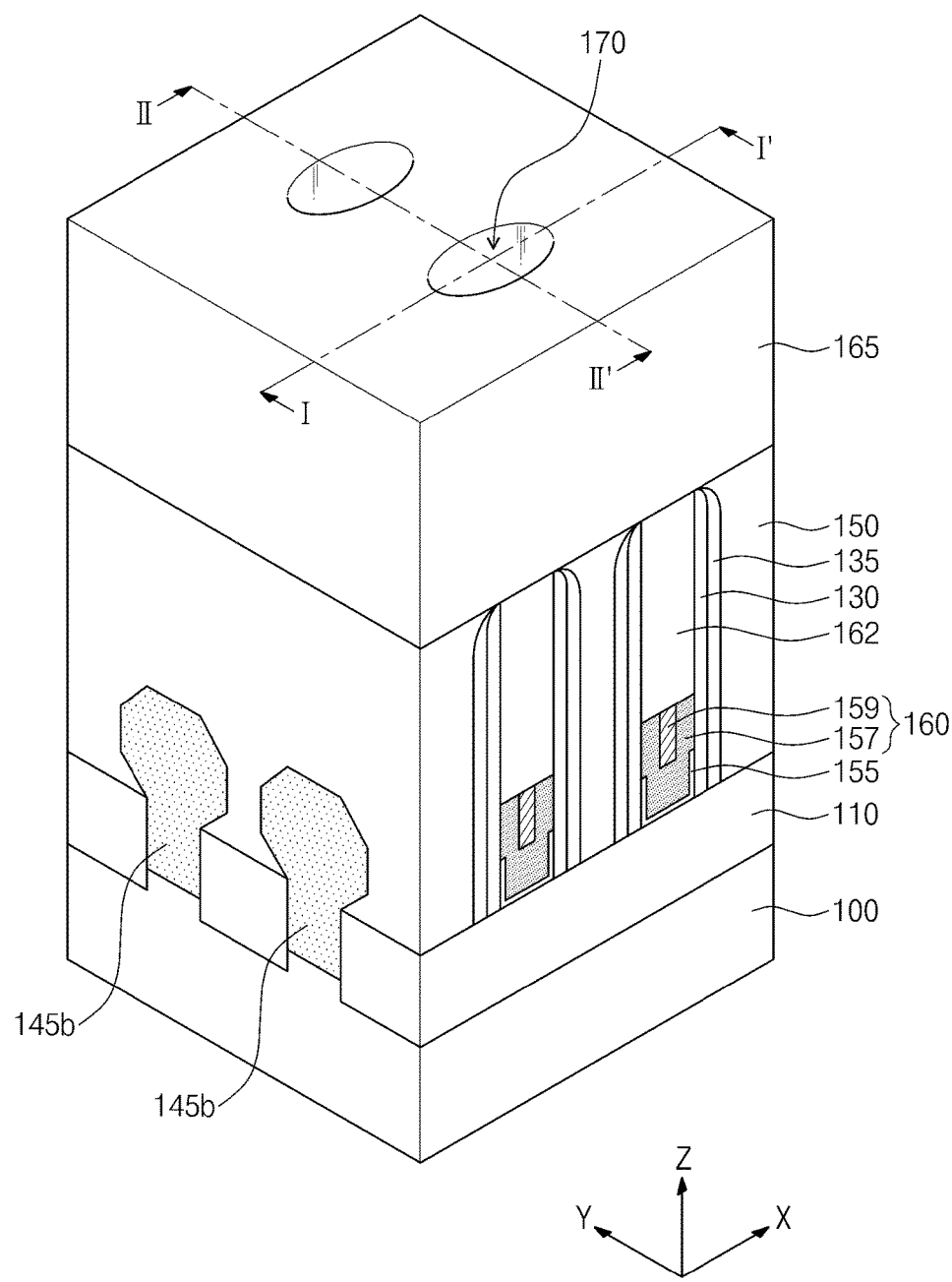
Figure 16B:
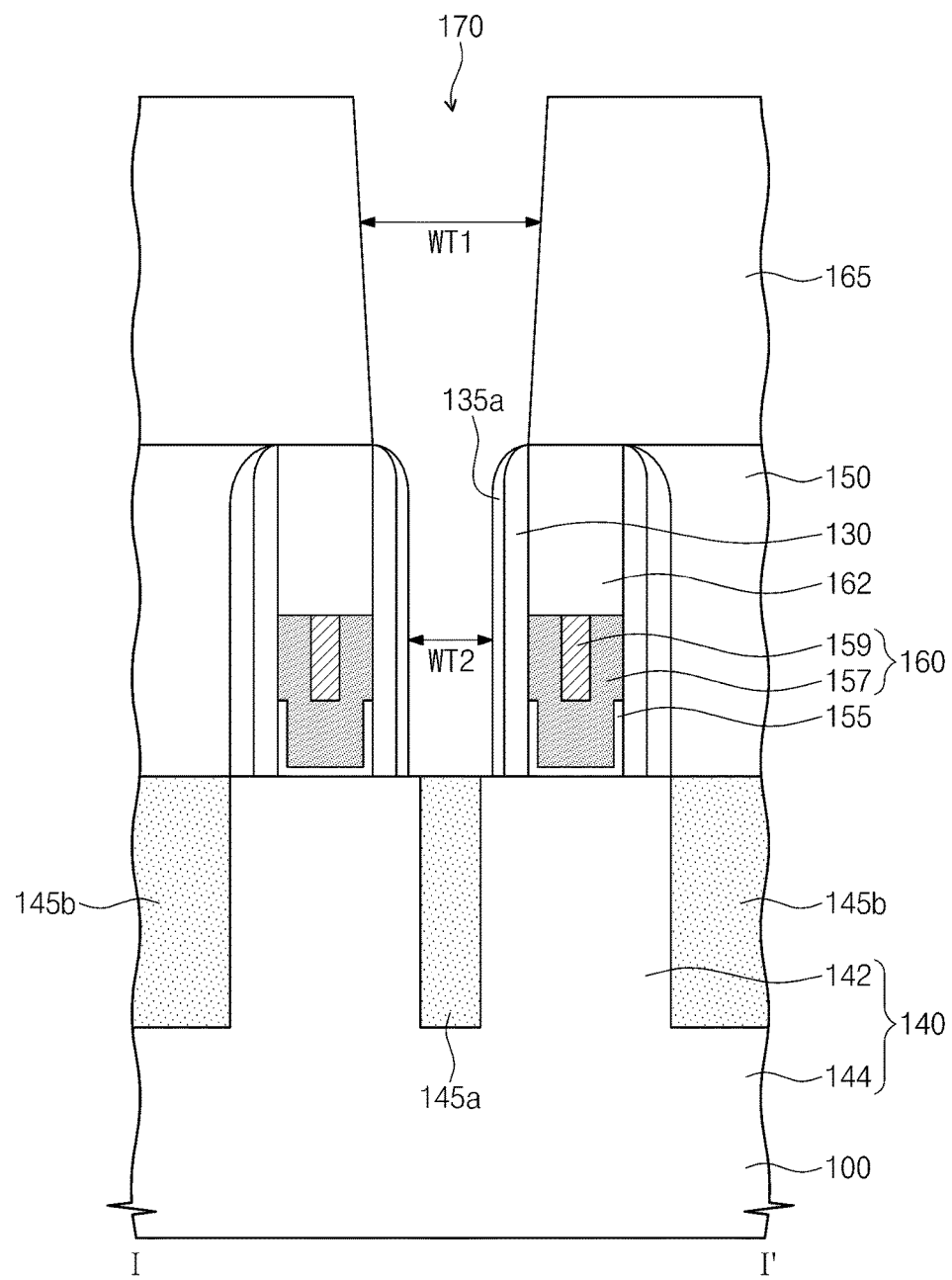
Figure 16C:
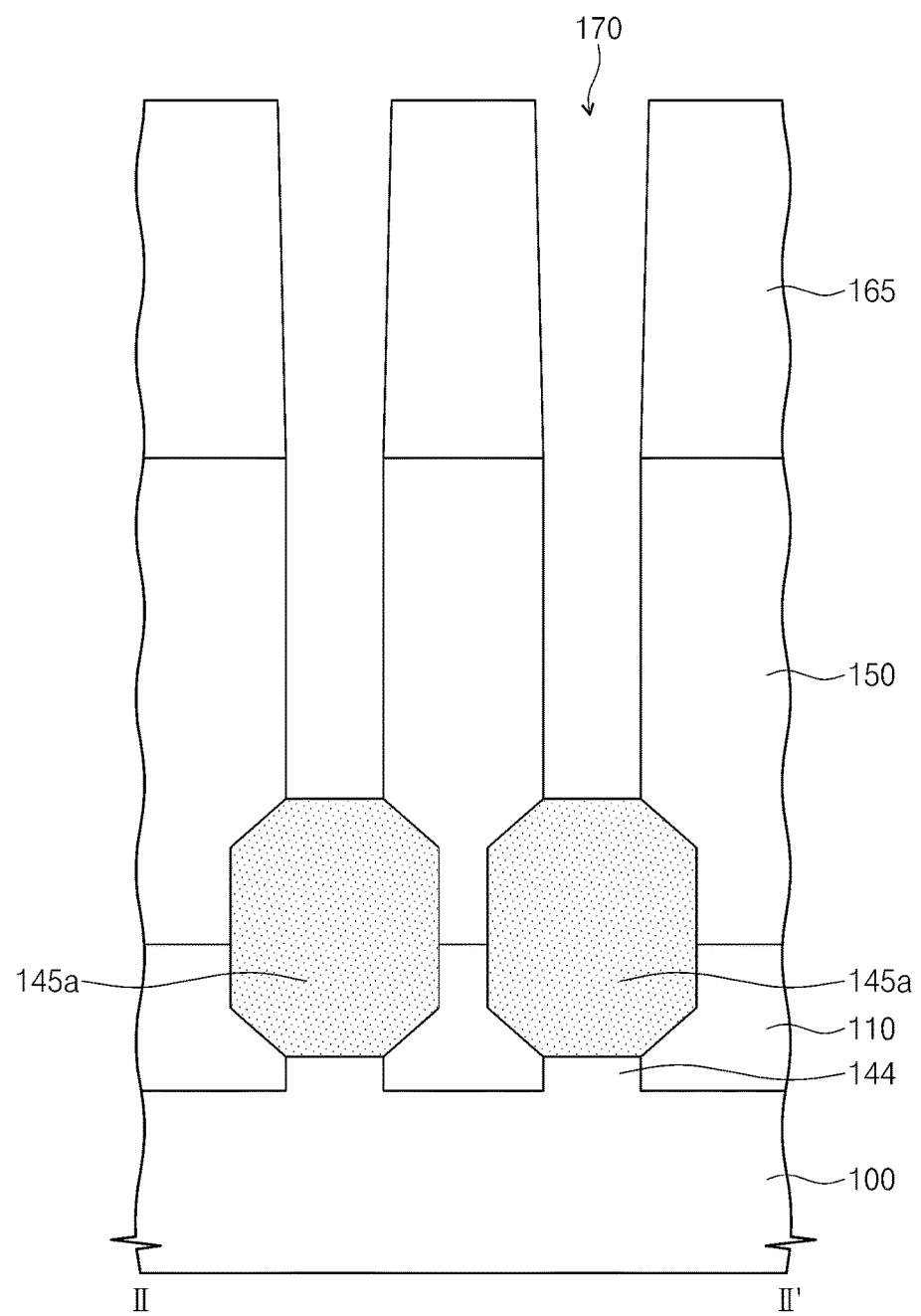

Referring to FIGS. 16A through 16C, the first and second interlayer insulating layers 150 and 165 may be etched, such as isotropically etched, to increase a width of the contact hole 170. The second spacer 135 may, for example, become a thinner second spacer 135a.

According to example embodiments of the disclosure, the isotropic etching process may be performed using a chemical oxide removal (COR) technology. As described above, the first and second interlayer insulating layers 150 and 165 may include oxide, and thus, they may be etched by the isotropic etching process. In example embodiments, since the lower portion of the contact hole 170 is defined by the first and second spacers 130 and 135 (one or both which may have an etch selectivity with respect to the interlayer insulating layers 150 and 165 to be etched at a lower rate than the interlayer insulating layers 150 and 165), it is possible to prevent the lower portion of the contact hole 170 from excessively expanding toward the gate electrode 160 adjacent thereto as a result of the etch to increase the width of the upper portion of the contact hole 170.

The isotropic etching process may be performed in such a way that the upper portion of the contact hole 170 penetrating the second interlayer insulating layer 165 can have a first width WT1 larger than a second width WT2 of a lower portion of the contact hole 170 in the first interlayer insulating layer 150. In example embodiments, the first width WT1 of the upper portion of the contact hole 170 may decrease from the top surface of the second interlayer insulating layer 165 to the top surface of the fin-shaped active pattern 140.

Figure 17A:
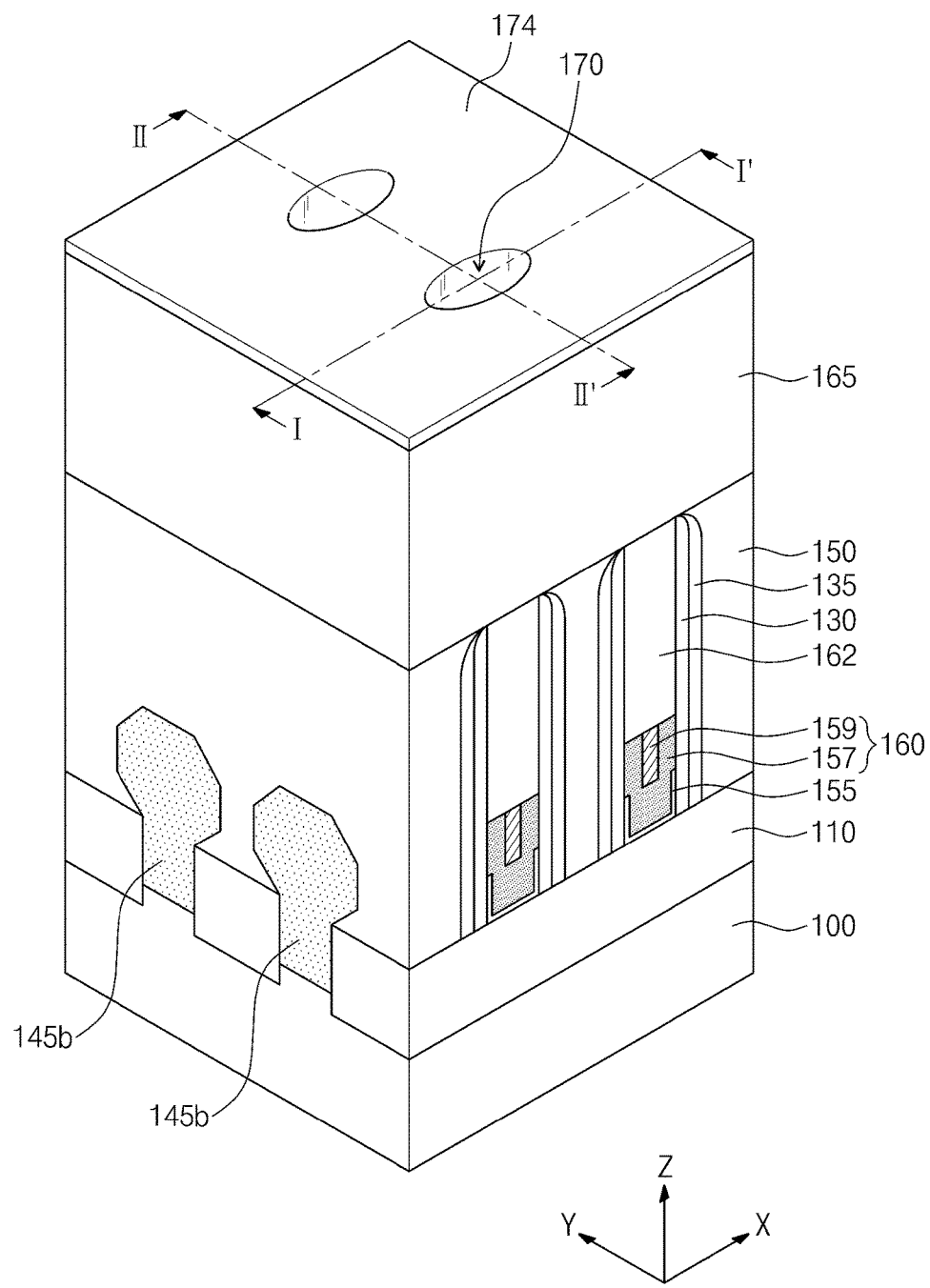
Figure 17B:
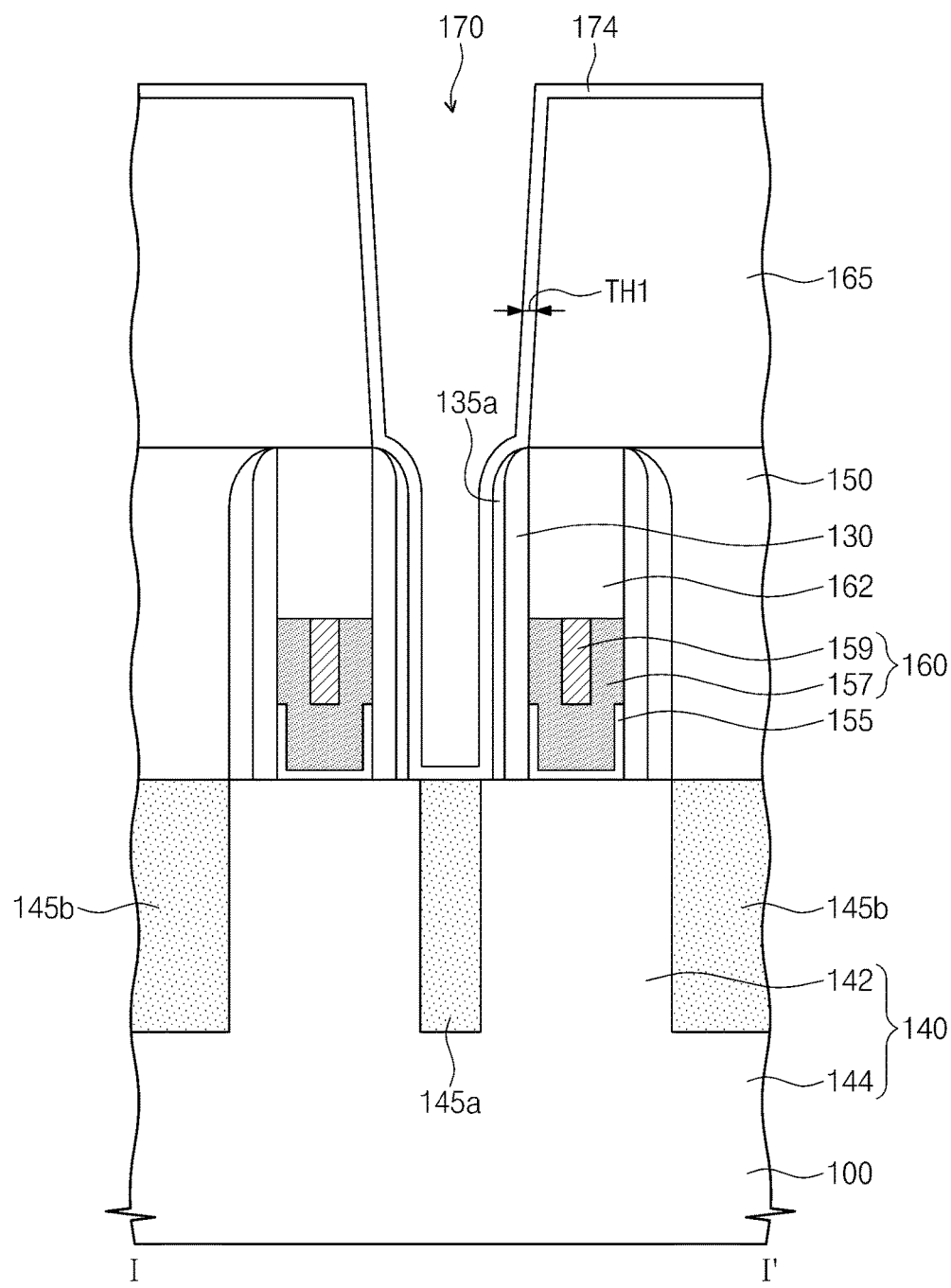
Figure 17C:
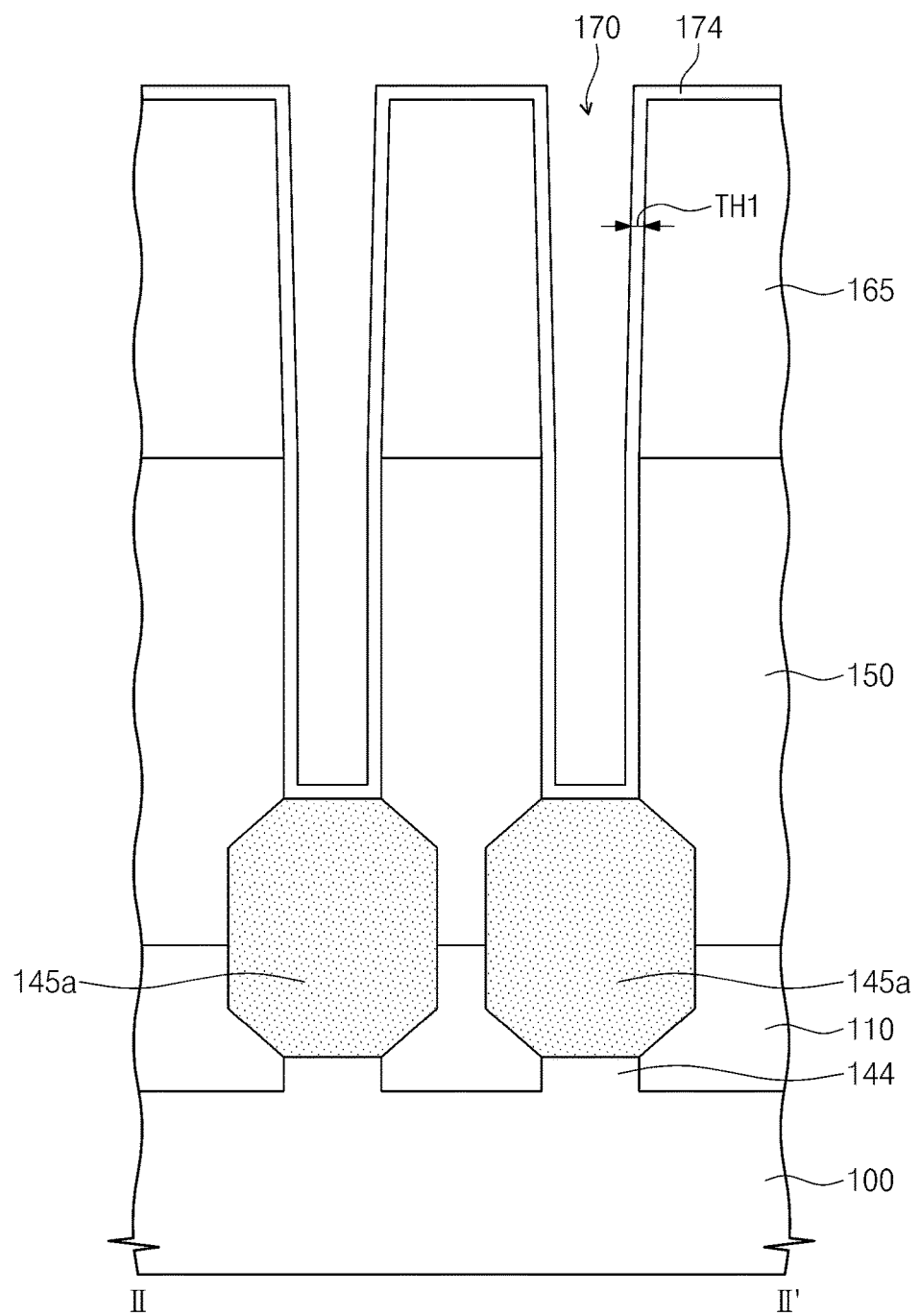

Referring to FIGS. 17A through 17C, a spacer layer 174 may be formed on an inner side surface and a bottom surface of the contact hole 170. The spacer layer 174 may be conformally formed to have a first thickness TH1. The spacer layer 174 may be formed of or include at least one of a silicon nitride layer, a silicon oxide layer, or a silicon oxynitride layer.

Figure 18A:
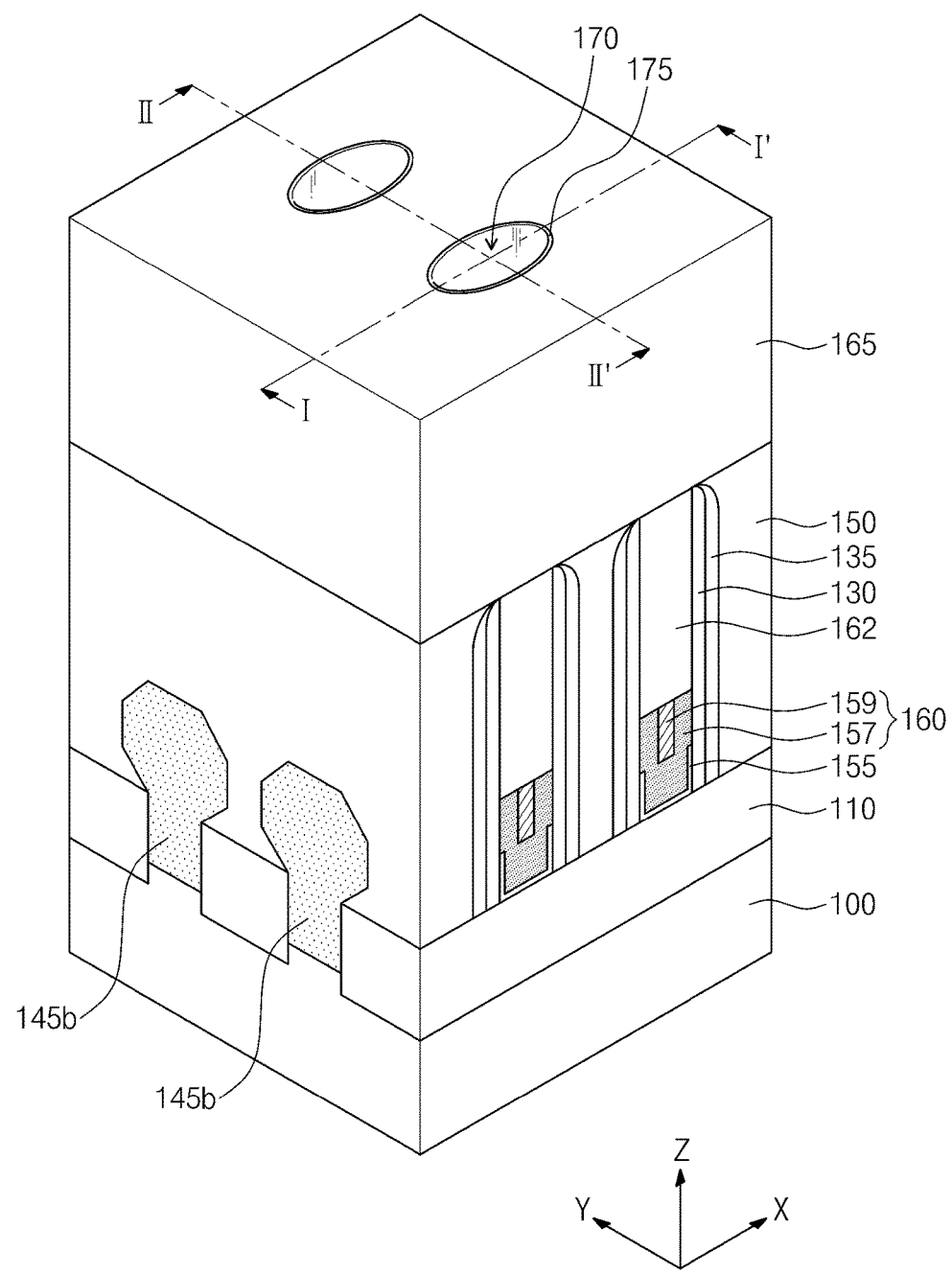
Figure 18B:
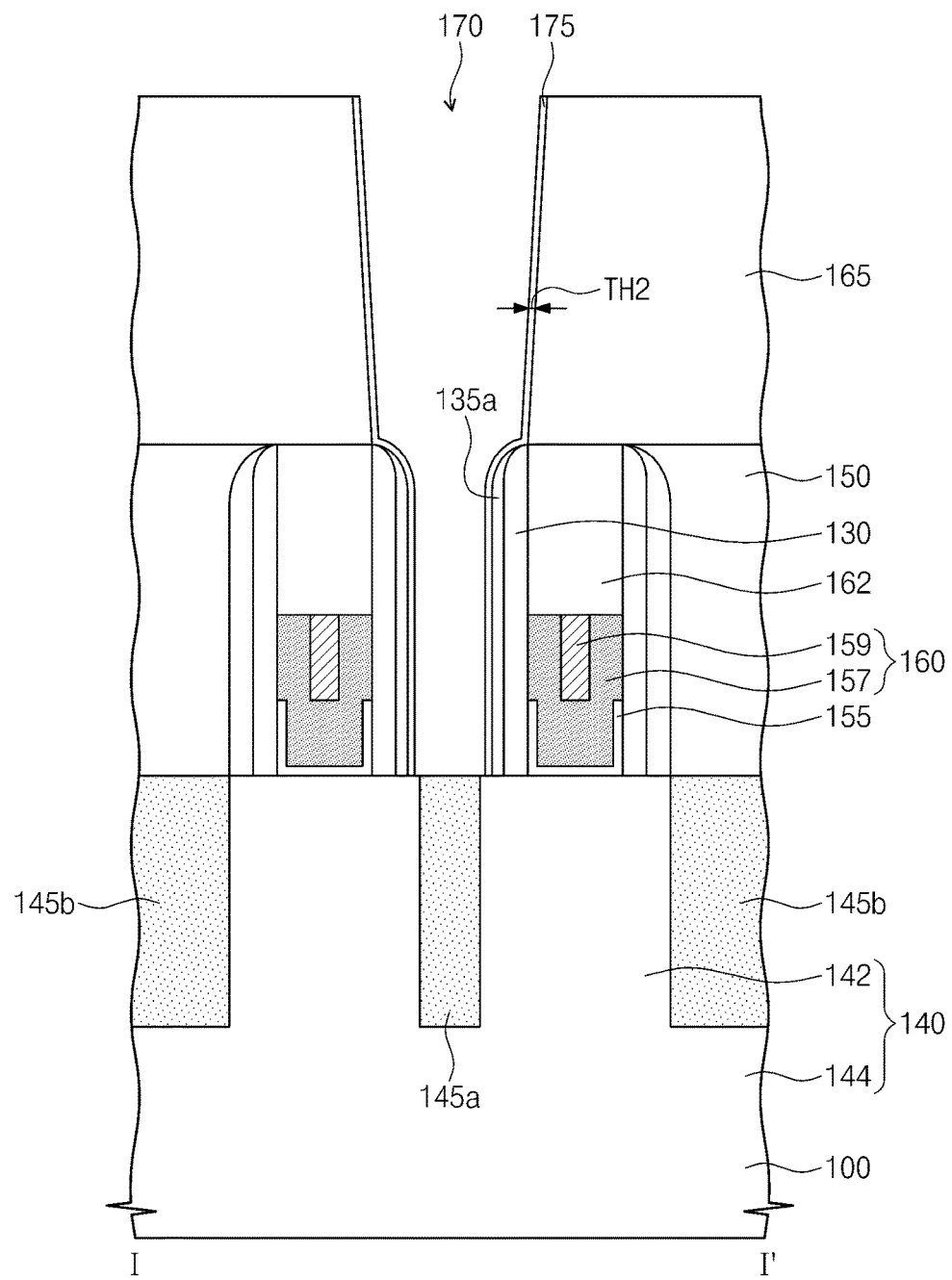
Figure 18C:
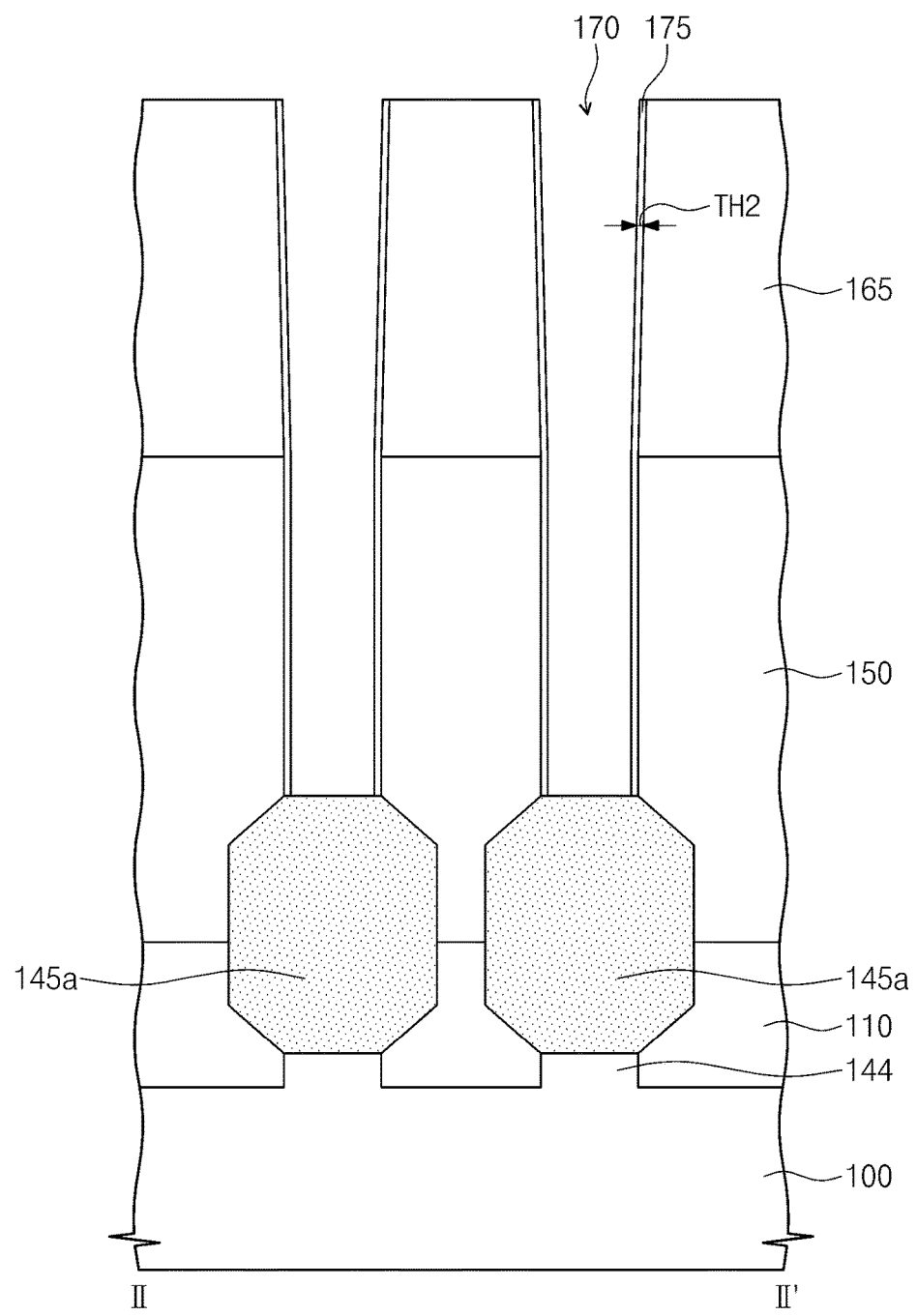

Referring to FIGS. 18A through 18C, the spacer layer 174 may be anisotropically and isotropically etched to form a third spacer 175 on the second spacer 135. The third spacer 175 may be formed to have a second thickness TH2 smaller than the first thickness TH1.

The formation of the third spacer 175 may include anisotropically etching the spacer layer 174 to expose the first impurity region 145a through a bottom of the contact hole 170 while allowing the spacer layer 174 to remain on an inner sidewall of the contact hole 170, and then, isotropically etching the spacer layer 174 remaining on the inner sidewall of the contact hole 170 to form the third spacer 175 that is thinner than the spacer layer 174. The isotropic etch may also remove spacer layer 174 from the top surface of interlayer insulating layer 165, however, in other embodiments, portions of spacer layer 174 may remain on the top surface of insulating layer 165.

According to some aspects of the disclosure, the anisotropic and isotropic etching processes on the spacer layer 174 may be sequentially performed in the same chamber. For example, the anisotropic and isotropic etching processes may be performed sequentially without moving a wafer including the structure illustrated in FIGS. 17A-17C and 18A-18C, and without creating a vacuum break in the etching chamber, or otherwise exposing the wafer to atmosphere outside the chamber.

Figure 19A:
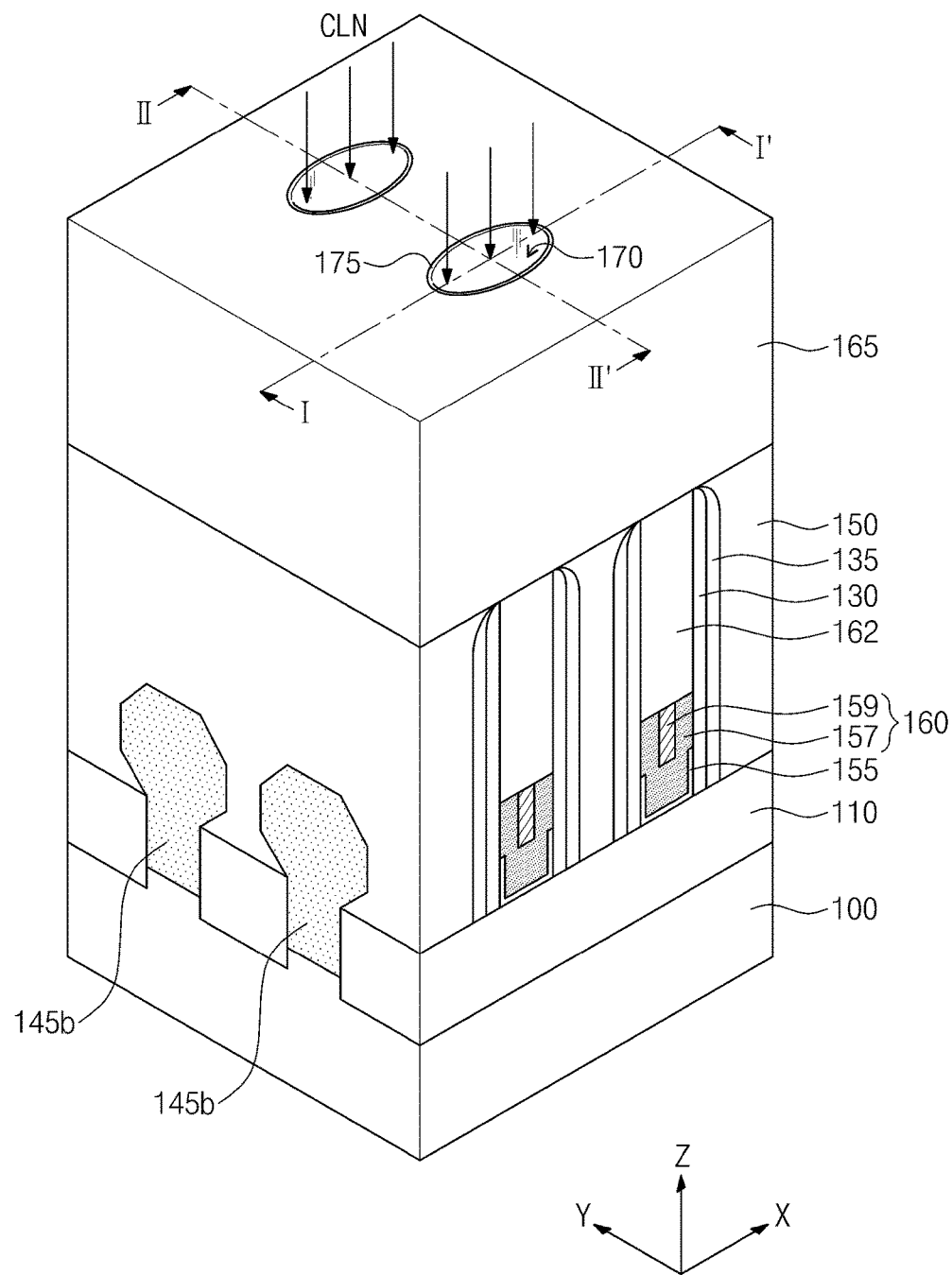
Figure 19B:
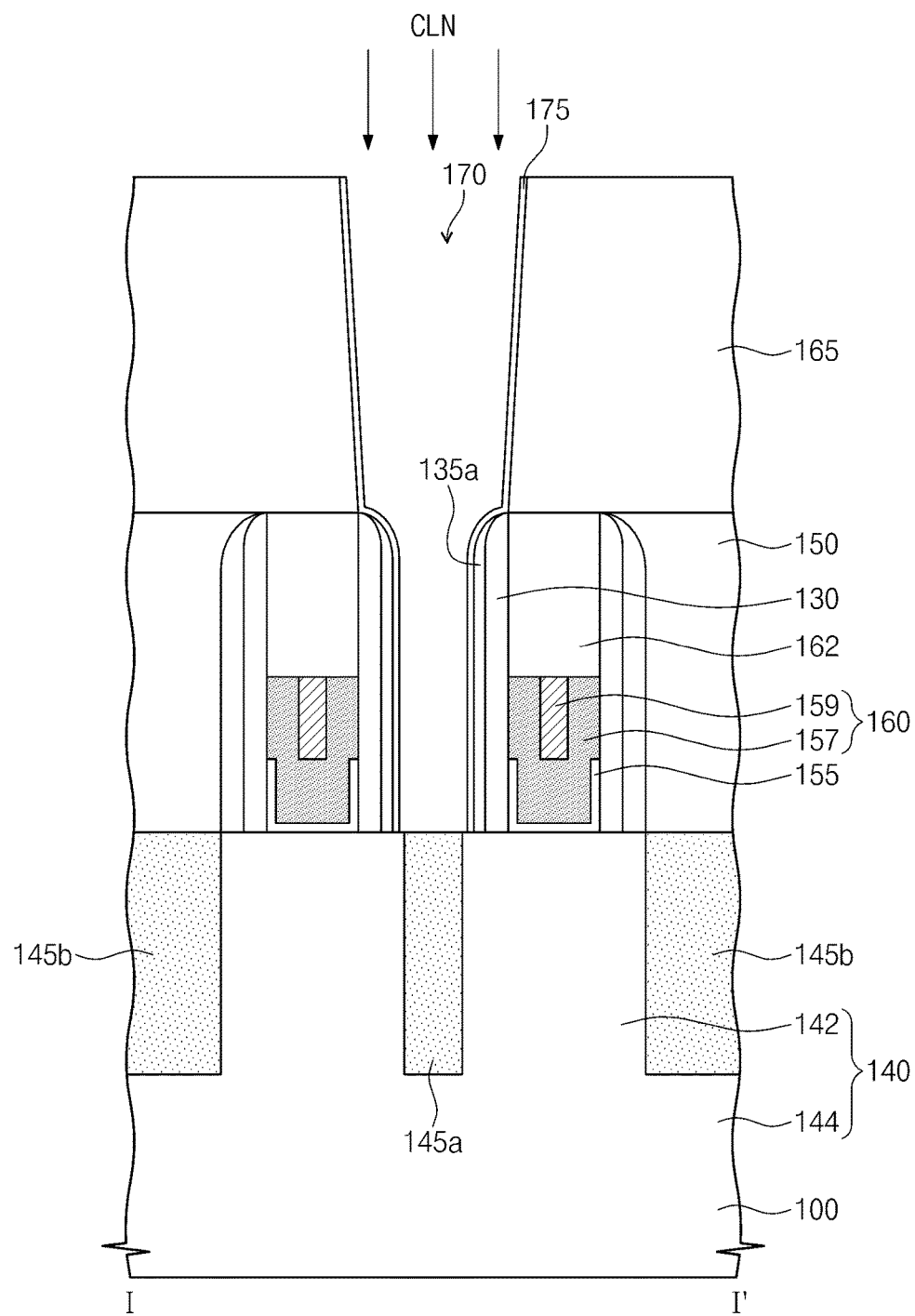
Figure 19C:
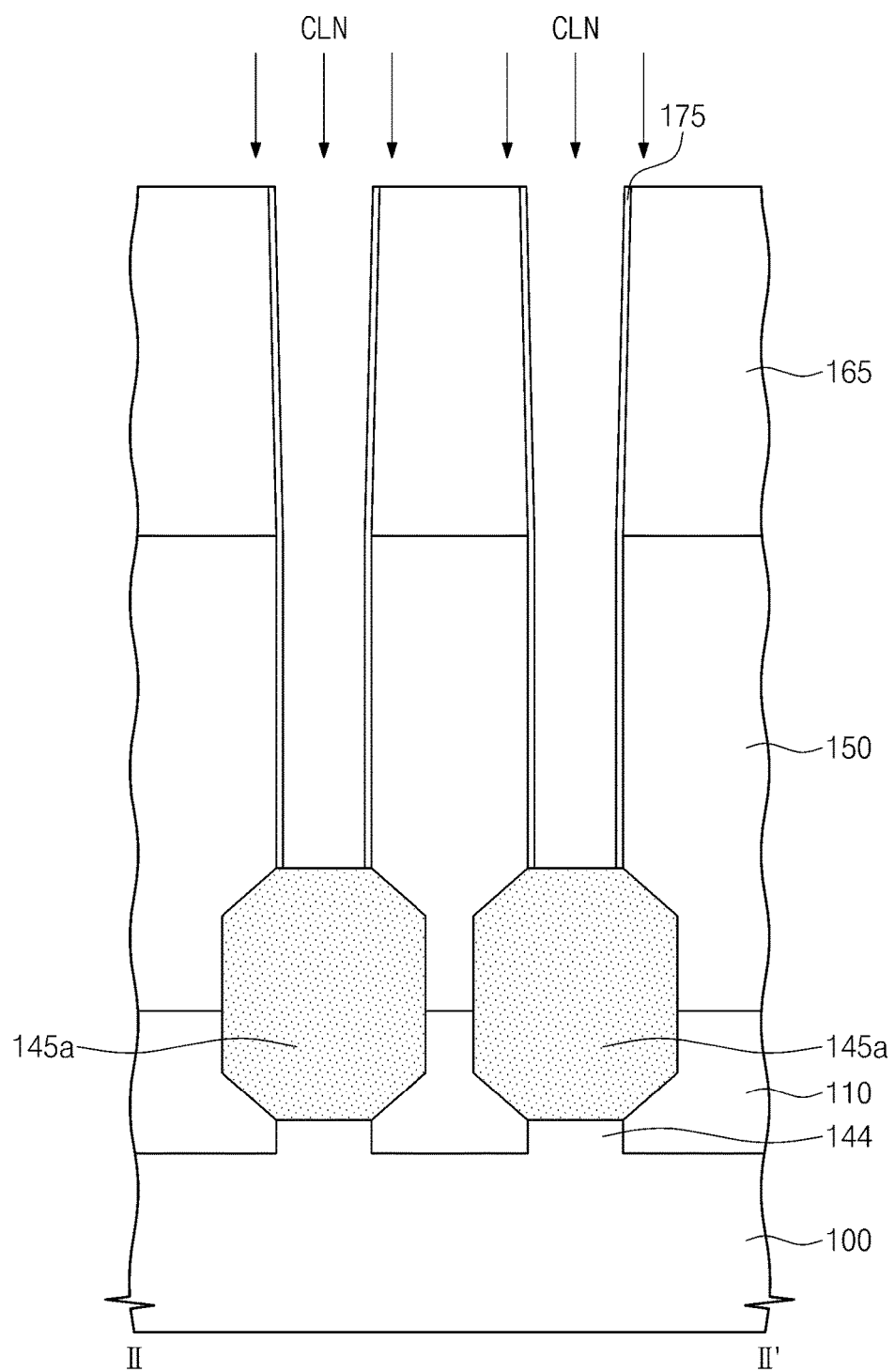

Referring to FIGS. 19A through 19C, a cleaning process CLN may be performed on the resulting structure with the third spacer 175 to remove a native oxide layer from the contact hole 170. In example embodiments, the cleaning process CLN may result in an increase in width of the contact hole 170. In example embodiments, the upper portion of the contact hole 170 may have a third width WT3, and the lower portion of the contact hole 170 may have a fourth width WT4 that is smaller than the third width WT3 (see FIG. 1B).

Figure 20A:
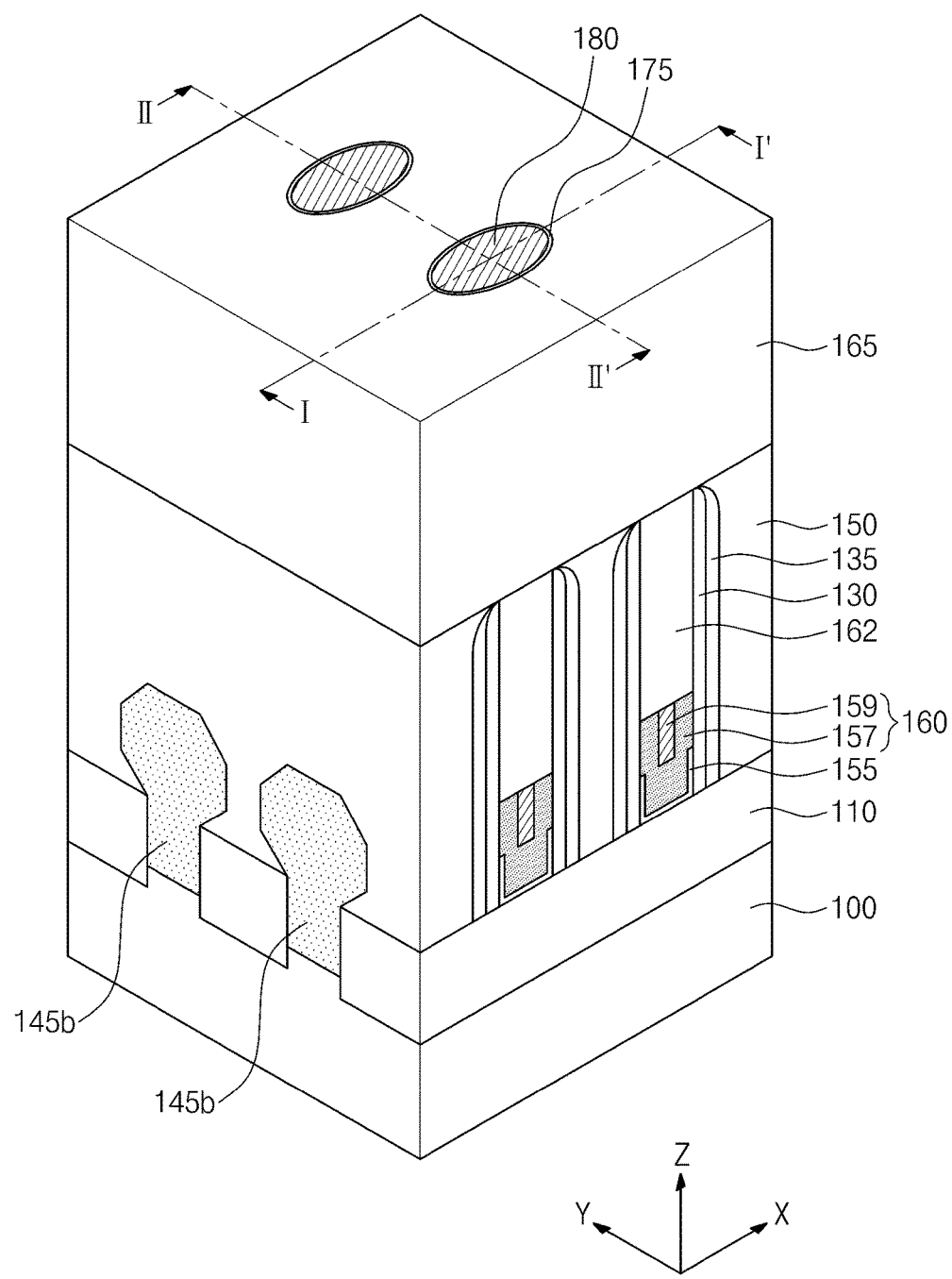
Figure 20B:
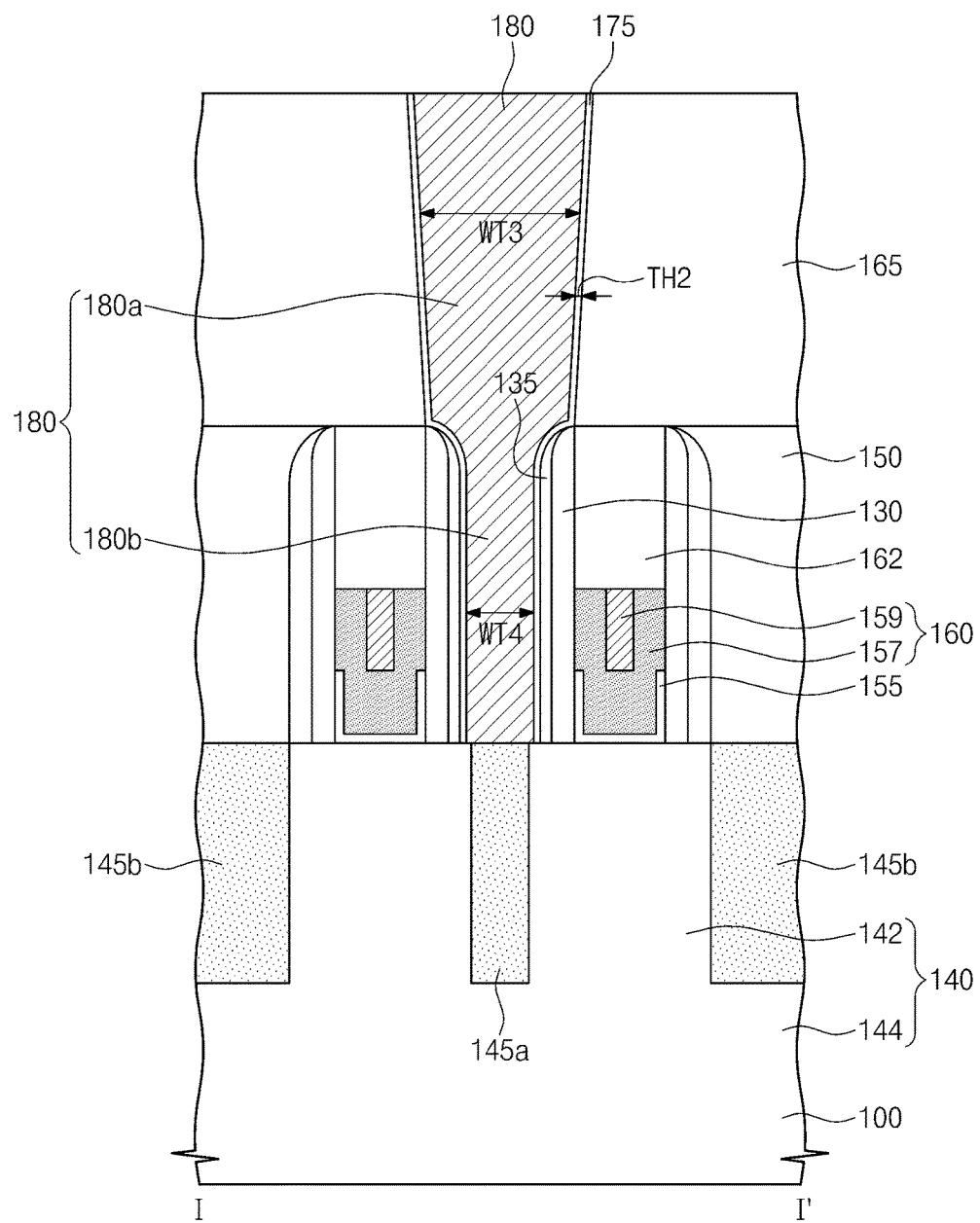
Figure 20C:
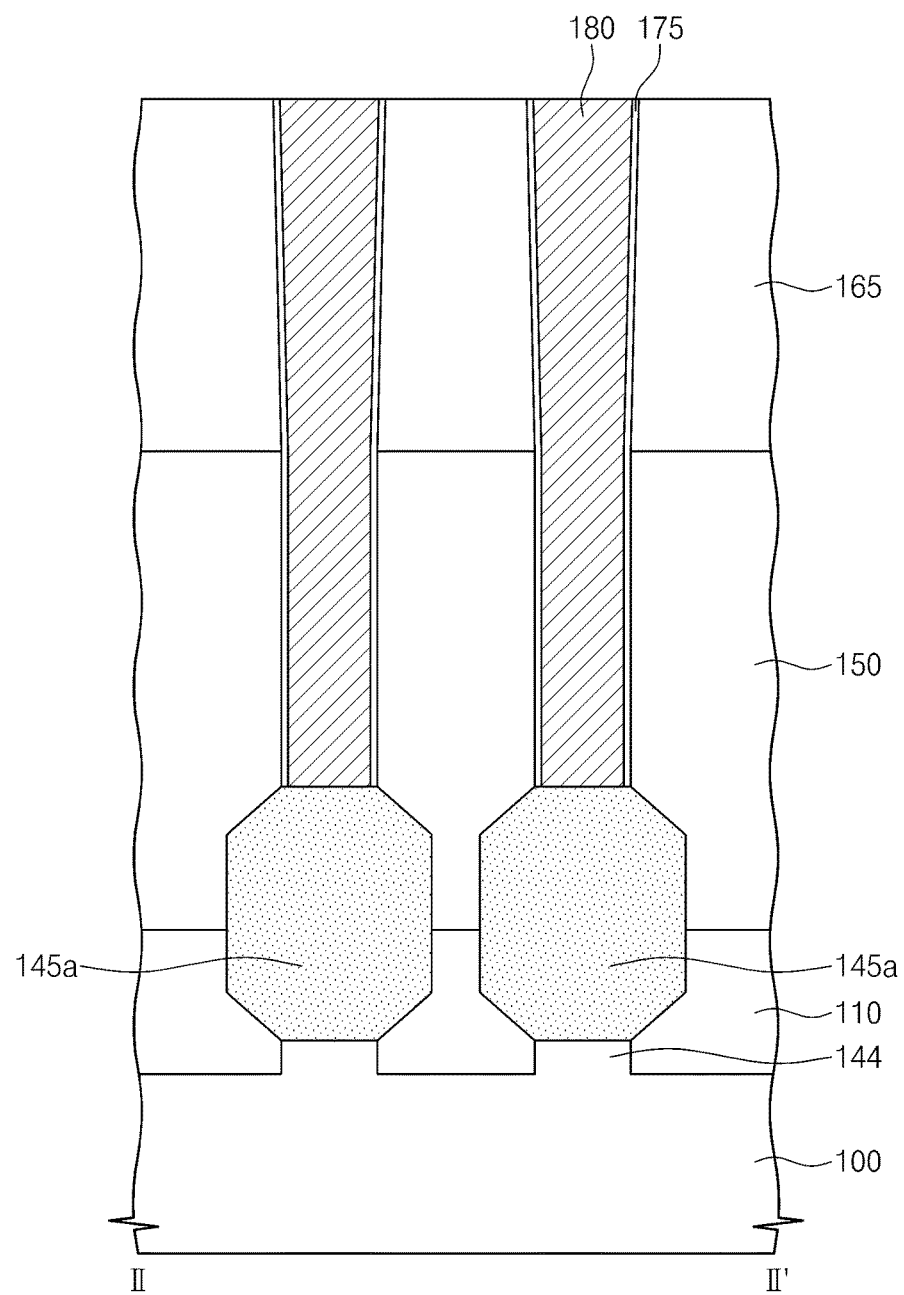

Referring to FIGS. 20A through 20C, a contact plug 180 may be formed by filling the contact hole 170 with a conductive material.

The contact plug 180 may be electrically connected to the first impurity region 145a through the first and second interlayer insulating layers 150 and 165. As described above, the side surface of the contact plug 180 may be enclosed by the third spacer 175.

In example embodiments, the contact plug 180 may include a lower portion 180b penetrating the first interlayer insulating layer 150 and an upper portion 180a penetrating the second interlayer insulating layer 165. As shown in FIG. 1B, the upper portion 180a of the contact plug 180 may have the third width WT3 decreasing from top to bottom. However, the minimum value of the third width WT3 of the upper portion 180a may be substantially equal to or larger than a mean value of the fourth width WT4 of the lower portion 180b.

Due to the presence of the first to third spacers 130, 135, and 175, the contact plug 180 is electrically separated from the gate electrode 160. Further, as described with reference to FIGS. 17A through 17C, the spacer layer may be formed in the contact hole 170, which is expanded by the isotropic etching process, and then, the anisotropic and isotropic etching processes may be performed to form the third spacer 175 that is thinner than the spacer layer. This makes it possible to increase a width of the contact plug 180 and thereby reduce an electric resistance of the contact plug 180.

Figure 21A:
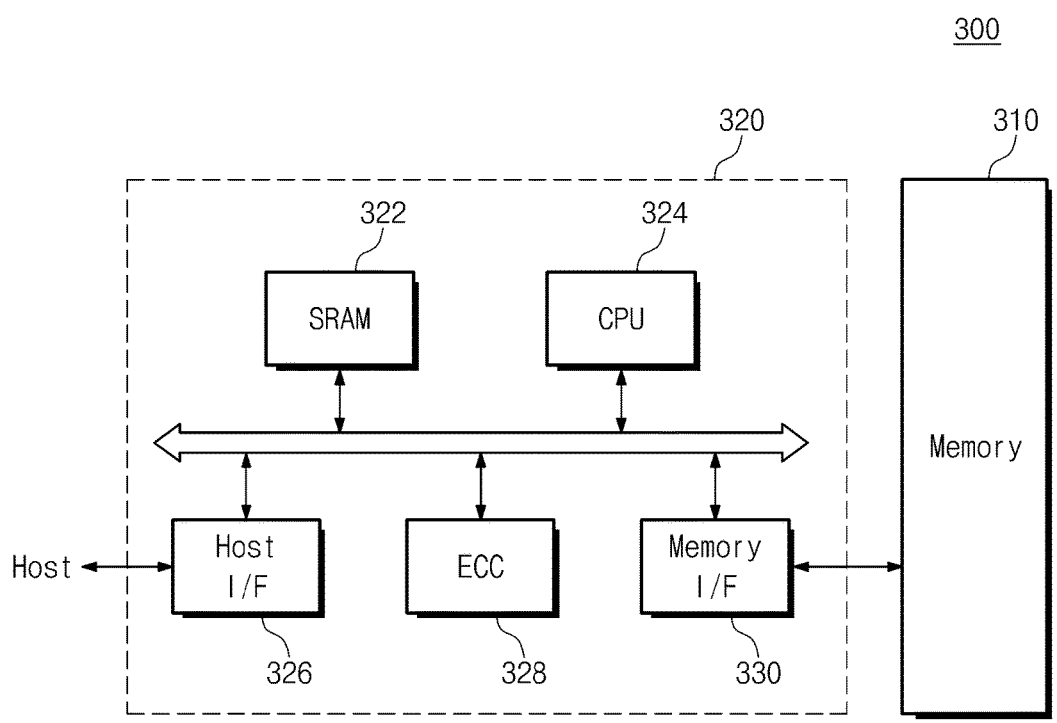
FIG. 21A is a block diagram illustrating a memory card according to example embodiments of the disclosure.

FIG. 21A is a block diagram illustrating a memory card according to example embodiments of the disclosure.

Referring to FIG. 21A, a semiconductor device according to exemplary embodiments of the disclosure described herein may be applied to form a memory card 300. The memory card 300 may include a memory controller 320 to control a data exchange between a host and a memory device 310. A static random access memory (SRAM) 322 may be used as operational memory for a central processing unit (CPU) 324. A host interface 326 may include at least one data exchange protocol of the host connected to the memory card 300. An error correction code (ECC) 328 may detect and correct at least one error that may be included in data read from the memory device 310. A memory interface 330 can interface with the memory device 310. The central processing unit 324 can control data exchange of the memory controller 320 with, for example, the memory device 310.

Figure 21B:
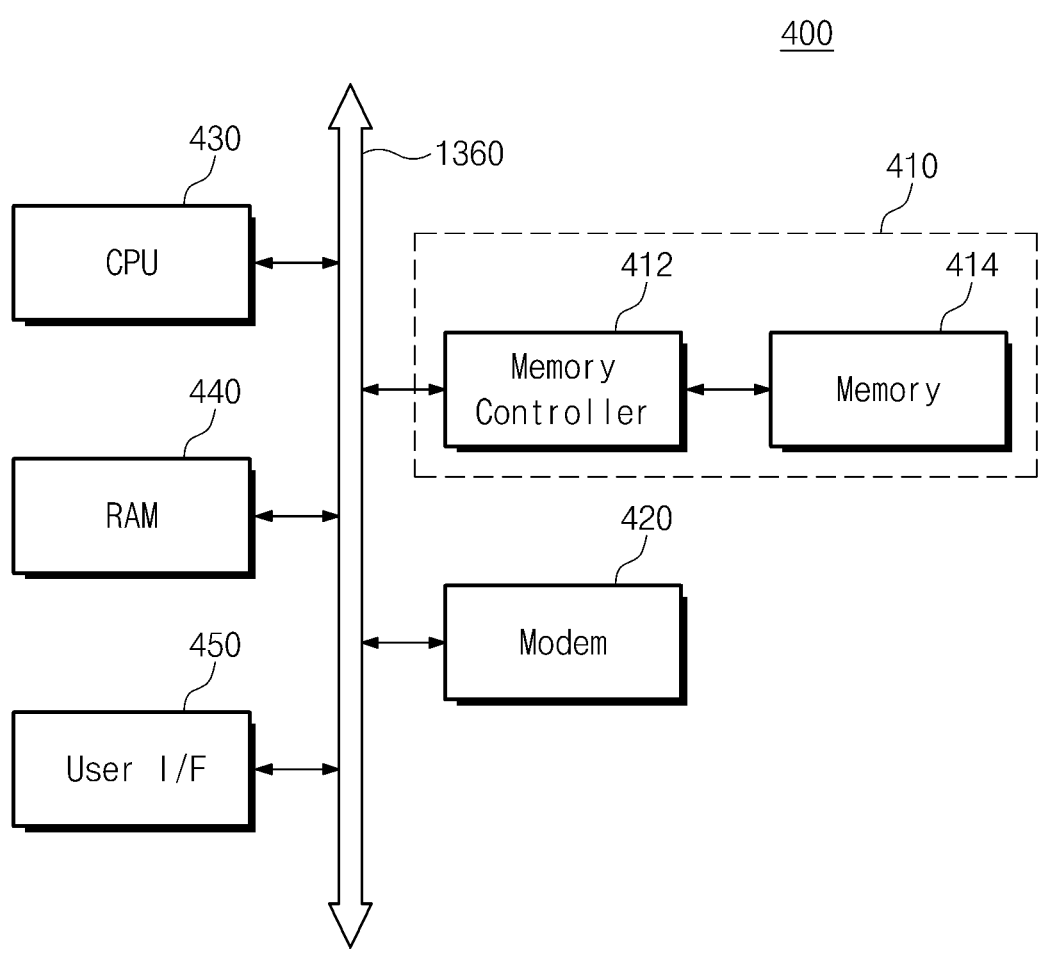
FIG. 21B is a block diagram illustrating an information processing system according to example embodiments of the disclosure.

FIG. 21B is a block diagram illustrating an information processing system according to example embodiments of the disclosure.

Referring to FIG. 21B, an information processing system 400 may include a semiconductor device according to exemplary embodiments of the disclosure described herein. The information processing system 400 may include a mobile device or a computer. As an illustration, the information processing system 400 may include memory system 410, a modem 420, a central processing unit (CPU) 430, a random access memory (RAM) 440, and a user interface 450 that are electrically connected to a system bus 1360. The memory system 410 may store data processed by the central processing unit (CPU) 430 and data inputted from the outside (e.g., via the user interface 450 and/or the modem 420). The memory system 410 may include a memory 414 and a memory controller 412. The memory system 410 may be the same as the memory card 300 described with reference to FIG. 21A. The information processing system 400 may be provided as a memory card, a solid state disk, a camera image sensor, an application chip set, and the like. For example, the memory system 410 may be a solid state disk (SSD). The information processing system 400 may stably and reliably store data in the memory system 410.

While example embodiments of the disclosure have been particularly shown and described, it will be understood by one of ordinary skill in the art that variations in form, application, and detail may be made therein without departing from the spirit and scope of the attached claims.

What is claimed is:

1. A method of fabricating a semiconductor device, comprising:
   forming a fin-shaped active pattern on a substrate that extends parallel to a first direction;
   forming a gate structure that crosses the fin-shaped active pattern and extends in a second direction perpendicular to the first direction;
   sequentially forming first spacers and second spacers on side surfaces of the gate structure;
   forming impurity regions in the fin-shaped active pattern at both sides of the gate structure;
   forming a first interlayer insulating layer to fill a space above the impurity regions;
   forming a second interlayer insulating layer on the first interlayer insulating layer;
   etching the first and second interlayer insulating layers to form a contact hole exposing one of the impurity regions;
   isotropically etching the first and second interlayer insulating layers exposed by the contact hole;
   forming a third spacer to cover an inner side surface of the contact hole; and
   filling the contact hole having the third spacer with a conductive material to form a contact plug,
   wherein each of the first spacers, the second spacers and the third spacer is an insulator, wherein the forming of the third spacer comprises:
  forming a spacer layer to conformally cover exposed surfaces of the contact hole;
  anisotropically etching the spacer layer to remove a portion of the spacer layer from a bottom of the contact hole; and
  isotropically etching a portion of the spacer layer remaining on the inner side surface of the contact hole.

2. The method of claim 1, wherein at least one of the first and second spacers comprise a material having an etch selectivity with respect to the first and second interlayer insulating layers.

3. The method of claim 2, wherein at least one of the first and second interlayer insulating layers comprises a first silicon oxide layer, and the isotropic etching of the first and second interlayer insulating layers is performed to selectively enlarge an upper portion of the contact hole in the second interlayer insulating layer.

4. The method of claim 3, wherein at least one of the first and second spacers has an etch selectivity with respect to the second interlayer insulating layer.

5. The method of claim 4, wherein the third spacer comprises at least one of a second silicon oxide layer, a nitride layer, or an oxynitride layer, which has an etch selectivity with respect to the first silicon oxide layer.

6. The method of claim 1, further comprising forming the gate structure by replacing a dummy gate structure with a gate insulating pattern, a gate electrode, and a capping pattern, which are sequentially stacked on the fin-shaped active patterns, after the forming of the first interlayer insulating layer.

7. The method of claim 6, wherein a top surface of the first interlayer insulating layer is substantially coplanar with a top surface of the capping pattern.

8. The method of claim 6, wherein the isotropic etching of the first and second interlayer insulating layers is performed using chemical oxide removal (COR).

9. The method of claim 6, wherein the impurity regions are doped by implanting the impurities into the fin-shaped active pattern using the dummy gate structure as a mask.

10. The method of claim 6, wherein the gate electrode comprises a first gate pattern and a second gate pattern, wherein the first gate pattern has a 'U'-shape, and wherein the second gate pattern has a shape that fills a gap formed by the first gate pattern.

11. The method of claim 1, wherein the forming of the impurity regions comprises growing epitaxial patterns from the fin-shaped active pattern using a selective epitaxial growth process.

12. The method of claim 1, wherein the anisotropic etching and the isotropic etching of the spacer layer are sequentially performed within a same process chamber.

13. The method of claim 1, further comprising cleaning the inner side surface of the contact hole, before the forming of the contact plug, wherein the cleaning reduces a thickness of the third spacer.

14. The method of claim 1, wherein the third spacer is in contact with an upper portion of one of the first spacers and an upper portion of one of the second spacers.

15. The method of claim 1, wherein the forming of the fin-shaped active patterns comprises:
  forming initial fin-shaped active patterns that protrudes upwards from a top surface of the substrate;
  forming a device isolation layer on the substrate to cover lower portions of the initial fin-shaped active patterns,
  etching the initial fin-shaped active patterns at locations adjacent to the second spacers.

16. A method of fabricating a semiconductor device, comprising:
  forming a fin-shaped active pattern on a substrate;
  forming a gate structure that crosses the fin-shaped active pattern, the gate structure comprising a gate electrode and a capping pattern on the gate electrode;
  sequentially forming first spacers and second spacers on a side surface of the gate structure;
  forming impurity regions in the fin-shaped active pattern at both sides of the gate structure;
  forming a first interlayer insulating layer to fill a space above the impurity regions;
  forming a second interlayer insulating layer on the capping pattern and on the first interlayer insulating layer;
  etching the first and second interlayer insulating layers to form a contact hole exposing one of the impurity regions;
  conformally forming a spacer layer on exposed surfaces of the contact hole, the spacer layer being formed on an exposed side surface of at least one of the second spacers and at least one of the impurity regions;
  anisotropically etching the spacer layer to remove a portion of the spacer layer from a bottom of the contact hole to expose the at least one of the impurity regions;
  isotropically etching a portion of the spacer layer remaining on an inner side surface of the contact hole; and
  forming a contact plug in the contact hole having a third spacer with a conductive material.

17. A method of fabricating a semiconductor device, comprising:
  forming a fin-shaped active pattern on a substrate that extends parallel to a first direction;
  forming a gate structure that crosses the fin-shaped active pattern and extends in a second direction;
  sequentially forming first spacers and second spacers on side surfaces of the gate structure;
  forming impurity regions in the fin-shaped active pattern at both sides of the gate structure;
  forming a first interlayer insulating layer to cover the impurity regions;
  forming a second interlayer insulating layer on the first interlayer insulating layer;
  forming a contact hole exposing a portion of the fin-shaped active pattern;
  isotropically etching the first and second interlayer insulating layers to enlarge the contact hole;
  forming a third spacer to cover an inner side surface of the contact hole; and
  filling the contact hole with a conductive material to form a contact plug,
  wherein each of the first spacers, the second spacers and the third spacer is an insulator,
  wherein a first portion of one of the second spacers comprises a first side contacting a corresponding one of the first spacers and a second side contacting the third spacer.

18. The method of claim 17, wherein the first portion of the one of the second spacers is thinner than a second portion of the one of the second spacers.

* * * * *